United States Patent
Kikuchi et al.

(10) Patent No.: US 6,911,733 B2
(45) Date of Patent: Jun. 28, 2005

(54) SEMICONDUCTOR DEVICE AND ELECTRONIC DEVICE

(75) Inventors: Hiroshi Kikuchi, Hidaka (JP); Norio Nakazato, Kashiwa (JP); Hideko Ando, Ome (JP); Takashi Suga, Yokohama (JP); Satoru Isomura, Hamura (JP); Takashi Kubo, Chiyoda (JP); Hiroyasu Sasaki, Yokohama (JP); Masanori Fukuhara, Tachikawa (JP); Naotaka Tanaka, Chiyoda (JP); Fujiaki Nose, Ome (JP)

(73) Assignee: Hitachi, Ltd., Tokyo (JP)

( * ) Notice: Subject to any disclaimer, the term of this patent is extended or adjusted under 35 U.S.C. 154(b) by 13 days.

(21) Appl. No.: 10/372,898

(22) Filed: Feb. 26, 2003

(65) Prior Publication Data

US 2003/0231088 A1 Dec. 18, 2003

(30) Foreign Application Priority Data

Feb. 28, 2002 (JP) ........................................ 2002-053222
Oct. 31, 2002 (JP) ........................................ 2002-318936

(51) Int. Cl.[7] ............................................. H01L 23/34
(52) U.S. Cl. ..................... 257/728; 333/246; 333/248
(58) Field of Search ................................. 333/247, 246, 333/248; 257/728

(56) References Cited

U.S. PATENT DOCUMENTS 3,943,469 A * 3/1976 Kawamoto et al. ......... 333/247
6,057,600 A * 5/2000 Kitazawa et al. ........... 257/728
6,483,406 B1 * 11/2002 Sawa et al. ................. 333/247

FOREIGN PATENT DOCUMENTS

JP          5-167258       12/1991

* cited by examiner

Primary Examiner—Douglas A. Wille
(74) Attorney, Agent, or Firm—Reed Smith LLP; Stanley P. Fisher, Esq.; Juan Carlos A. Marquez, Esq.

(57) ABSTRACT

A high-frequency signal from a tape-shaped line section having a surface layer signal lead and surface layer GND lead disposed on both sides thereof is directly inputted to a semiconductor chip via a signal surface layer wiring of a package substrate and through solder bump electrodes. Alternatively, a high-frequency signal from the semiconductor chip is outputted to the outside via the tape-shaped line section in reverse. Owing to the transmission of the high-frequency signal by only a microstrip line at the whole surface layer of the package substrate, the high-frequency signal can be transmitted by only the microstrip line at the surface layer without through vias or the like. Accordingly, the high-frequency signal can be transmitted without a loss in frequency characteristic, and a high-quality high-frequency signal can be transmitted with a reduction in loss at high-frequency transmission.

16 Claims, 62 Drawing Sheets

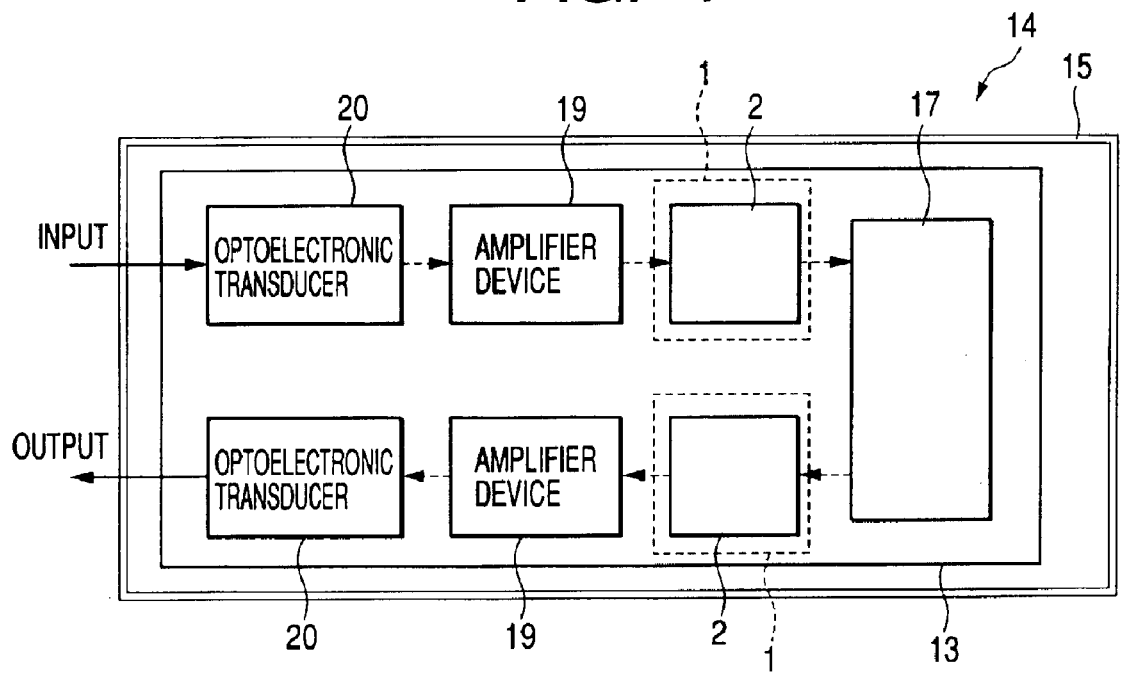
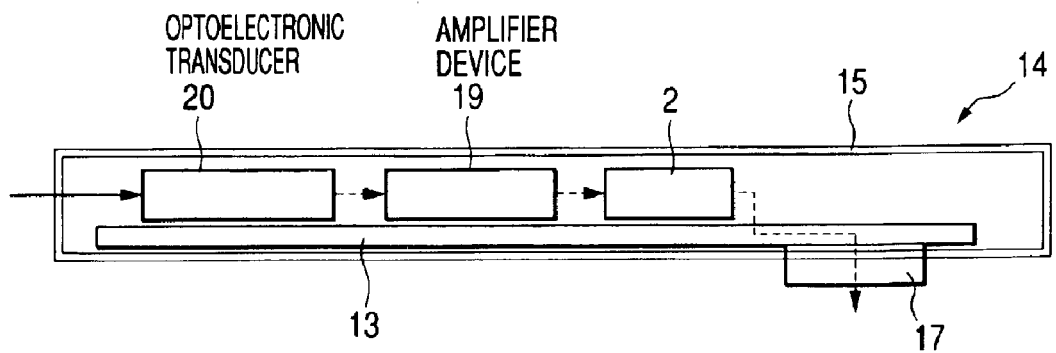

FIG. 17
FIG. 18
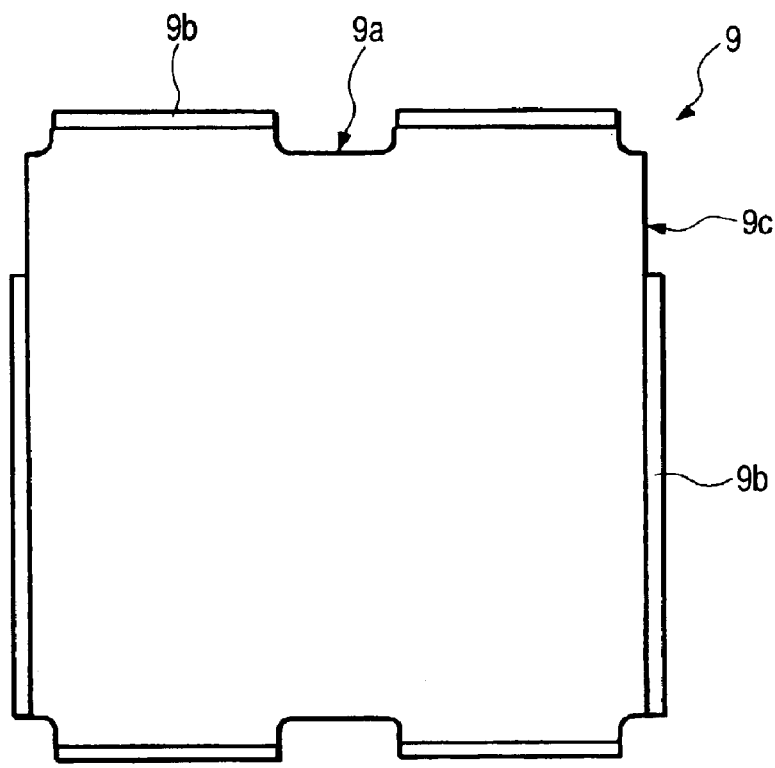
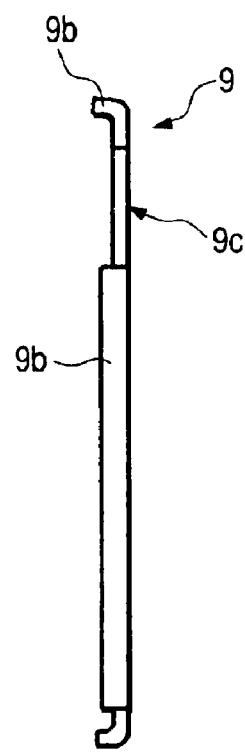

SEMICONDUCTOR DEVICE AND ELECTRONIC DEVICE

BACKGROUND OF THE INVENTION

The present invention relates to a semiconductor device and an electronic device, and particularly to a technology effective for application to transmission of a high-frequency signal.

There has heretofore been known a structure having adopted a coaxial cable as high-speed signal transmission means. A semiconductor package (semiconductor device) of a PGA (Pin Grid Array) type makes use of a coaxial cable as a signal transmission path extending in its thickness direction between a part packaging surface of a multilayered wiring board and its back surface (see the following patent document 1, for example).

There has been also known one wherein a coaxial cable is used in an optical communication apparatus (see the following non-patent document 1, for example).

Patent document 1:

Unexamined Patent Publication No. Hei 5(1993)-167258 (FIG. 1)

Non-patent document 1:

"Various Characteristics of 565 Mb/s Optical Transmitter Using DFB-LD" by Shoichi Hanaya, Katsuyoshi Karasawa, Kichi Yamashita, and Minoru Maeda, National Meeting of Communication, Optical and Radio Departments, Published in Sep. 3, 1986 (Showa 61) (pp 2–170, FIG. 2)

SUMMARY OF THE INVENTION

The input/output of a signal to a semiconductor package has heretofore been performed via "wirings". However, a problem arises in that with the operation of a semiconductor chip mounted on the semiconductor package in a high-frequency region, the efficiency of propagation of the signal is degraded if no suitable wiring structure design is carried out, thus causing degradation in high-frequency characteristics.

In the PGA type semiconductor package having adopted the coaxial cable, a core line of the coaxial cable and its corresponding surface wiring of the multilayered wiring board are bonded to each other in a state of being struck at right angles. The difference in sectional area as viewed in a direction normal to a core-line extending direction between the core line and the surface wiring is large. Therefore, the signal is reflected by a spot where the area of a bonding portion of the core line and the surface wiring changes.

As a result, a problem arises in that the high-frequency characteristics are degraded.

The present inventors have discussed, as a structure for realizing a high-frequency semiconductor device connected to a coaxial cable, a structure wherein inner leads are connected to a package substrate with a high-frequency semiconductor chip mounted thereon, as external connecting terminals thereof, and outer leads respectively coupled to the inner leads protrude from the package substrate to the outside thereof along a plane direction thereof.

However, the structure wherein the outer leads protrude outwardly of the package substrate along the plane direction thereof, is accompanied by a problem that its size reduction cannot be achieved.

An object of the present invention is to provide a semiconductor device and an electronic device which improve the quality of high-frequency characteristics.

Another object of the present invention is to provide a semiconductor device and an electronic device both of which can be downsized.

A further object of the present invention is to provide a semiconductor device and an electronic device both of which can be thinned.

A still further object of the present invention is to provide a semiconductor device and an electronic device both of which can be reduced in cost.

The above, other objects and novel features of the present invention will become apparent from the description of the present specification and the accompanying drawings.

A summary of a typical one of the inventions disclosed in the present application will be described in brief as follows:

The present invention provides a semiconductor device comprising a wiring board formed with a surface layer wiring, a semiconductor chip electrically connected to and mounted on the wiring board, a plurality of external connecting terminals provided within either a main surface of the wiring board or a back surface thereof opposite to the main surface, and a transmission line section electrically connected to the surface layer wiring of the wiring board, wherein at least either input or output of a signal to the semiconductor chip is performed through the transmission line section.

BRIEF DESCRIPTION OF THE DRAWINGS

FIG. 4 is a plan view showing one example of a layout of parts built in the optical module shown in FIG. 2;

FIG. 5 is a cross-sectional view illustrating one example of the layout of the parts built in the optical module shown in FIG. 2;

FIG. 17 is a bottom view illustrating a structure of the cap as seen in the direction indicated by an arrow C of FIG. 14;

FIG. 18 is a side view showing the structure of the cap shown in FIG. 17;

DETAILED DESCRIPTION OF THE PREFERRED EMBODIMENTS

Figure 1:
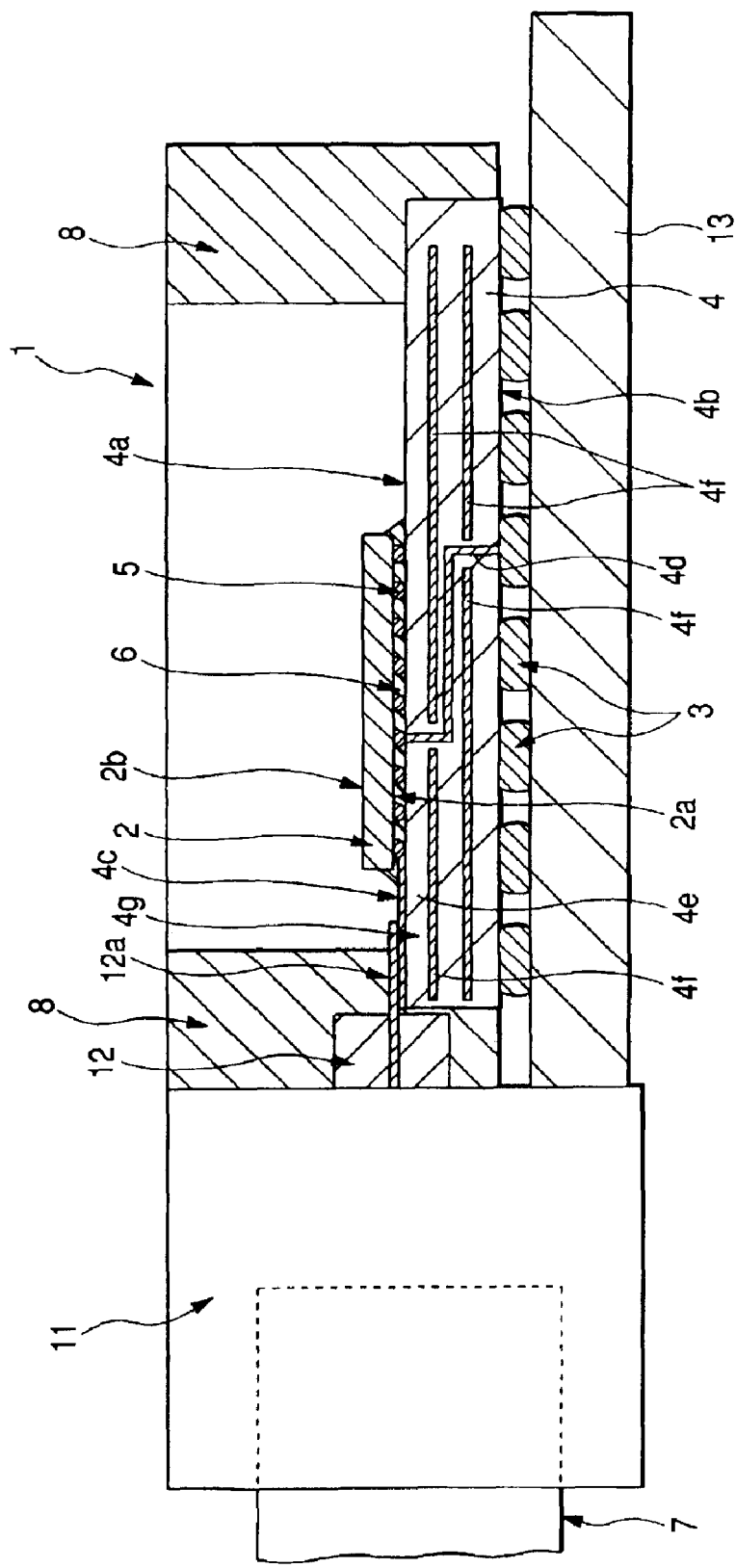
FIG. 1 is a cross-sectional view showing one example of a structure of a semiconductor device (high-frequency package) according to a first embodiment of the present invention.

Preferred embodiments of the present invention will hereinafter be described in detail with reference to the accompanying drawings.

Whenever circumstances require it for convenience in the following embodiments, they will be described while being divided into a plurality of sections or embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is also needless to say that components (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Members each having the same function in all the drawings for describing the embodiments are respectively identified by the same reference numerals and their repetitive description will therefore be omitted.

(First Embodiment)

Figure 2:
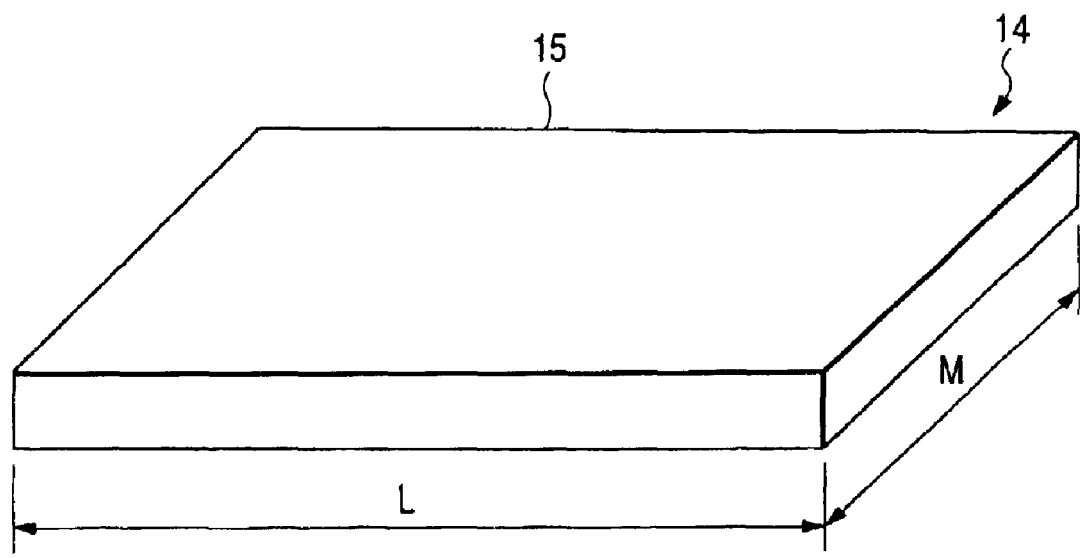
FIG. 2 is an external perspective view illustrating one example of a structure of an optical module with the high-frequency package shown in FIG. 1 built therein.
Figure 3:
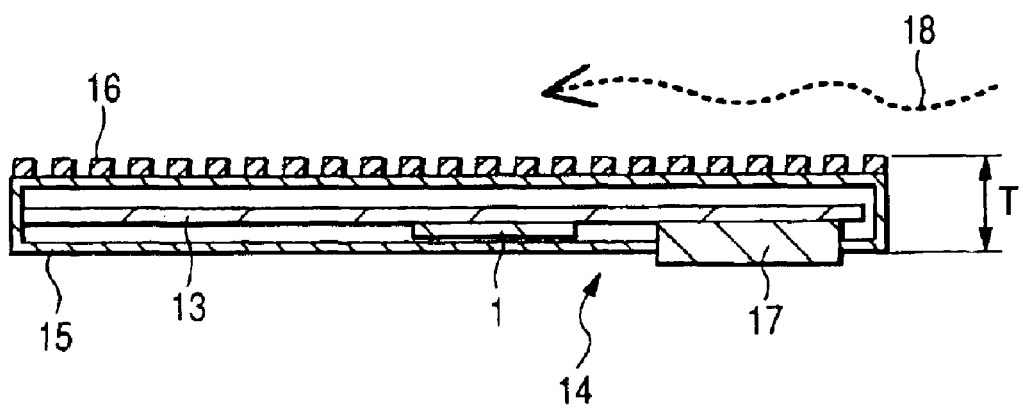
FIG. 3 is a cross-sectional view depicting the structure of the optical module shown in FIG. 2.
Figure 6:
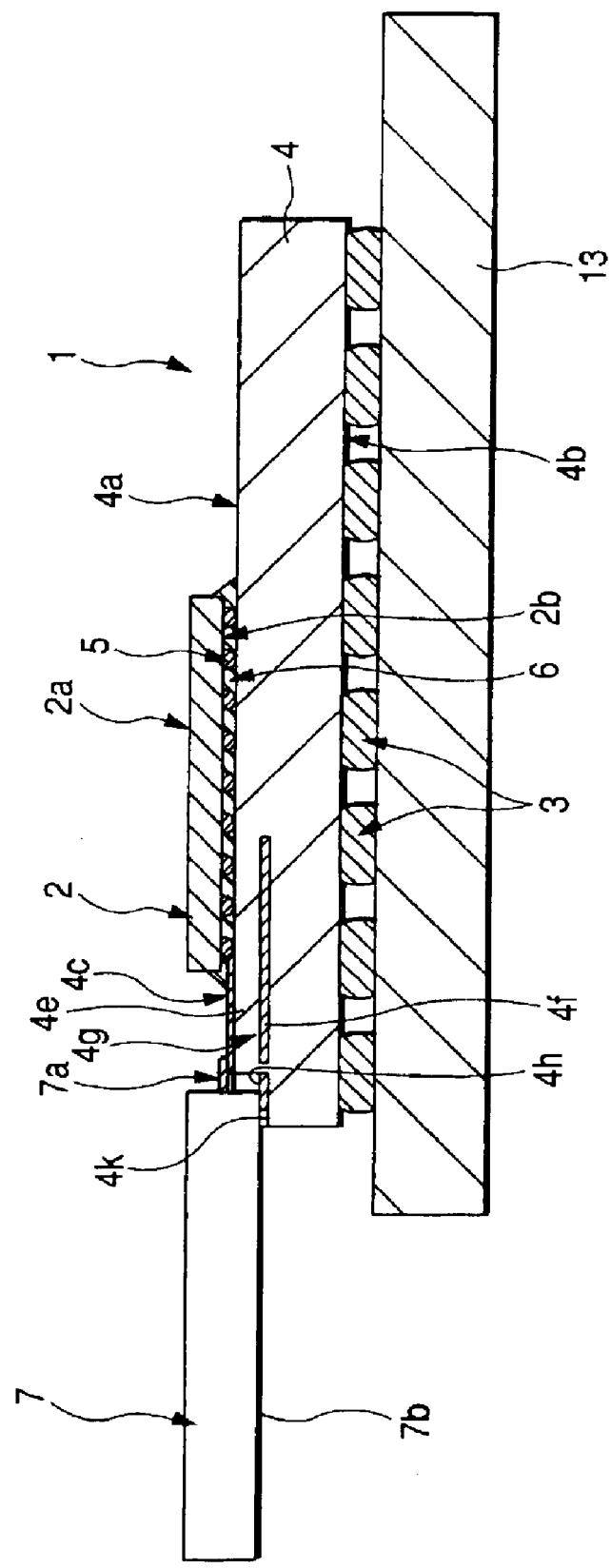
FIG. 6 is a cross-sectional view showing a structure of a semiconductor device (high-frequency package) according to a modification of the first embodiment of the present invention.
Figure 7:
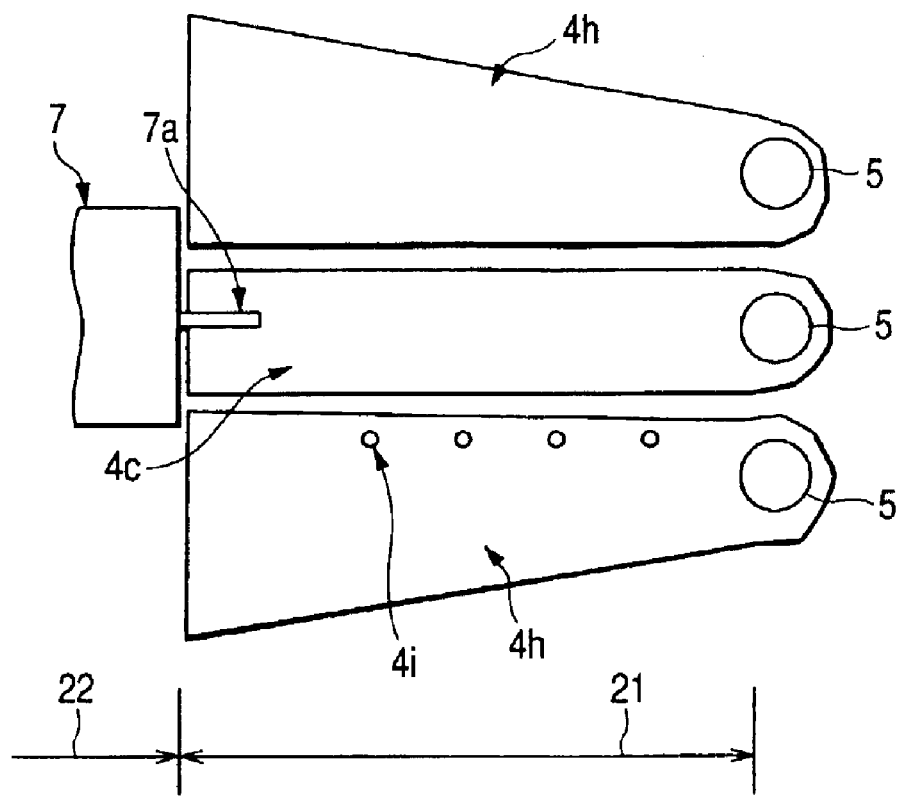
FIG. 7 is a partly plan view illustrating one example of a structure of a microstrip line of a wiring board employed in the high-frequency package shown in FIG. 1.
Figure 8:
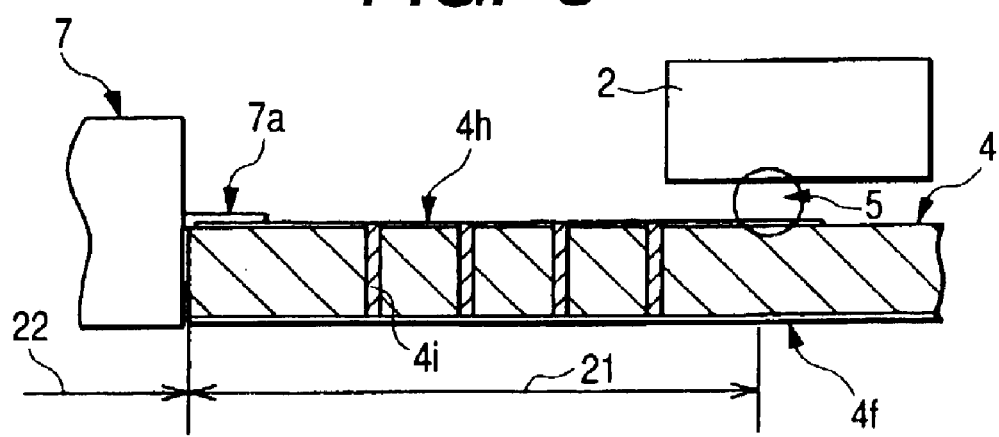
FIG. 8 is a partly cross-sectional view showing the structure of the microstrip line shown in FIG. 7.
Figure 9:
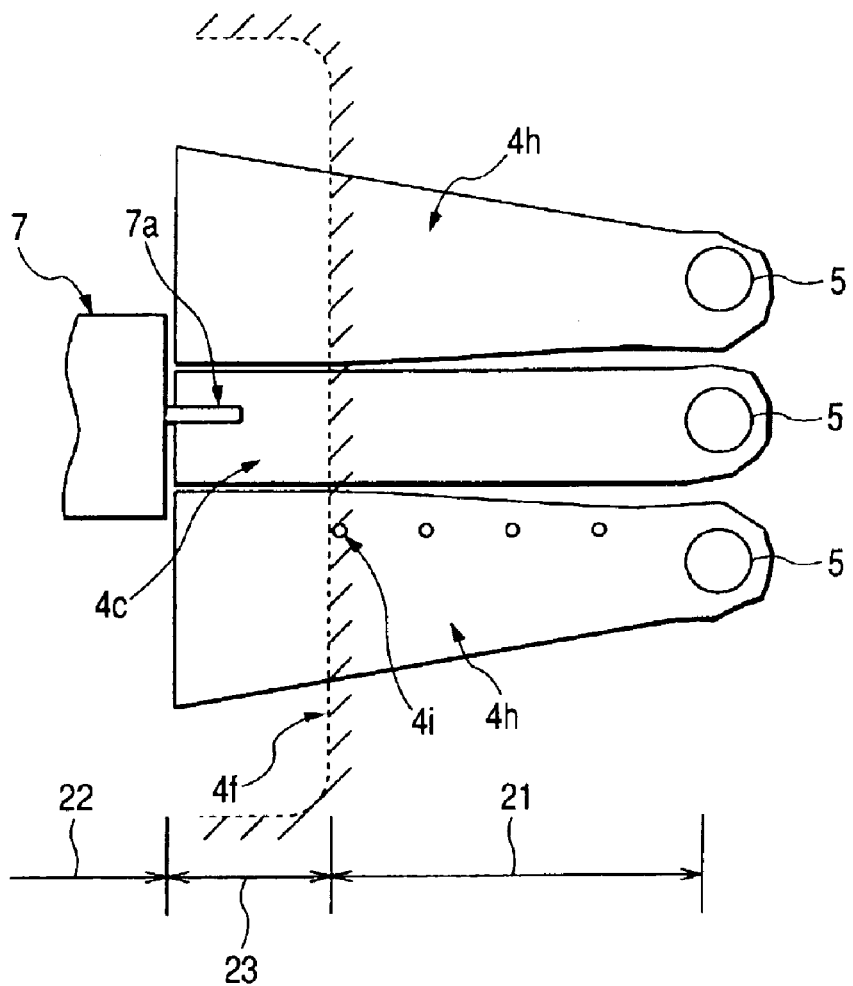
FIG. 9 is a partly plan view depicting a structure of a microstrip line illustrative of a modification of the microstrip line of the wiring board employed in the high-frequency package shown in FIG. 1.
Figure 10:
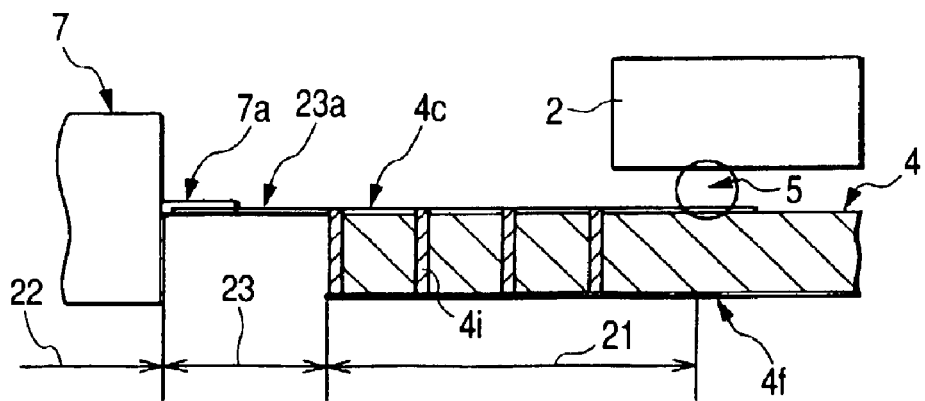
FIG. 10 is a partly cross-sectional view showing the structure of the microstrip line illustrative of the modification shown in FIG. 9.
Figure 11:
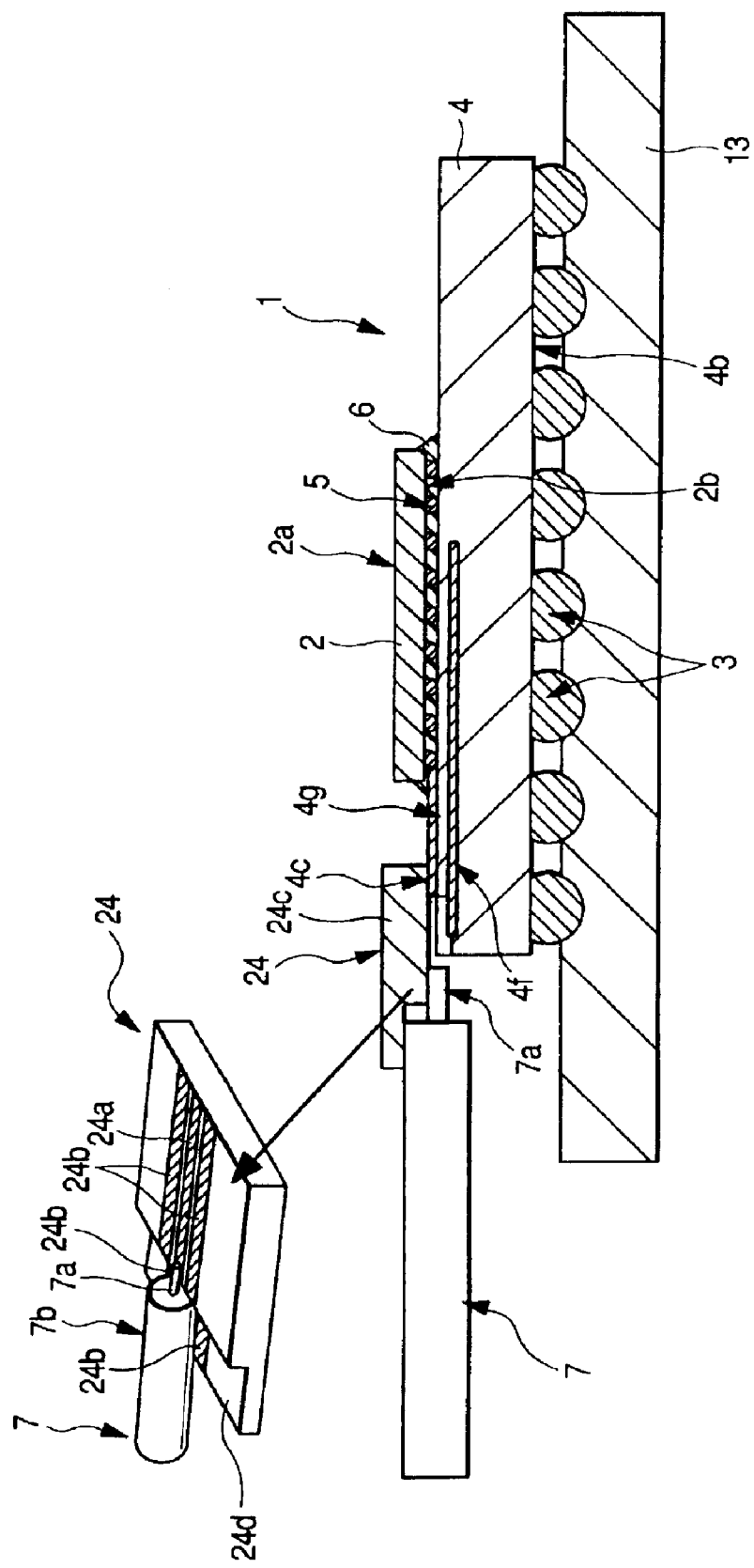
FIG. 11 is a perspective view and a cross-sectional view showing a structure of a semiconductor device (high-frequency package) illustrative of another modification of the first embodiment of the present invention.
Figure 12:
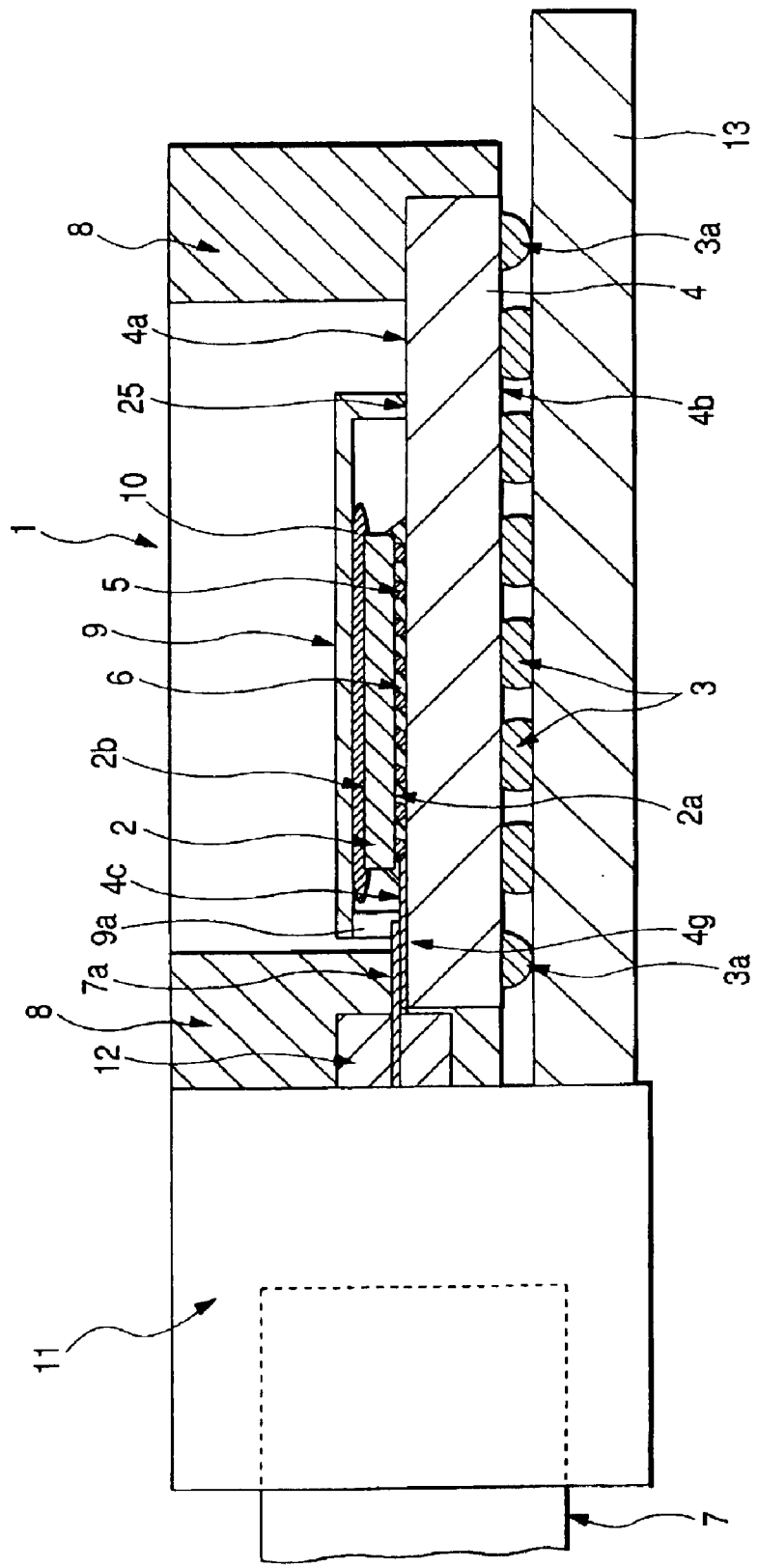
FIG. 12 is a cross-sectional view depicting one example of a cap-mounted structure of the high-frequency package shown in FIG. 1.
Figure 13:
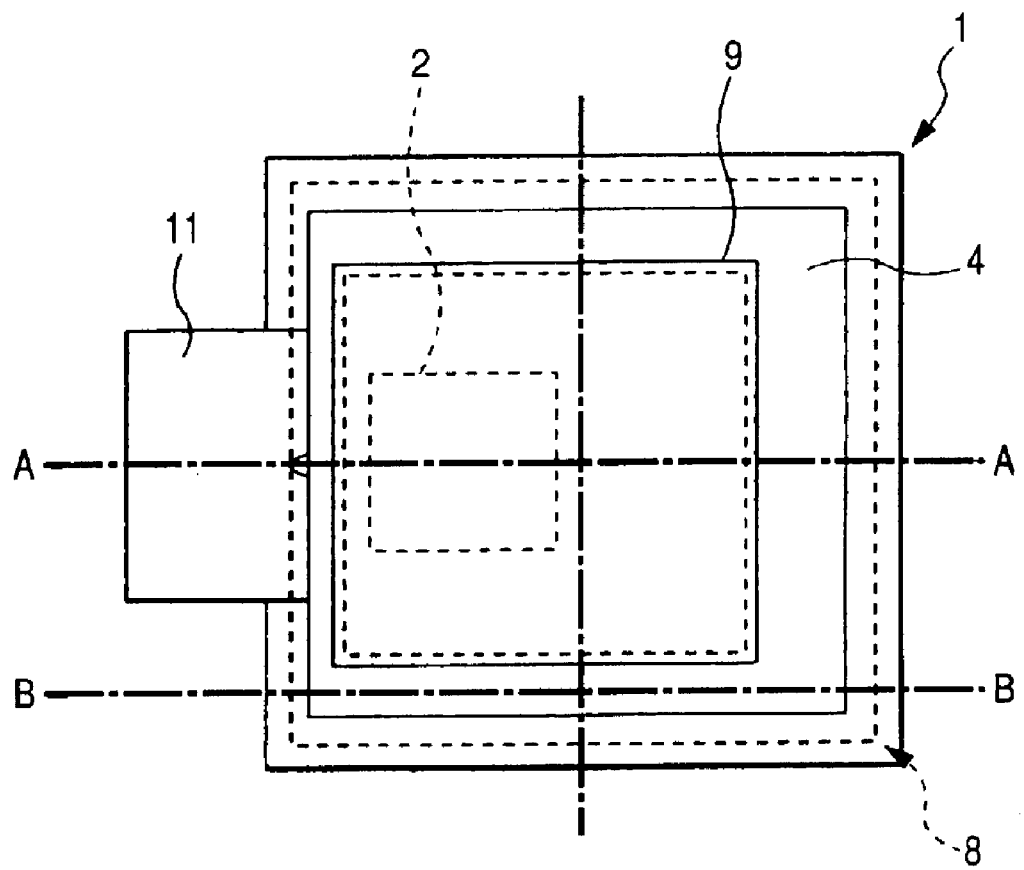
FIG. 13 is a plan view of the cap-mounted structure shown in FIG. 12.
Figure 14:
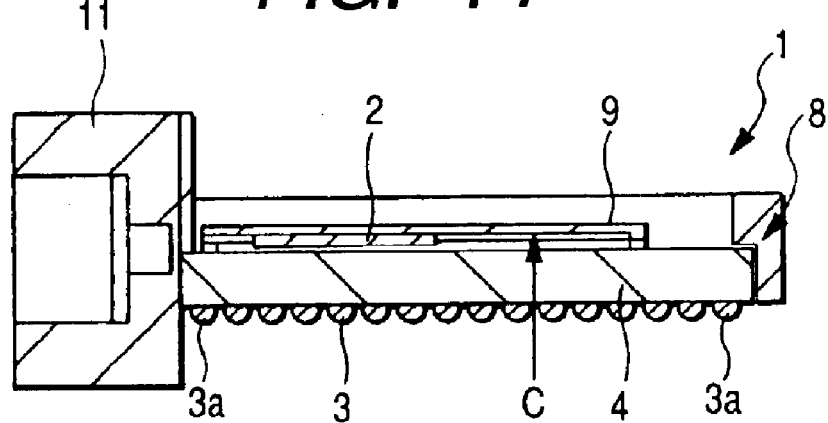
FIG. 14 is a cross-sectional view showing a structure of a cross-section cut along line A—A of FIG. 13.
Figure 15:
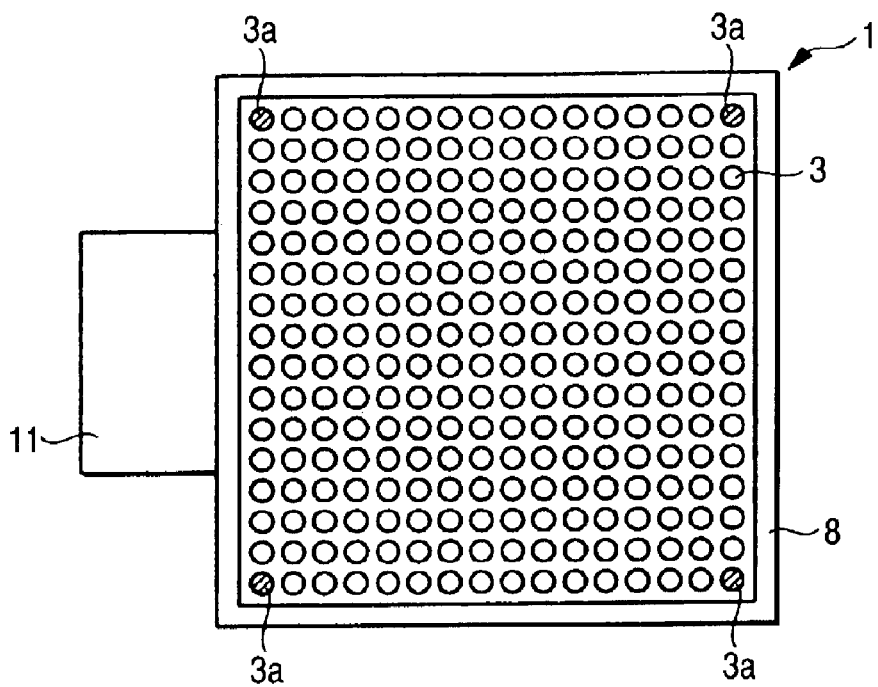
FIG. 15 is a bottom view of the cap-mounted structure shown in FIG. 13.
Figure 16:
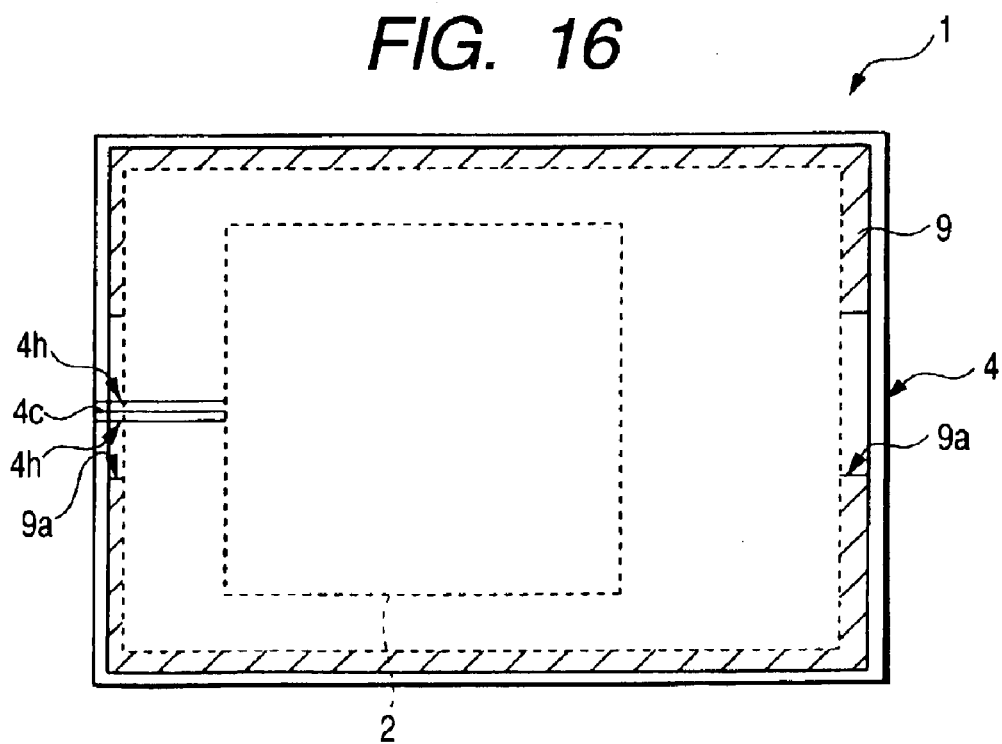
FIG. 16 is a plan view showing one example of the relationship of position between surface layer wirings and a cap employed in the cap-mounted structure shown in FIG. 12.
Figure 19:
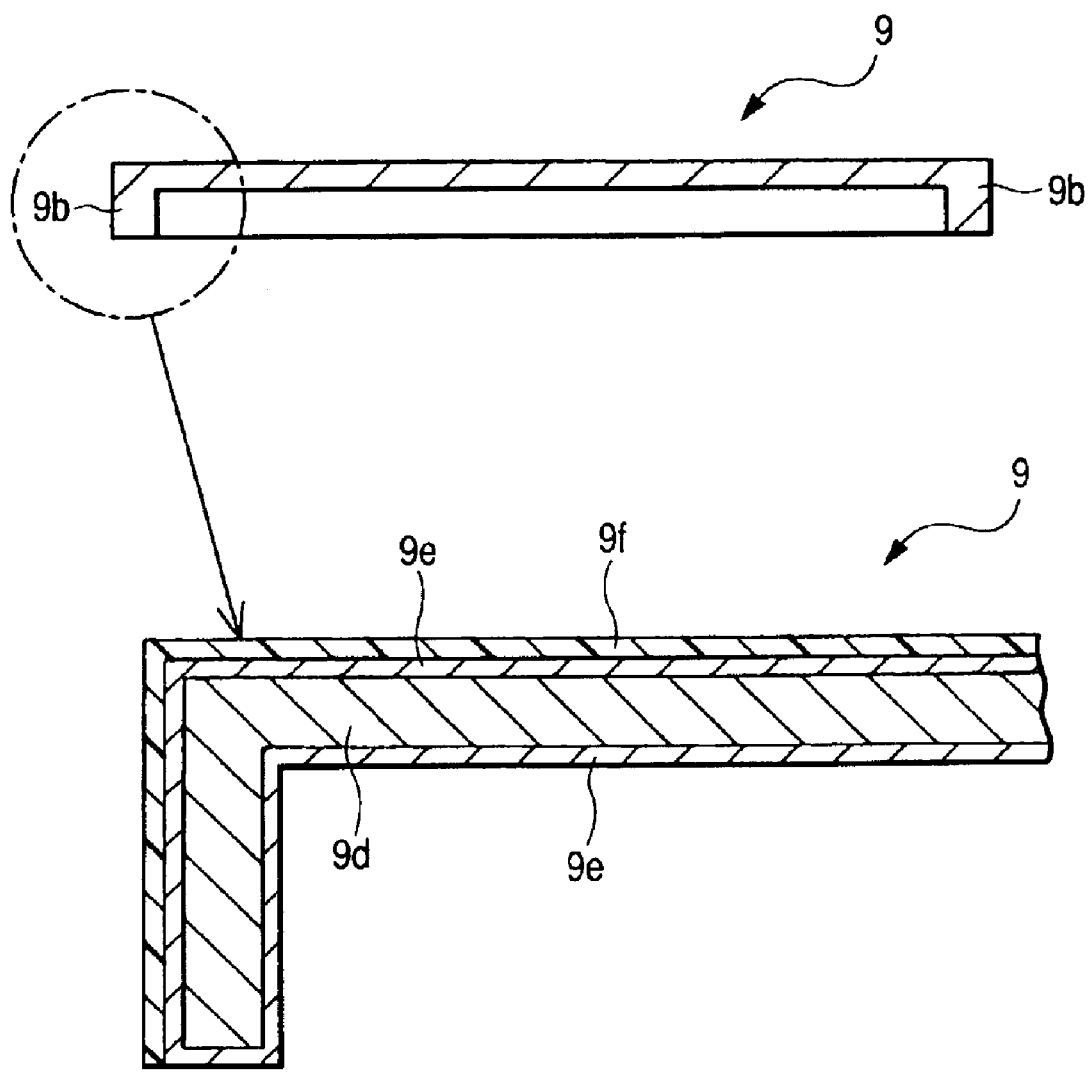
FIG. 19 is a cross-sectional view illustrating the structure of the cap shown in FIG. 17 and an enlarged partly cross-sectional view of its corner.
Figure 20:
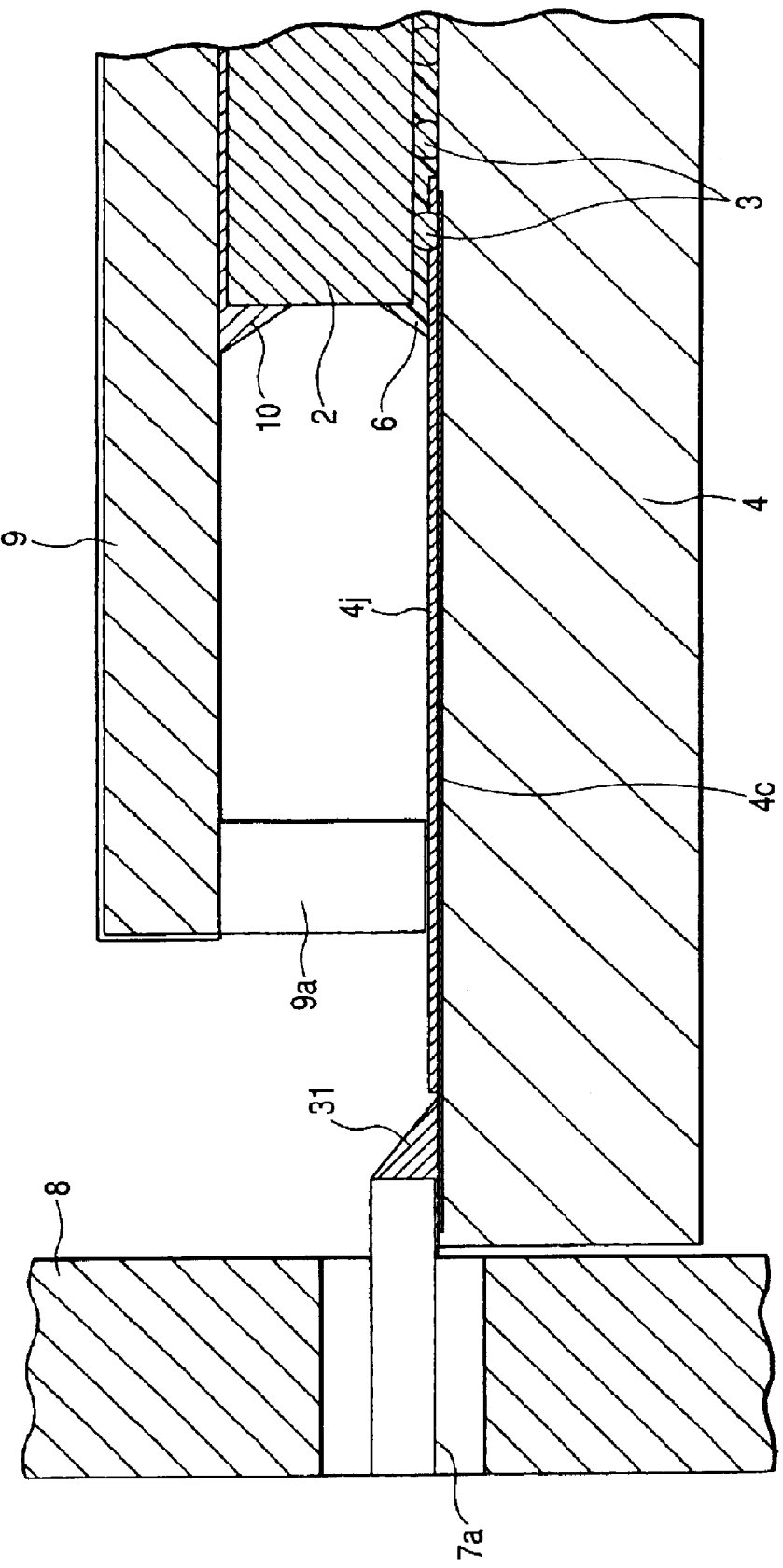
FIG. 20 is an enlarged partly cross-sectional view showing a detailed structure of the cross-section cut along line A—A of FIG. 13.
Figure 21:
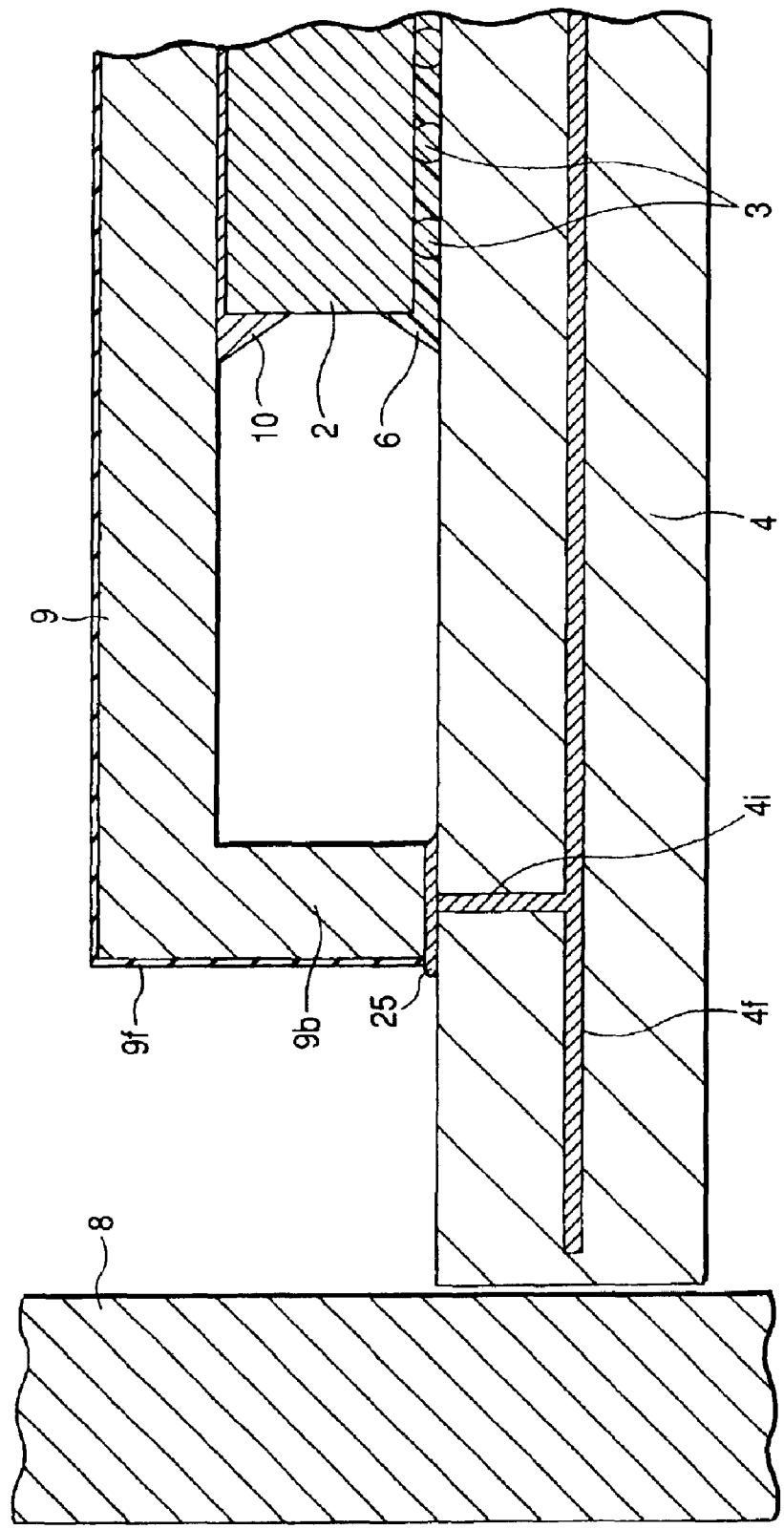
FIG. 21 is an enlarged partly cross-sectional view illustrating a detailed structure of a cross-section cut along line B—B of FIG. 13.
Figure 22:
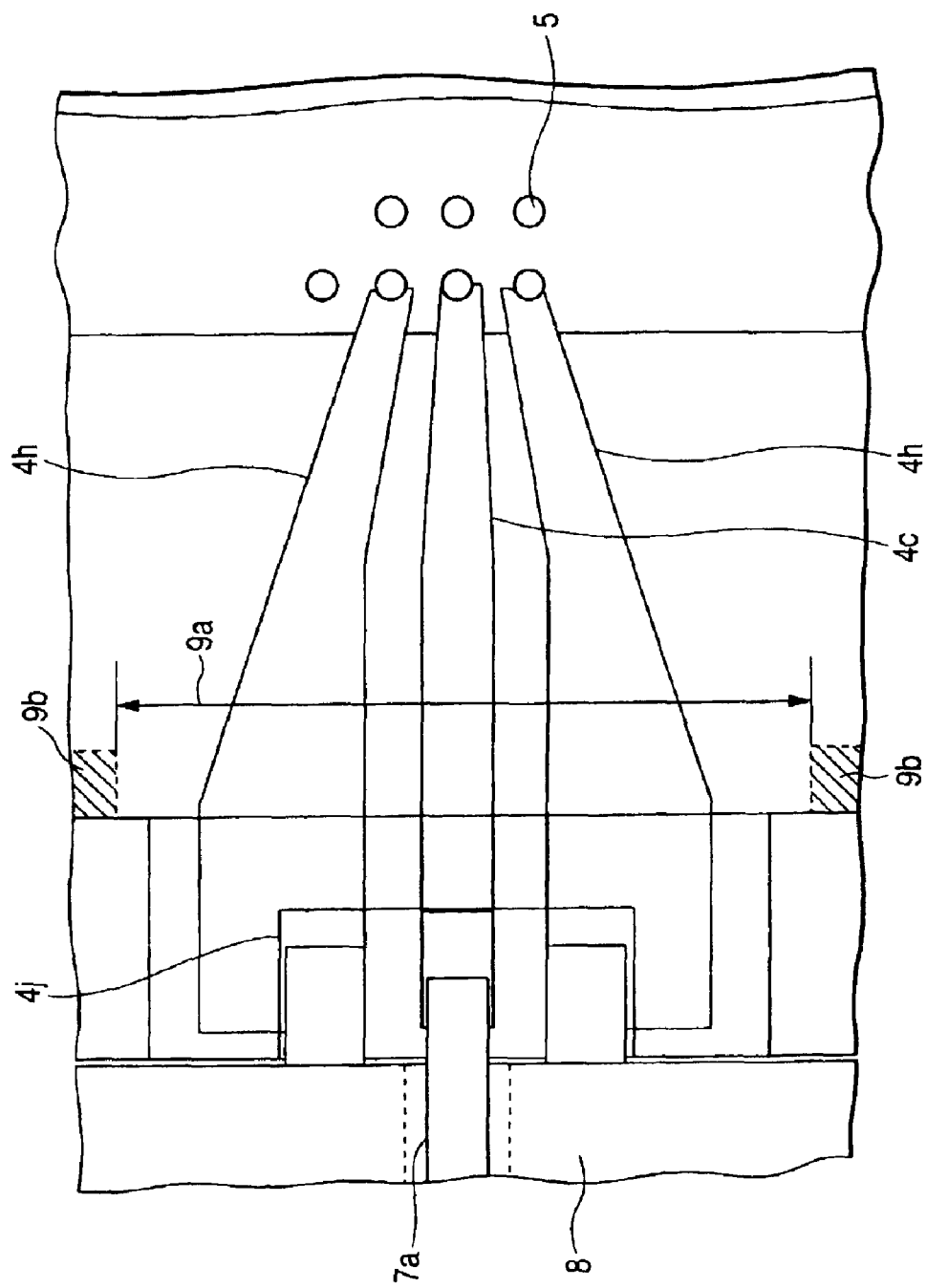
FIG. 22 is an enlarged partly plan view showing one example of the relationship of position between the surface layer wirings employed in the cap-mounted structure shown in FIG. 12 and an opening of the cap employed therein.
Figure 23:
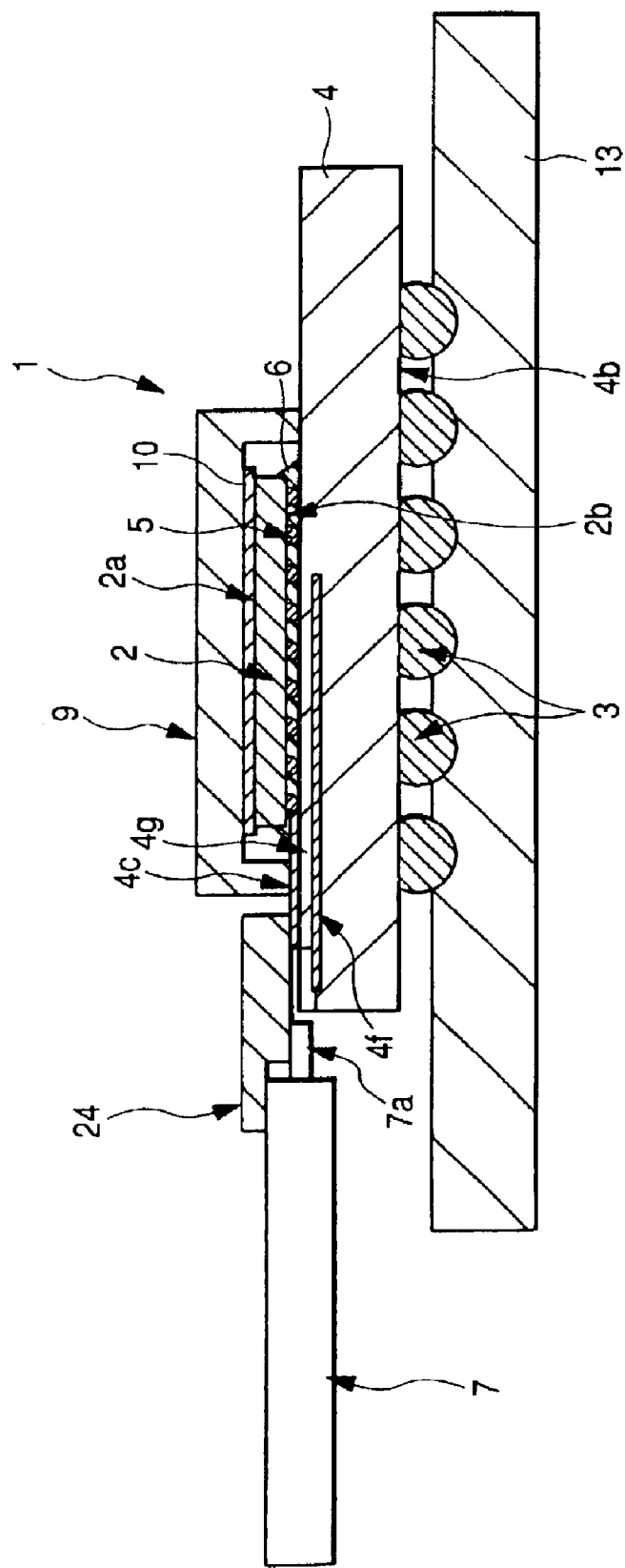
FIG. 23 is a cross-sectional view illustrating a structure of a semiconductor device (high-frequency package) illustrative of a further modification of the first embodiment of the present invention.
Figure 24:
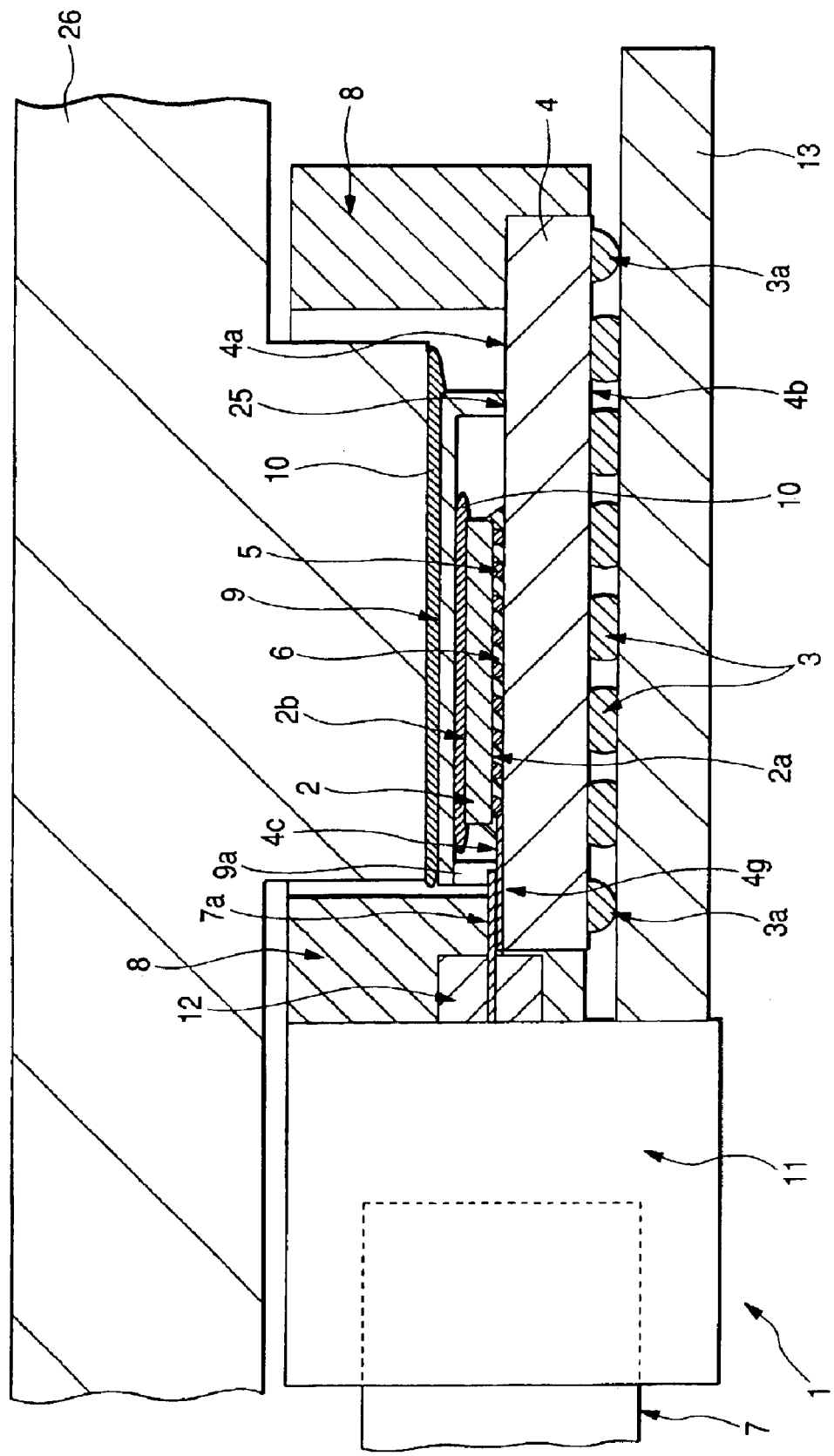
FIG. 24 is an enlarged partly cross-sectional view showing one example of a structure wherein a radiating member is mounted to the cap shown in FIG. 12.
Figure 26:
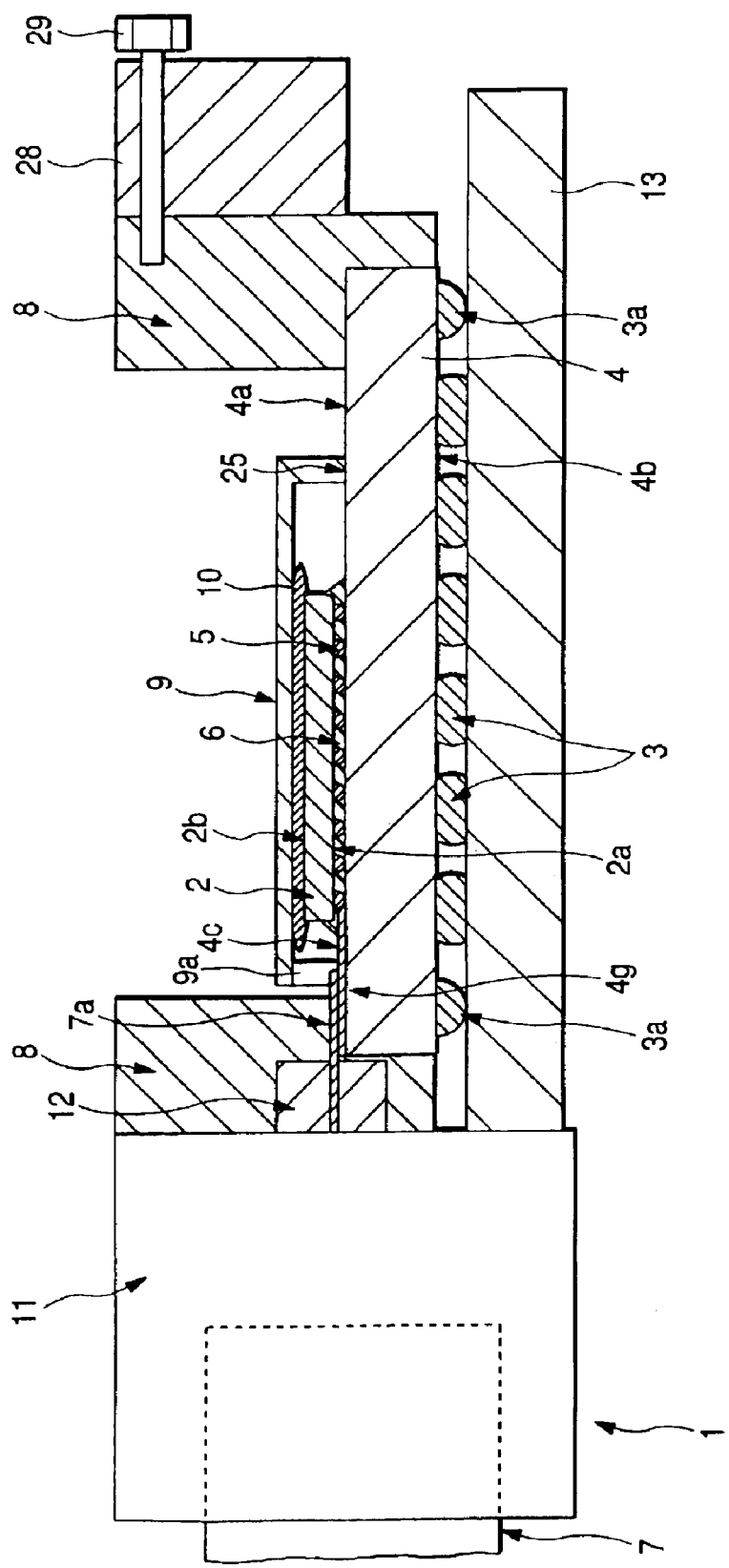
FIG. 26 is a cross-sectional view showing a structure of a semiconductor device (high-frequency package) illustrative of a still further modification of the first embodiment of the present invention.
Figure 27:
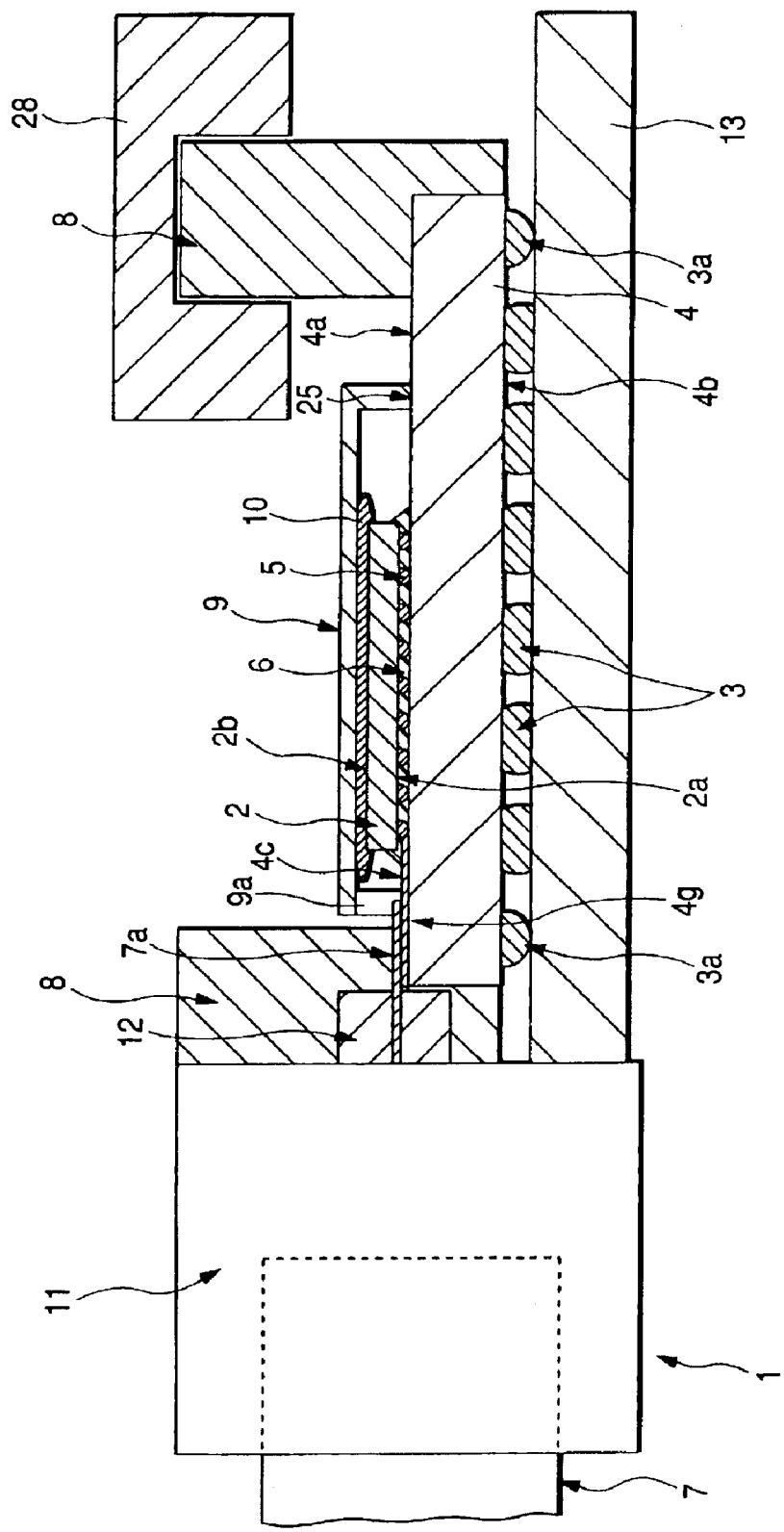
FIG. 27 is a cross-sectional view depicting a structure of a semiconductor device (high-frequency package) illustrative of a still further modification of the first embodiment of the present invention.
Figure 28:
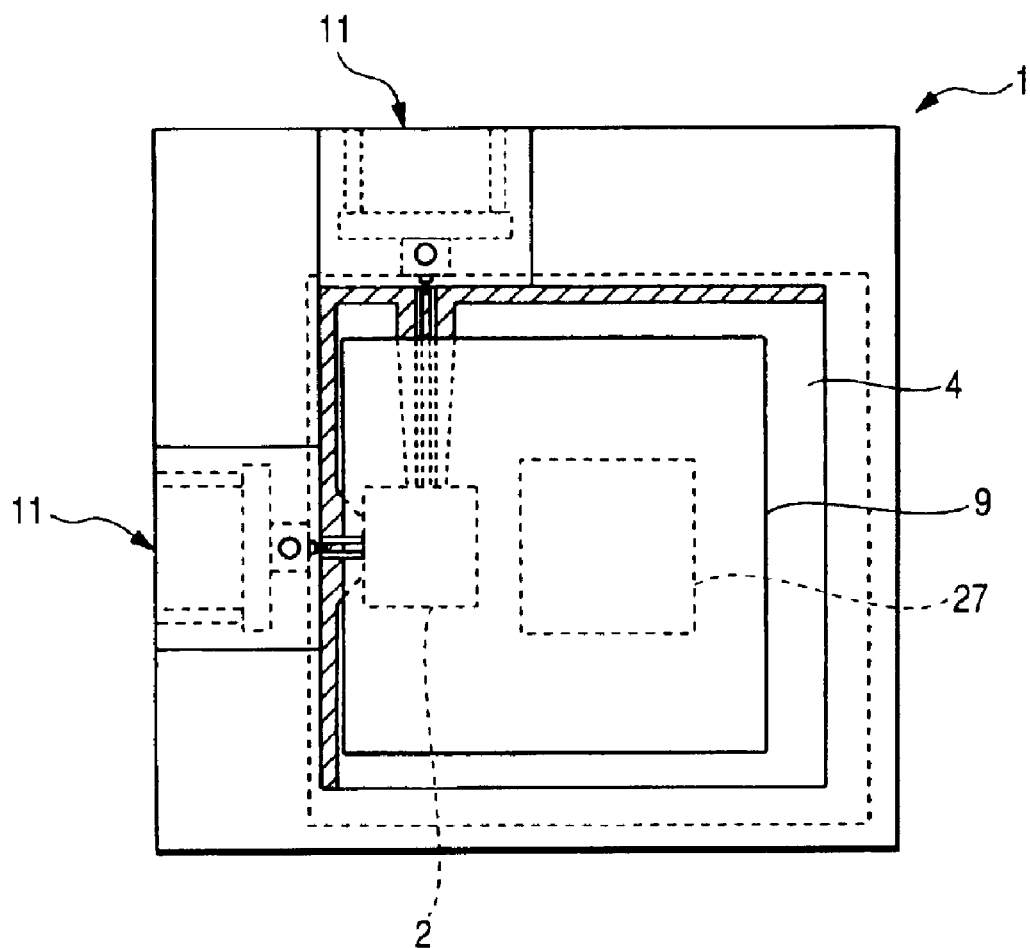
FIG. 28 is a plan view showing a structure of a semiconductor device (high-frequency package) illustrative of a still further modification of the first embodiment of the present invention.
Figure 29:
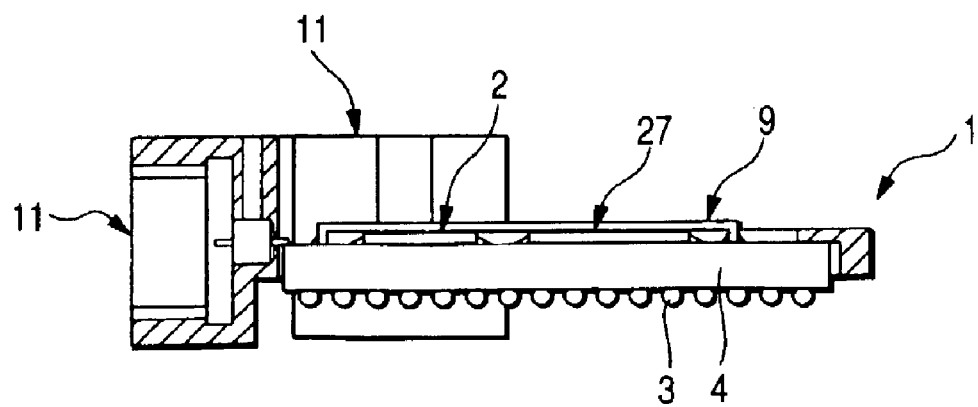
FIG. 29 is a cross-sectional view illustrating the structure of the high-frequency package shown in FIG. 28.
Figure 31:
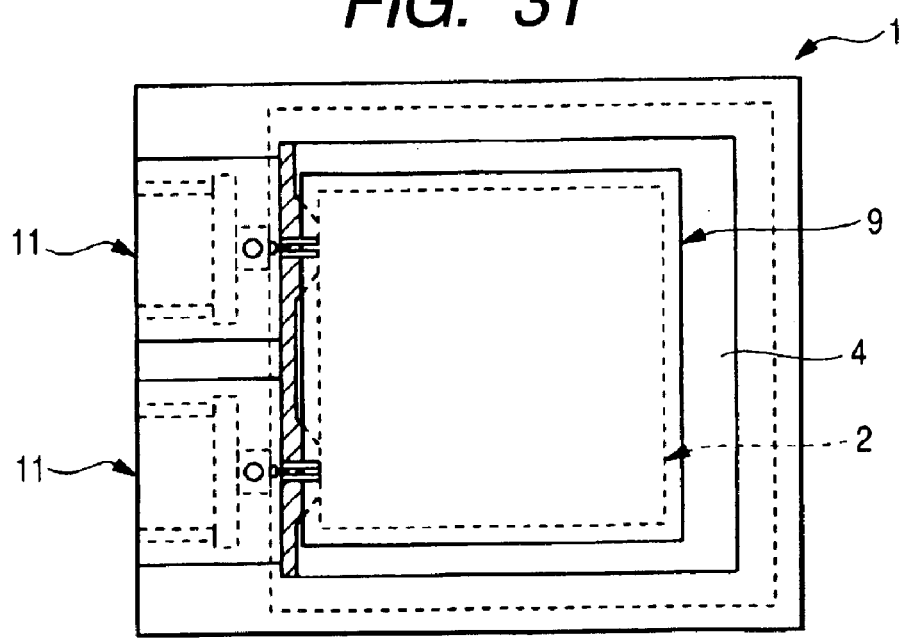
FIG. 31 is a plan view depicting a structure of a semiconductor device (high-frequency package) illustrative of a still further modification of the first embodiment of the present invention.
Figure 32:
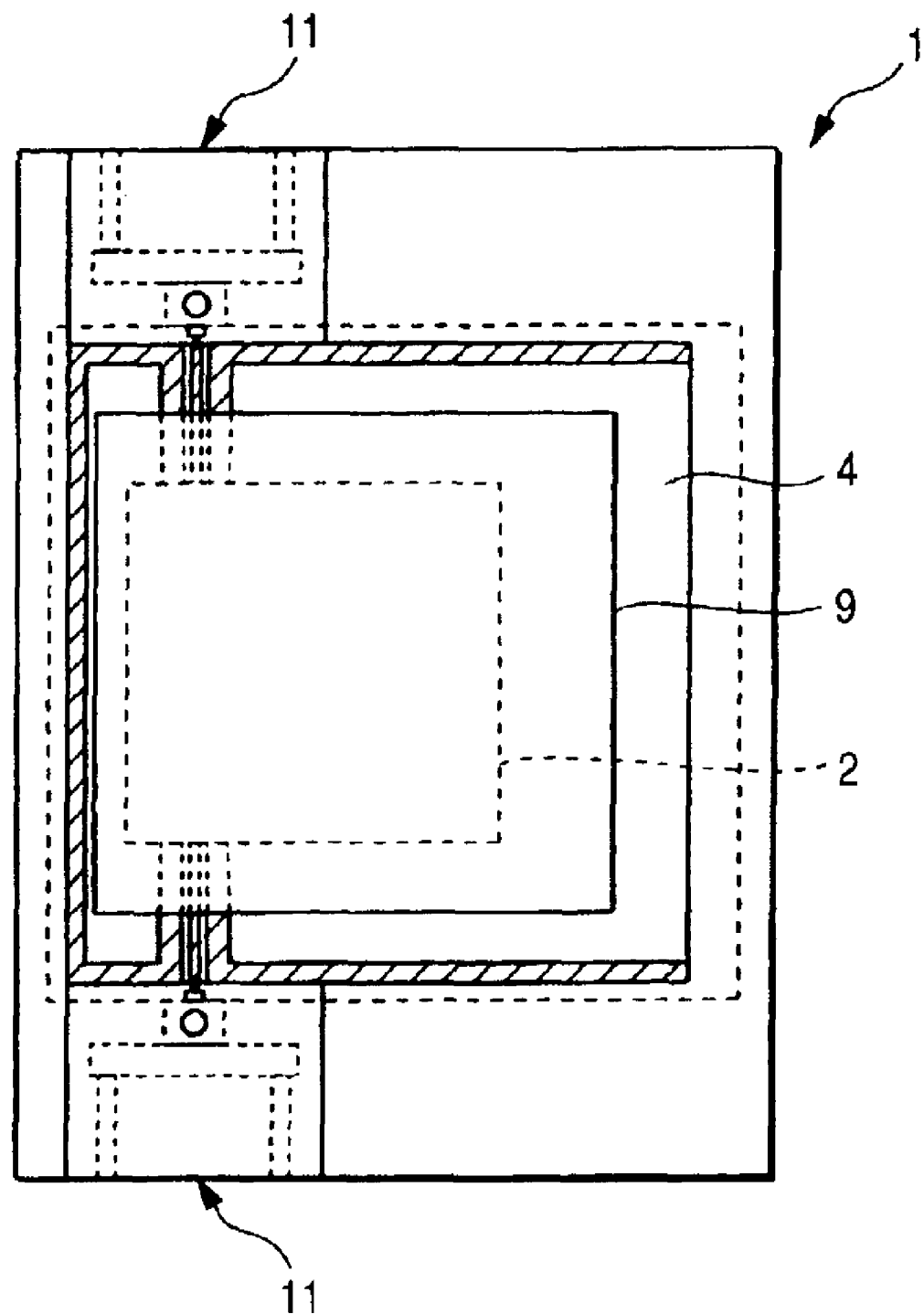
FIG. 32 is a plan view showing a structure of a semiconductor device (high-frequency package) illustrative of a still further modification of the first embodiment of the present invention.
Figure 33:
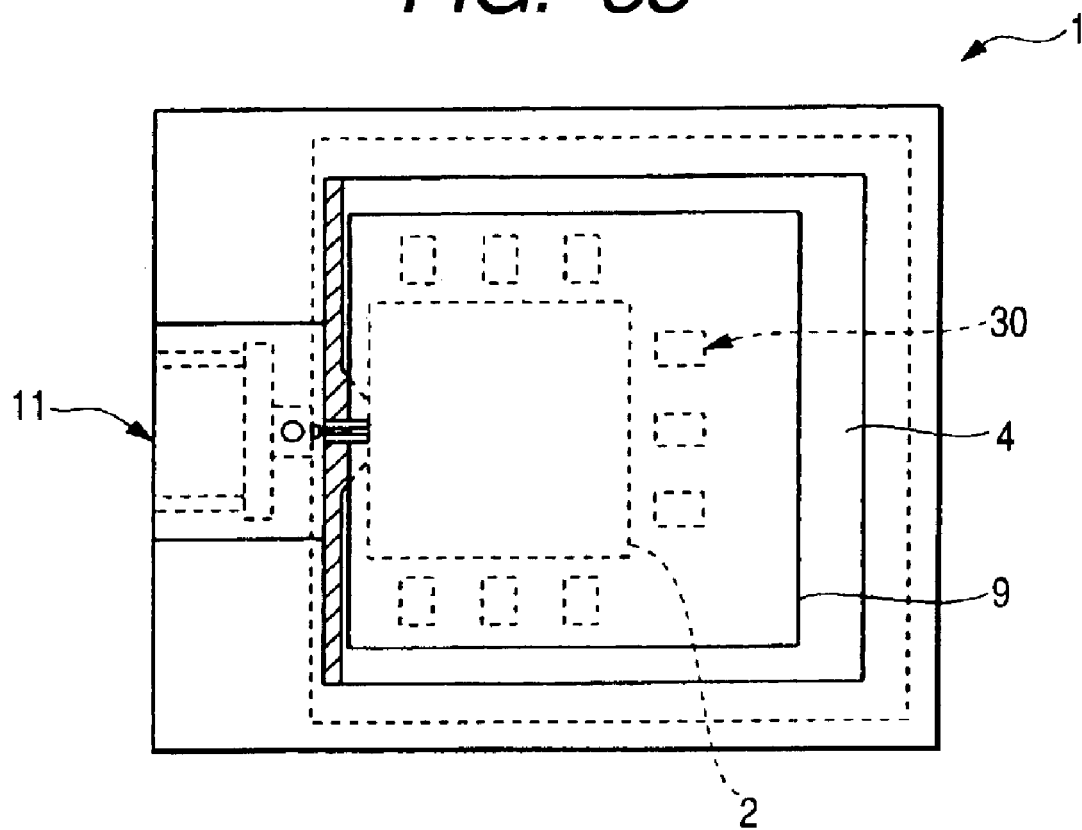
FIG. 33 is a plan view depicting a structure of a semiconductor device (high-frequency package) illustrative of a still further modification of the first embodiment of the present invention.
Figure 34:
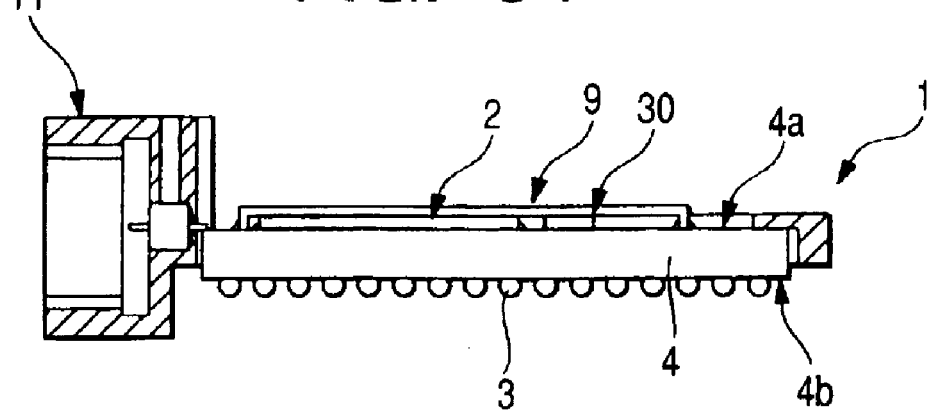
FIG. 34 is a cross-sectional view showing the structure of the high-frequency package illustrated in FIG. 33.
Figure 35:
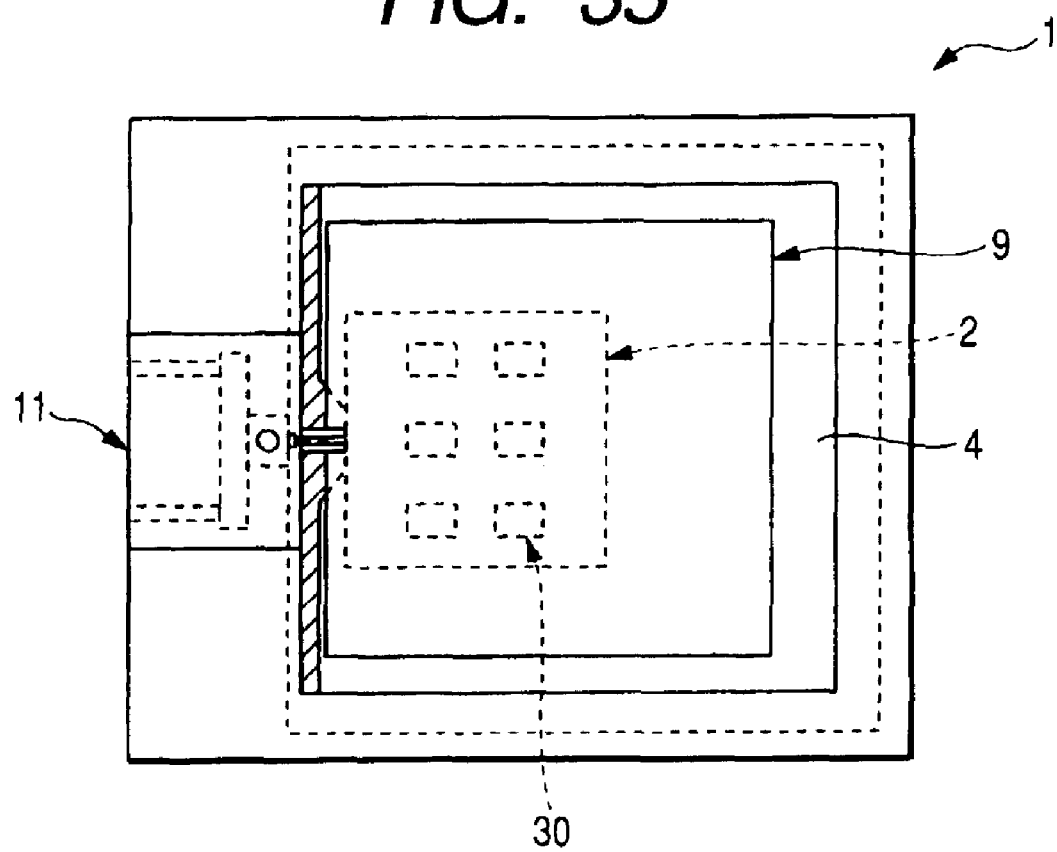
FIG. 35 is a plan view depicting a structure of a semiconductor device (high-frequency package) illustrative of a still further modification of the first embodiment of the present invention.
Figure 36:
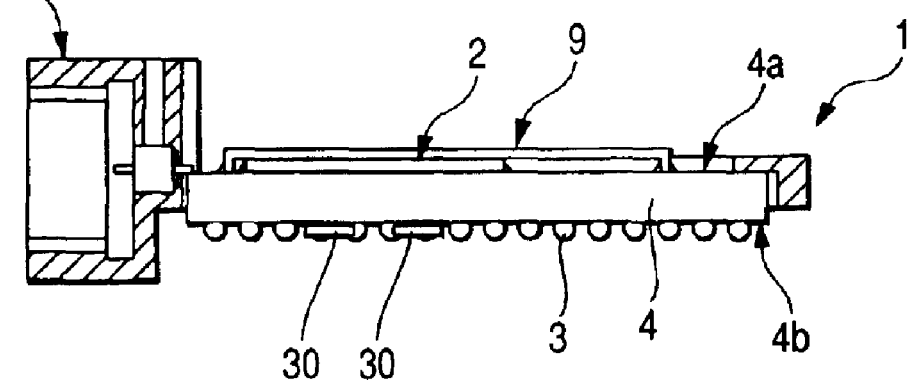
FIG. 36 is a cross-sectional view showing the structure of the high-frequency package depicted in FIG. 35.
Figure 37:
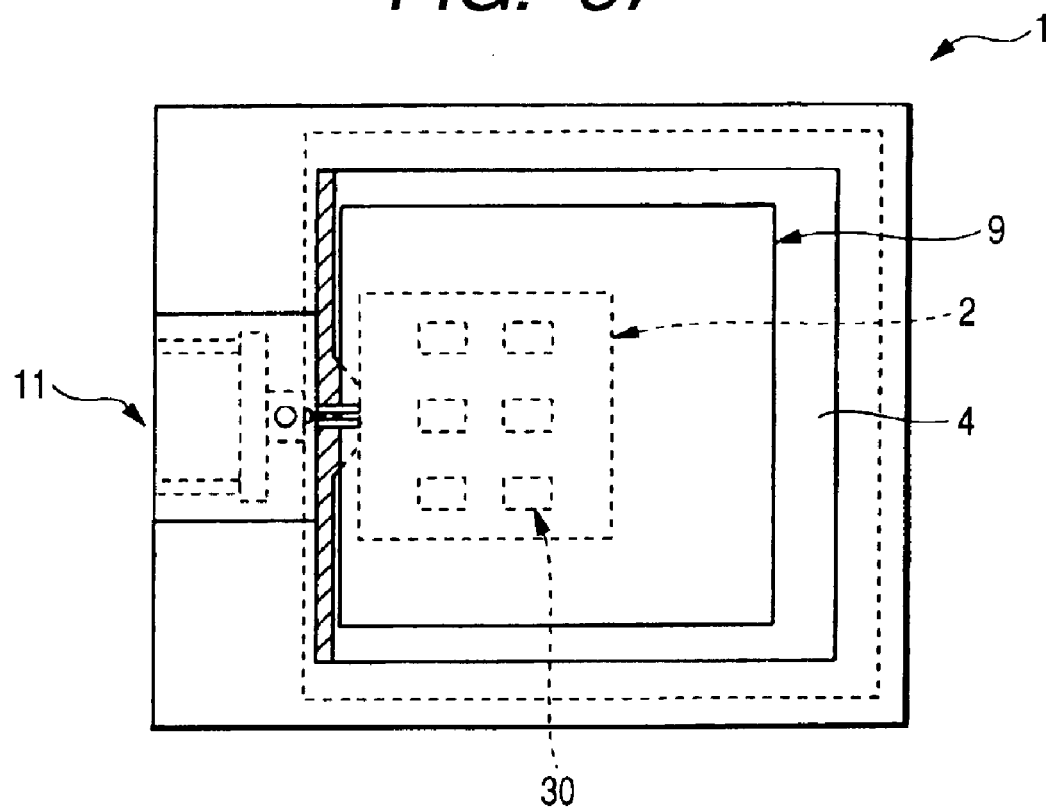
FIG. 37 is a plan view depicting a structure of a semiconductor device (high-frequency package) illustrative of a still further modification of the first embodiment of the present invention.
Figure 38:
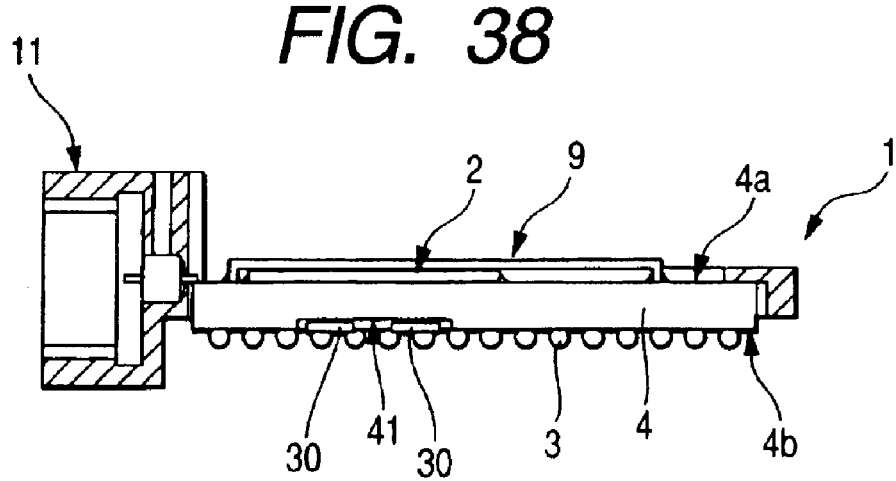
FIG. 38 is a cross-sectional view showing the structure of the high-frequency package illustrated in FIG. 37.

FIG. 1 is a cross-sectional view showing one example of a structure of a high-frequency package according to a first embodiment of the present invention, FIG. 2 is an external perspective view illustrating one example of a structure of an optical module with the high-frequency package shown in FIG. 1 built therein, FIG. 3 is a cross-sectional view depicting the structure of the optical module shown in FIG. 2, FIG. 4 is a plan view showing one example of a layout of parts built in the optical module shown in FIG. 2, FIG. 5 is a cross-sectional view illustrating one example of the layout of the parts built in the optical module shown in FIG. 2, FIG. 6 is a cross-sectional view showing a structure of a high-frequency package according to a modification of the first embodiment, FIG. 7 is a partly plan view illustrating one example of a structure of a microstrip line of a wiring board employed in the high-frequency package shown in FIG. 1, FIG. 8 is a partly cross-sectional view showing the structure of the microstrip line shown in FIG. 7, FIG. 9 is a partly plan view depicting a structure of a microstrip line illustrative of a modification of the microstrip line of the wiring board employed in the high-frequency package shown in FIG. 1, FIG. 10 is a partly cross-sectional view showing the structure of the microstrip line illustrative of the modification shown in FIG. 9, FIG. 11 is a perspective view and a cross-sectional view showing a structure of a high-frequency package illustrative of another modification of the first embodiment, FIG. 12 is a cross-sectional view depicting one example of a cap-mounted structure shown in FIG. 1, FIG. 13 is a plan view of the cap-mounted structure shown in FIG. 12, FIG. 14 is a cross-sectional view cut along line A—A of FIG. 13, FIG. 15 is a bottom view of the cap-mounted structure shown in FIG. 13, FIG. 16 is a plan view showing one example of the relationship of position between surface layer wirings and a cap employed in the cap-mounted structure shown in FIG. 12, FIG. 17 is a bottom view illustrating a structure of the cap as seen in the direction indicated by an arrow C of FIG. 14, FIG. 18 is a side view showing the structure of the cap shown in FIG. 17, FIG. 19 is a cross-sectional view illustrating the structure of the cap shown in FIG. 17 and an enlarged partly cross-sectional view of its corner, FIG. 20 is an enlarged partly cross-sectional view cut along line A—A of FIG. 13, FIG. 21 is an enlarged partly cross-sectional view cut along line B—B of FIG. 13, FIG. 22 is an enlarged partly plan view showing one example of the relationship of position between the surface layer wirings employed in the cap-mounted structure shown in FIG. 12 and an opening of the cap employed therein, FIG. 23 is a cross-sectional view illustrating a structure of a high-frequency package illustrative of a further modification of the first embodiment, FIG. 24 is an enlarged partly cross-sectional view showing one example of a structure wherein a radiating member is mounted to the cap shown in FIG. 12, FIGS. 25, 26 and 27 are respectively cross-sectional views depicting structures of high-frequency packages illustrative of still further modifications of the first embodiment, FIG. 28 is a plan view showing a structure of a high-frequency package illustrative of a still further modification of the first embodiment, FIG. 29 is a cross-sectional view of the high-frequency package shown in FIG. 28, FIGS. 30, 31 and 32 are respectively plan views showing structures of high-frequency packages illustrative of still further modifications of the first embodiment, FIG. 33 is a plan view depicting a structure of a high-frequency package illustrative of a still further modification of the first embodiment, FIG. 34 is a cross-sectional view of the high-frequency package illustrated in FIG. 33, FIG. 35 is a plan view depicting a structure of a high-frequency package illustrative of a still further modification of the first embodiment, FIG. 36 is a cross-sectional view of the high-frequency package depicted in FIG. 35, FIG. 37 is a plan view depicting a structure of a high-frequency package illustrative of a still further modification of the first embodiment, and FIG. 38 is a cross-sectional view of the high-frequency package illustrated in FIG. 37, respectively.

The semiconductor device according to the first embodiment shown in FIG. 1 is a semiconductor package equipped with an optical communication IC (Integrated Circuit), e.g., a high-frequency package 1 capable of performing high-speed transmission at 40 Gbps. Incidentally, the high-frequency package 1 is mounted to an optical module (an electronic device such as a semiconductor module device) 14 shown in FIGS. 2 and 3 and has a coaxial cable 7 used as one for signal transmission on the high-frequency side.

Now, the coaxial cable 7 employed in the first embodiment is one example of a transmission line. Incidentally, the transmission line is a wiring path for transmitting high frequency power, such as a microstrip line, a feeder cable or the like. A general wiring is a line for transmitting power regardless of high and low frequencies. While an input portion thereof and an output portion thereof are electrically connected to each other, characteristics at the transmission of the power are not necessarily taken into consideration. Accordingly, there may be a case in which high frequency power is not transmitted (the output is zero) even though low frequency power is transmitted.

On the other hand, the transmission line is of a line wherein wiring shapes or configurations and configurations and layouts of peripheral conductors including wirings, the quality of a material for an insulating layer, and the thickness and structure of the insulating layer are designed in such a manner that power is propagated with efficiency without a substantial reduction in output due to attenuation and reflection of the power in the course of its propagation.

The high-frequency package 1 according to the first embodiment comprises a package substrate (wiring board) 4 used as a chip carrier having a microstrip line 4g made up of a signal surface layer wiring (surface layer wiring) 4c and GND layers (ground conductor layers) 4f formed inside through the signal surface layer wiring 4c and an insulating layer 4e, a high-frequency semiconductor chip 2 electrically connected to and mounted onto a main surface 4a of the package substrate 4 by flip-chip connection with a plurality of solder bump electrodes 5 interposed therebetween, a coaxial cable 7 whose core line 7a is electrically connected to the signal surface layer wiring 4c, an underfill resin 6 poured between a main surface 2a of the semiconductor chip 2 and the main surface 4a of the package substrate 4 to protect the flip-chip connected portion, and ball electrodes 3 used as a plurality of external connecting terminals disposed within a back surface 4b located on the side opposite to the main surface 4a of the package substrate 4.

Namely, the high-frequency package 1 is one wherein a signal of a high frequency (e.g., 40 Gbps) inputted from the coaxial cable 7 is directly inputted to the semiconductor chip 2 so as to propagate through the solder bump electrodes 5 via the signal surface layer wiring 4c of the package substrate 4. The high-frequency package 1 has a structure wherein the high-frequency signal can be transmitted by only the microstrip line at the whole surface layer of the package substrate 4.

Owing to the transmission of the high-frequency signal by only the microstrip line at the surface layer of the package substrate 4 without through via-based wirings or the like, the high-frequency signal can be thus transmitted without a loss in frequency characteristic.

Namely, vias (also including through holes) are not transmission lines but wirings. In order to realize the efficient propagation of power through the transmission line, wiring widths, the thickness of each interlayer insulating film, spaces between adjacent patterns, material physical values, etc. are designed as parameters so that its characteristic impedance becomes a desired value. However, since it is difficult to make the pattern of each via and each interlayer conductor vertical and constitute them as a coaxial structure, the design for obtaining the desired characteristic impedance is difficult. Accordingly, a loss in power at each via portion is apt to occur.

From this point of view, the technology described in Unexamined Patent Publication No. Hei 5(1993)-167258, for connecting the neighborhood of a portion where a core line of a coaxial cable and its corresponding each bump pad are connected, as the via configuration will cause a characteristic impedance mismatch at the connecting portion. Further, the technology is considered to need, when an attempt is made to embed the coaxial cable into a substrate in its thickness direction, such a manufacturing process that a hole is defined in the substrate by a drill or the like, the coaxial cable is inserted into the hole and then positioned therein, and each bump pad and its corresponding core line are connected to each other, after which the hole is buried. This structure increases the number of processes as compared with a general process of manufacturing a wiring board. This structure will lead to cost up with a difficult technology of cable connection and embedding.

On the other hand, since the wiring board can be manufactured by the known technology in the first embodiment, no cost up takes place.

Incidentally, the surface layer wirings such as the signal surface layer wiring 4c, the GND surface layer wirings 4h employed in the first embodiment are of wirings which are formed of, for example, copper or the like and disposed on the uppermost layer on the main surface 4a side of the package substrate 4. They may be exposed onto the main surface 4a or coated with a non-conductive thin film or the like.

It is desirable that when high-speed transmission such as 40 Gbps or the like is performed, the signal surface layer wiring 4c of the microstrip line 4g is of the shortest. Thus, the solder bump electrodes 5, of the plurality of solder bump electrodes 5 connected to the semiconductor chip 2 of the package substrate 4, which are disposed toward the coaxial cable 7 (coaxial connector 11) from the center of the semiconductor chip 2, are connected to the signal surface layer wiring 4c.

Preferably, any of the solder bump electrodes 5 disposed on the outermost periphery, of the plurality of solder bump electrodes 5 is connected to the signal surface layer wiring 4c.

Consequently, high-speed signal transmission in which a loss in the frequency characteristic of a high frequency has been suppressed to the minimum, can be realized. Since it is possible to reduce carrying of noise on the microstrip line 4g, a reduction in high-frequency characteristic can be also suppressed.

In the high-frequency package 1, the plurality of ball electrodes (bump electrodes) 3 provided as the external connecting terminals are disposed on the back surface 4b of the package substrate 4 in an array form. Accordingly, the high-frequency package 1 is a semiconductor package of a ball grid array type.

Thus, the package can be downsized as compared with an outer-lead protrusion type high-frequency package wherein outer leads protrude outwards from the package substrate 4.

Incidentally, while the microstrip line 4g transmits a high-frequency signal as an electromagnetic wave in the insulating layer 4e lying between the signal surface layer wiring 4c and its corresponding internal GND layer 4f, both of GND surface layer wirings (ground surface layer wirings) 4h disposed on both sides of a signal surface layer wiring 4c with an insulating portion interposed therebetween form a microstrip line 4g in a surface layer of a package substrate 4 as shown in FIG. 7.

A frame member 8 extending along an outer peripheral portion of the package substrate 4 is attached to the package substrate 4 in the high-frequency package 1. Further, the frame member 8 is provided with a coaxial connector (linkup or junction member) 11 fit onto the coaxial cable 7 together with a glass bead 12. Thus, the coaxial cable 7 is fit in the coaxial connector 11, the core line 7a of the coaxial cable 7 is connected to its corresponding core line 12a of the glass bead 12, and the core line 12a is in solder-connection 31 to the signal surface layer wiring 4c of the package substrate 4 (it may be connected thereto by a conductive resin or the like).

Incidentally, the diameter of the coaxial connector 11 is about 10 mm, for example.

The package substrate 4 is a substrate formed of, for example, glass-contained ceramic or the like. The package substrate 4 has a thickness of about 1 mm, for example and is formed thereinside with an internal signal wiring 4d used as a signal line for connecting the flip-chip connected solder bump electrode 5 and its corresponding ball electrode 3 used as the external connecting terminal, except for the GND layers 4f.

The high-frequency package 1 having such a structure is built in such an optical module (semiconductor module device) 14 or the like as shown in FIG. 2 and mounted on its module substrate (junction member) 13.

A structure of the optical module 14 will now be described.

The optical module 14 shown in FIGS. 2 through 5 is a module for high-speed optical communications, e.g., a module product mounted to a communication system apparatus or the like of a communication network base station.

The optical module 14 according to the first embodiment has a size of L (ranging from 100 mm to 200 mm)×M (ranging from 60 mm to 150 mm), for example, as shown in FIG. 2 and a height (T) ranging from 10 mm to 25 mm as shown in FIG. 3. However, the size and height of the optical module 14 are not limited to these numerical values.

The high-frequency package 1 according to the first embodiment is mounted on the module substrate 13 of the optical module 14. The module substrate 13 is covered as a whole with a module case 15. A plurality of fins 16 are formed side by side on the surface of the module case 15. Placing the fins 16 under wind 18 enables an improvement in the dissipation of the optical module 14.

Incidentally, an external terminal of the optical module 14 is a module connector 17 attached to the module substrate 13. Part of the module connector 17 is exposed to the back side of the module case 15.

In the optical module 14, as shown in FIGS. 4 and 5, a high-frequency light signal inputted from its input is converted into an electric signal by an optoelectronic transducer 20. Further, the electric signal passes through the microstrip line 4g of the package substrate 4 via an amplifier device 19 so as to enter into the high-frequency semiconductor chip 2 on the input side, followed by transformation into a low-frequency signal, which in turn is transmitted to the outside of the optical module 14 via the internal signal wiring 4d of the package substrate 4, the corresponding solder bump electrode 5 and the module substrate 13 shown in FIG. 1 and the module connector 17.

On the other hand, a signal inputted from the module connector 17 passes through a path opposite to the above path and is transmitted as an output.

Incidentally, while FIG. 4 shows that the high-frequency semiconductor chip 2 is provided two on the input and output sides, the input and output sides may be built in one semiconductor chip 2.

In FIG. 4, arrows indicated by solid lines, of arrows indicative of the flows of signals for input and output show the transmission of the light signals by optical fibers, whereas arrows indicated by dotted lines thereof show the transmission of the electric signals through the coaxial cables 7 or microstrip lines 4g.

Next, FIG. 6 shows a modification of the high-frequency package 1. A core line 7a of a coaxial cable 7 is connected directly to a signal surface layer wiring 4c of a package substrate 4 by solder or the like.

Namely, the coaxial cable 7 is directly connected to the package substrate 4 without the use of a coaxial connector 11 by solder or the like.

In this case, a step 4k for disposing the coaxial cable 7 is provided at an end of the package substrate 4, and a GND surface layer wiring 4h is provided on the surface of the step 4k. Upon placement of the coaxial cable 7 on the step 4k, a shield (GND) 7b for covering the core line 7a of the coaxial cable 7, and the GND surface layer wiring 4h on the step 4k are electrically connected to each other by solder or the like.

Owing to the direct attachment of the coaxial cable 7 to the package substrate 4 in this way, the high-frequency package 1 can be reduced in thickness and a cost reduction can be achieved because the coaxial connector 11 expensive and relatively large in diameter is not used.

A preferable shape or configuration of a GND layer 4f corresponding to an inner layer in a package substrate 4 will next be explained using FIGS. 7 through 10.

First, FIGS. 7 and 8 respectively show a case in which the GND layer 4f placed inside the substrate extends to an end of the package substrate 4 in a microstrip line structure 21 using a microstrip line 4g, and a case in which a structure wherein a coaxial structure 22 using a coaxial cable 7 and the microstrip line structure 21 are connected to each other, is taken.

In this case, a high-speed signal inputted from and outputted to the package outside passes through a path of the coaxial cable 7, a signal surface layer wiring 4c of the package substrate 4 and a semiconductor chip 2. At this time, a core line 7a of the coaxial cable 7 is connected to the signal surface layer wiring 4c of the package substrate 4, and a shield 7b used as GND, of the coaxial cable 7 is connected to its corresponding GND surface layer wirings 4h of the package substrate 4.

Further, a frame member 8 for supporting the coaxial cable 7 might be fixedly secured onto the package substrate 4. Further, the frame member 8 and the shield 7b of the coaxial cable 7 or the GND surface layer wirings 4h of the package substrate 4 might be connected to each other. Incidentally, the corresponding GND surface layer wiring 4h and the GND layer 4f used as the inner layer are connected to each other by via wirings 4i as shown in FIG. 8.

Thus, in order to bring the signal surface layer wiring 4c on the package 4 to the microstrip line structure 21 over it whole area so as to reduce L (inductance) of GND, there is a need to expose the GND layer 4f at the end of the substrate to thereby connect it to the shield 7b of the coaxial cable 7 or GND of the frame member 8, or form at the substrate end, the via wirings 4i for connecting the corresponding GND surface layer wiring 4h and the GND layer 4f used as the inner layer and cut and expose the via wirings 4i upon substrate cutting-off to thereby connect the same to the coaxial cable 7 or GND of the frame member 8.

However, these technologies need high accuracy upon positioning of the surface-layer/inner-layer wirings of the package substrate 4 and has a fear that when a pasty material such as Cu is used for wiring, it leads to wiring sagging, and a difficulty arises upon manufacture thereof.

On the other hand, a structure shown in FIGS. 9 and 10 is one formed with a coplanar line 23a wherein a signal surface layer wiring 4c and GND surface layer wirings 4h are disposed on the same plane (main surface 4a) in an area between the outermost peripheral via wiring 4i of a plurality of via wirings 4i and a coaxial cable 7. The coaxial cable 7 and a microstrip line 4g of a package substrate 4 are connected to each other through the coplanar line 23a.

Namely, an area provided outside from the outermost peripheral via wiring 4i close to the end of the package substrate 4 is defined as a coplanar structure 23. A coaxial structure 22, the coplanar structure 23 and a microstrip line structure 21 are connected to one another.

Thus, the inductance of GND can be reduced.

Further, in order to make characteristic impedance matching in an area for the coplanar structure 23, the distance between the signal surface layer wiring 4c and each of the GND surface layer wirings 4h is decreased so that they are brought close to each other as shown in FIG. 9. Incidentally, the accuracy of position displacement between the via wiring 4i and its corresponding GND layer 4f used as an inner layer is equivalent to the prior art (e.g., about 50 μm). Since a novel technology is not required, cost up can be prevented.

Thus, the interconnection of the coaxial structure 22, coplanar structure 23 and microstrip line structure 21 makes it possible to reduce a loss in high-frequency signal and bring the characteristic impedance of a high-speed signal path close to a target value.

Further, the characteristic impedance can be brought closer to a target value by decreasing the distance between the signal surface layer wiring 4c and each GND surface layer wiring 4h in the surface layer of the package substrate 4.

As a result, degradation of high-speed signal characteristics can be suppressed and an improvement in the electric characteristics of the high-frequency package 1 can be realized without an increase in cost.

A high-frequency package 1 showing a modification illustrated in FIG. 11 will next be described.

The high-frequency package 1 shown in FIG. 11 makes use of a thin-type coaxial connector 24 of a plate-shaped member as a junction member between a coaxial cable 7 and a microstrip line 4g of a package substrate 4.

The thin-type coaxial connector 24 has a microstrip line 24c made up of a signal surface layer wiring (surface layer wiring) 24a and GND lines (ground wirings) 24b formed on both sides thereof with insulating portions interposed therebetween. Thus, in the high-frequency package 1, the signal surface layer wiring 24a of the microstrip line 4g of the package substrate 4, and a core line 7a of the coaxial cable 7 are electrically connected to each other through the signal surface layer wiring 24a of the microstrip line 24c of the thin-type coaxial connector 24.

Namely, the signal surface layer wiring 24a is provided on the surface of an upper stage of a thin ceramic plate or the like with a step 24d, and the GND lines 24b are provided on both sides thereof. Further, only the GND lines 24b are provided at a lower stage of the ceramic plate. The GND lines 24b provided at the upper and lower stages are connected to each other by means of surface or internal layer vias or the like.

The coaxial cable 7 is then mounted on the lower stage, the core line 7a at a leading end thereof is placed on the signal surface layer wiring 24a at the upper stage, and a shield 7b of the coaxial cable 7 and the GND lines 24b at the upper and lower stages of the ceramic plate are connected to one another by solder or the like. Further, the core line 7a of the coaxial cable 7 and the signal surface layer wiring 24a at the upper stage are similarly connected to each other by solder or the like.

Thereafter, the surface layer wirings of the ceramic plate are made opposite to their corresponding surface layer wirings of the package substrate 4, and their mutual wirings are connected to one another by solder or a conductive resin or the like. Alternatively, they may be connected by gold (Au)-to-gold (Au) crimping, or the ceramic plate and the package substrate 4 may be adhered and fixed to each other.

Using the thin-type coaxial connector 24 corresponding to the plate-like member as the junction member in this way enables a reduction in the thickness of the high-frequency package 1.

Further, the coaxial cable 7 is easy to handle and connector repair is enabled. The thin-type coaxial connector 24 may be attached to both ends of the coaxial cable 7. One end thereof may be formed as the thin-type coaxial connector 24, whereas the other end thereof may be formed as such a coaxial connector 11 as shown in FIG. 1. A connector different in shape from the coaxial cable 7 may be attached. Alternatively, one end may be formed as the thin-type coaxial connector 24, and the other end may be exposed as a cable end.

Incidentally, only the coaxial cable 7 may be provided as an alternative to the coaxial cable 7 with the thin-type coaxial connector 24 attached thereto. Alternatively, the high-frequency package 1 may be provided as the high-frequency package 1 with such a thin-type coaxial connector 24 as shown in FIG. 11 mounted thereto.

A high-frequency package 1 illustrative of a modification shown in FIG. 12 will next be described.

Of a plurality of ball electrodes 3 used as external connecting terminals, support balls 3a are first provided at the outermost-peripheral four corners as shown in FIG. 15 in the high-frequency package 1 shown in FIG. 12.

This is done to cope with such a problem that when the high-frequency package 1 is mounted on a mounting board such as a module substrate 13 or the like, the ball electrodes 3 are crushed due to the heavy weight of a coaxial connector 11, so that electrical shorts occur between the adjacent ball electrodes 3. Since the support balls 3a are provided at the outermost-peripheral four corners, the support balls 3a at the corners are capable of supporting a package substrate 4 upon melting of the ball electrodes 3 to thereby prevent the occurrence of such electrical shorts due to the crushing of the ball electrodes 3.

Incidentally, the support balls 3a are respectively formed of, for example, high melting-point solder, a resin or ceramic or the like.

The high-frequency package 1 shown in FIG. 12 has a cap 9 corresponding to a radiating member mounted to a back surface 2b opposite to a main surface 2a of a semiconductor chip 2 with a thermal conductive adhesive 10 interposed therebetween.

Namely, since the high-frequency semiconductor chip 2 might generate high heat when driven, the radiating cap 9, or a thermal diffusion plate or radiating fins or the like are attached to the back surface 2b of the semiconductor chip 2, whereby the semiconductor chip 2 can be improved in dissipation and the high-frequency package 1 can be also enhanced in dissipation, thus making it possible to prevent degradation of electric characteristics.

The position of layout of the cap 9 with respect to the package substrate 4 will now be explained. As shown in FIGS. 12 through 14, the cap 9 is mounted onto the back surface 2b of the semiconductor chip 2 with the thermal conductive adhesive 10 or the like interposed therebetween so as to cover the semiconductor chip 2. At this time, the cap 9 may preferably be disposed even on surface layers (microstrip line 4g) such as a signal surface layer wiring 4c and GND surface layer wirings 4h or the like as shown in FIGS. 16 and 20.

Namely, the cap 9 may preferably cover the microstrip line 4g from thereabove to avoid carrying of noise on the microstrip line 4g of the surface layer due to an external electromagnetic wave.

Accordingly, the cap 9 may preferably cover the semiconductor chip 2 and the surface layer wirings to some extent to block entrance of the external electromagnetic waves. However, the cap 9 and the surface layer wirings such as the signal surface layer wiring 4c and the GND surface layer wirings 4h or the like must be insulated.

Thus, the package substrate 4 employed in the first embodiment is formed with openings (wall escape portions) 9a at leg portions 9b on a surface layer wiring of a cap 9 as shown in FIG. 17. Each of the openings takes such a cap shape as not to make contact between the leg portions 9b of the cap 9 and the surface layer wiring.

Incidentally, FIGS. 20 and 22 show in detail the relationship of position between the openings 9a at the leg portions 9b of the cap 9 and the signal surface layer wiring 4c and GND surface layer wirings 4h of the package substrate 4. Namely, the legs 9b of the cap 9 are opened as the openings 9a up to spots lying outside both sides of the GND surface layer wirings 4h so as not to contact the signal surface layer wiring 4c and the GND surface layer wirings 4h.

Further, spots other than an area for connection of the signal surface layer wiring 4c corresponding to the surface layer wiring of the package substrate 4 to the coaxial cable 7 are covered with a solder resist 4j corresponding to an insulative thin film (non-conductive thin film) formed of a resin or the like as shown in FIG. 20 (GND surface layer wirings 4h are also similar). The solder resist 4j has an insulating function and even the function of stopping the flow of solder for solder connection 31 of the coaxial cable 7.

Thus, since the openings 9a corresponding to the wall escape portions of the cap 9, and the solder resist 4j used as the insulative thin film are formed with respect to the surface layer wirings, the surface layer wirings and the cap 9 can be prevented from contacting.

Incidentally, the cap 9 is formed, even at the corners and side portions thereof, with cut-away portions 9c corresponding to such wall escape portions as not to contact the surface layer wiring as shown in FIGS. 17 and 18.

Since the cap 9 also needs a shield effect, the whole surface of a base material 9d made up of a copper alloy or the like is covered with a chrome conductive film 9e as shown in FIG. 19. Further, only its outer surface is covered with a non-conductive film 9f so as to prevent electrical shorts developed in other parts.

Such a cap 9 is mounted to the same layer as a signal surface layer wiring 4c and GND surface layer wirings 4h formed on a main surface 4a of a package substrate 4 as shown in FIGS. 21 and 22. Incidentally, the cap 9 corresponds to the same layer as a layer for underlying electrodes of solder bump electrodes 5.

At spots unformed with an opening 9a lying between leg portions 9b of the cap 9, the leg portions 9b are connected to an internal power supply (or GND layer 4f) of the package substrate 4 via a conductive material 25 and a via wiring 4i to enhance the shield effect as shown in FIG. 21. The cap 9 per se is electrically connected to internal power supply layers (or GND layer 4f and GND surface layer wirings 4h) of the package substrate 4.

Thus, the periphery of each solder bump electrode 5 for a high-frequency signal is brought to a state of being surrounded by a GND potential, so that the cap 9-based shield effect can be enhanced.

The solder bump electrode 5 for the high-frequency signal, i.e., the solder bump electrode 5 connected to the signal surface layer wiring 4c may preferably be set as the solder bump electrode 5 disposed approximately in the center of the side of a row of the outermost-peripheral solder bump electrodes 5 as shown in FIG. 22. A coaxial connector 11 connected to the present solder bump electrode 5 via the signal surface layer wiring 4c may also be preferably disposed substantially in the center of the side.

Thus, a microstrip line 4g can be set to the shortest. High-speed signal transmission can be realized which minimizes a loss in the frequency characteristic of a high frequency. It is also possible to reduce carrying of noise on the microstrip line 4g.

Next, a high-frequency package 1 illustrative of a modification shown in FIG. 23 is one having a structure wherein a cap 9 is mounted to the high-frequency package 1 using the thin-type coaxial connector 24 shown in FIG. 11. According to the high-frequency package 1 shown in FIG. 23, both thinning and dissipation of the high-frequency package 1 can be enhanced.

A high-frequency package 1 illustrative of a modification shown in FIG. 24 is one wherein a radiating block (radiating member) 26 is further mounted on the surface of a cap 9 attached to a back surface 2b of a semiconductor chip 2 with a thermal conductive adhesive 10 interposed therebetween. The high-frequency package 1 can be further enhanced in dissipation.

Figure 25:
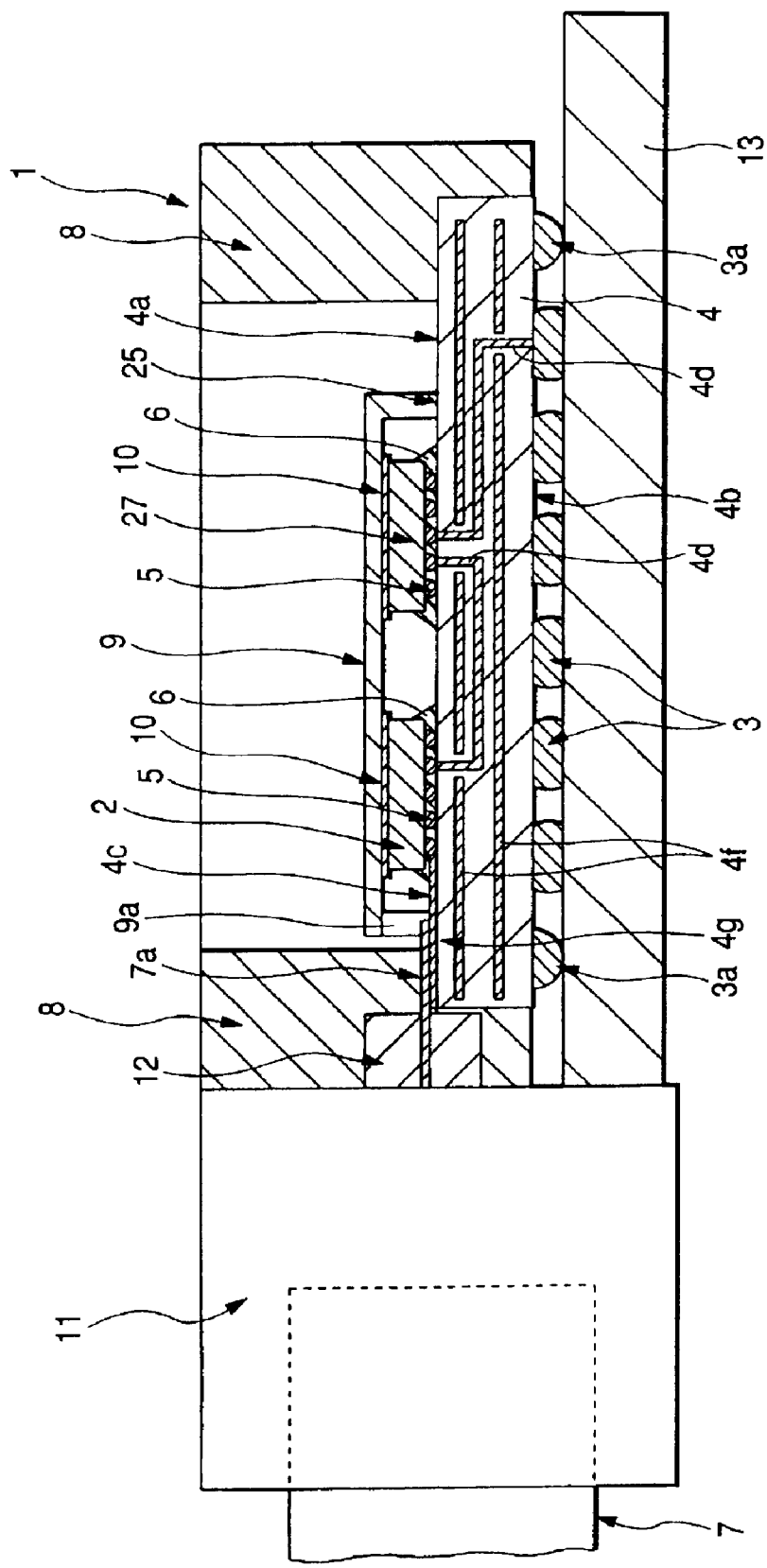
FIG. 25 is a cross-sectional view depicting a structure of a semiconductor device (high-frequency package) illustrative of a still further modification of the first embodiment of the present invention.

A high-frequency package 1 illustrative of a modification shown in FIG. 25 is one showing a structure wherein a second semiconductor chip 27 is further mounted on a package substrate 4 in addition to a semiconductor chip 2. A cap 9 for covering both chips is mounted thereon.

In the present example, a signal is inputted via an internal signal wiring 4d of the package substrate 4 from the semiconductor chip 2 connected to a coaxial cable 7 through a microstrip line 4g in a surface layer to the second semiconductor chip 27. Further, the signal is transmitted from a solder bump electrode 5 of the second semiconductor chip 27 to its corresponding ball electrode 3 used as an external connecting terminal via an internal signal wiring 4d.

Both high-frequency packages 1 illustrative of modifications shown in FIGS. 26 and 27 are ones wherein balancers 28 are attached to frame members 8, respectively. The balancer 28 has the function of adjusting the center of gravity of the high-frequency package 1 so that the high-frequency package 1 is not inclined upon mounting of the high-frequency package 1 on a substrate.

FIG. 26 shows the modification wherein the balancer 28 is fixed to the frame member 8 through a screw member 29. FIG. 27 shows the modification having a structure wherein a groove is defined in the balancer 28 and fit onto the frame member 8 to mount the balancer 28 on the frame member 8.

Thus, in the high-frequency packages 1 shown in FIGS. 26 and 27, the center of gravity of each high-frequency package is adjusted by the balancer 28 so that the high-frequency package 1 is not inclined upon its mounting onto the substrate.

The positions of placement of the package substrate 4 and the semiconductor chip 2 will next be described.

In the high-frequency package 1, the semiconductor chip 2 may preferably be disposed on the package substrate, preferably, in an area close to the coaxial cable 7.

Namely, when the high-frequency signal is transmitted from the coaxial cable 7 to the semiconductor chip 2 through the microstrip line 4g in the surface layer of the package substrate 4, noise is carried on the microstrip line 4g when the microstrip line 4g is long, so that high-frequency characteristics are degraded. Therefore, the semiconductor chip 2 may preferably be disposed so as to lean toward the coaxial cable 7 as viewed from the central portion of the package substrate 4 in order to prevent it. The semiconductor chip 2 is disposed as close to the coaxial cable 7 as possible.

Thus, the length of the microstrip line 4g can be shortened and hence the degradation in the high-frequency characteristics due to the carrying-on of noise can be suppressed.

The high-frequency package 1 shown in FIG. 13 is one wherein one semiconductor chip 2 is mounted on a package substrate 4. The semiconductor chip 2 is disposed toward a coaxial connector 11 as viewed from a central portion of the package substrate 4. By fitting a coaxial cable 7 in the coaxial connector 11, the semiconductor chip 2 is disposed toward the coaxial cable 7 from the central portion.

FIGS. 28 and 29 respectively show a case in which a high-frequency semiconductor chip 2 and a low-frequency second semiconductor chip 27 are mounted on a package substrate 4. The high-frequency semiconductor chip 2 is disposed toward a coaxial connector 11 as viewed from a central portion of the package substrate 4 and placed toward the coaxial connector 11 as viewed from the low-frequency second semiconductor chip 27. Further, the two coaxial connectors 11 are attached to one semiconductor chip 2 in association with each other.

Figure 30:
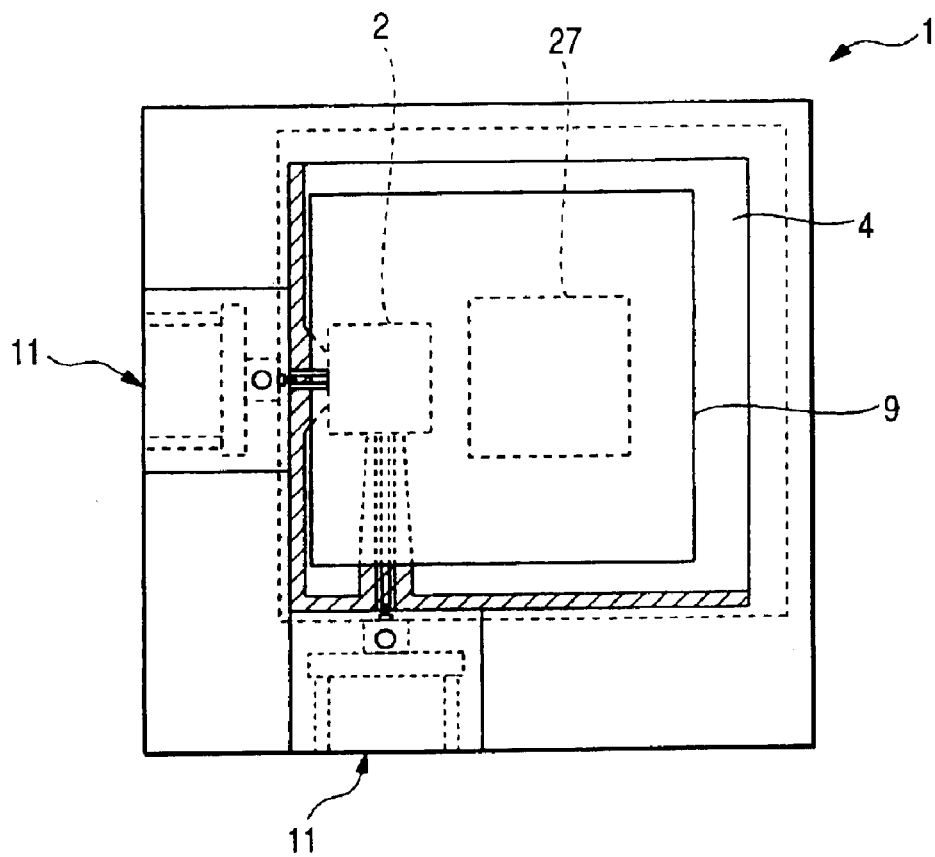
FIG. 30 is a plan view showing a structure of a semiconductor device (high-frequency package) illustrative of a still further modification of the first embodiment of the present invention.

FIG. 30 is a modification of the structure of FIG. 28, wherein a combination of layouts of two coaxial connectors 11 is changed.

FIGS. 31 and 32 respectively show cases in which one semiconductor chips 2 are mounted on package substrates 4. FIG. 31 shows the case in which two coaxial connectors 11 are provided at the same side. The semiconductor chip 2 is disposed toward the coaxial connectors 11 as viewed from a central portion of the package substrate 4.

Even in the case of FIG. 32, the semiconductor chip 2 is disposed toward coaxial connectors 11 as viewed from a central portion of the package substrate 4. However, the semiconductor chip 2 is disposed symmetrically face to face with two sides to which the two coaxial connectors 11 are opposed.

In a high-frequency package 1 shown in FIGS. 33 and 34, one semiconductor chip 2 is disposed toward a coaxial connector 11 as viewed from a central portion, and the coaxial connector 11 is provided at the side closest to the semiconductor chip 2 in association with the semiconductor chip 2. Further, a plurality of chip condensers 30 are mounted on the periphery of the semiconductor chip 2 on a main surface 4a of a package substrate 4a.

Namely, since the semiconductor chip 2 is disposed toward the coaxial connector 11 as viewed from the central portion, the plurality of chip condensers 30 or the like can be mounted in vacant spaces on the opposite sides beside the semiconductor chip 2.

On the other hand, a high-frequency package 1 shown in FIGS. 35 and 36 takes a configuration wherein one semiconductor chip 2 is disposed toward a coaxial connector 11 from a central portion, and a plurality of chip condensers 30 are placed in a chip-adaptable area of a back surface 4b of a package substrate 4. In a high-frequency package 1 shown in FIGS. 37 and 38, one semiconductor chip 2 is disposed toward a coaxial connector 11 from a central portion, and a plurality of chip condensers 30 are mounted in a concave portion 41 corresponding to a cavity defined in a chip-compatible area of a back surface 4b of a package substrate 4.

Even in the case of any high-frequency packages 1 shown in FIGS. 28 through 38, their size reductions, their thinning and their cost reductions can be achieved.

(Second Embodiment)

Figure 39:
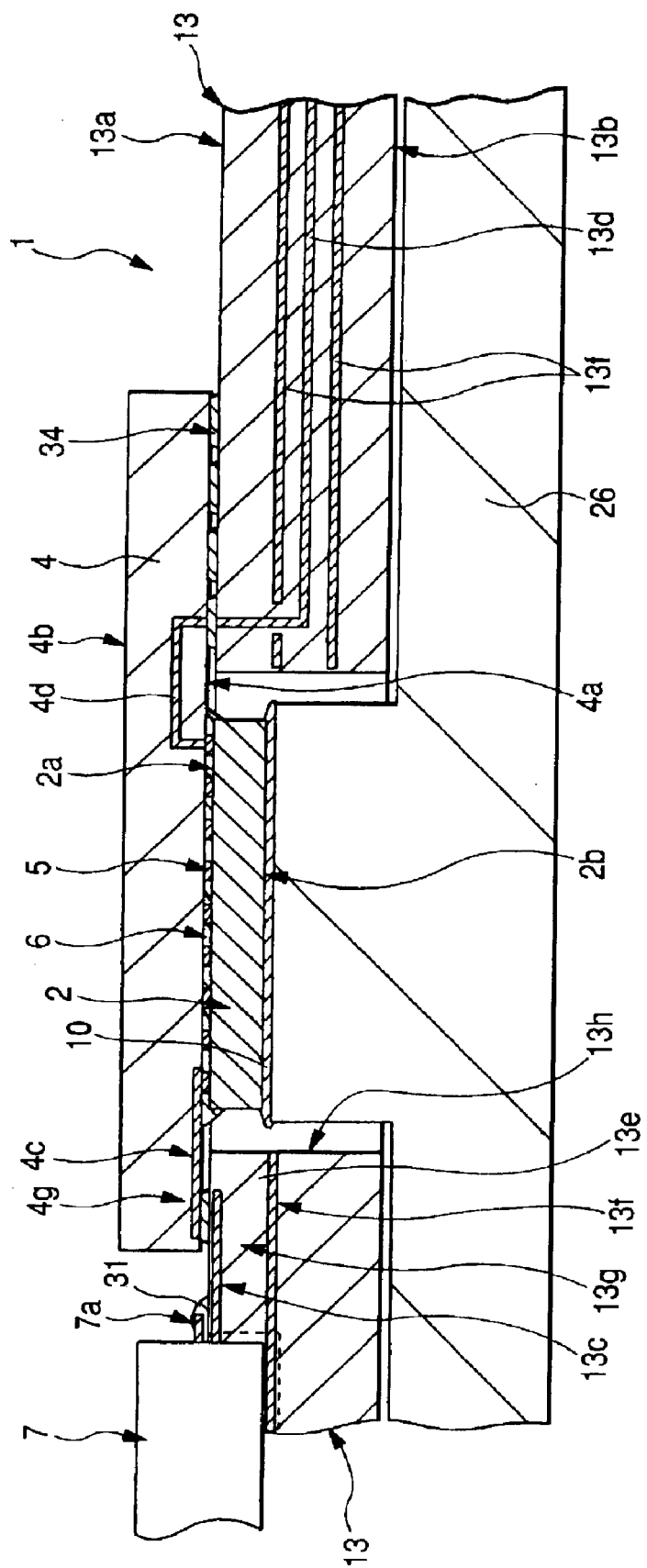
FIG. 39 is a cross-sectional view showing a structure of a semiconductor device (high-frequency package) according to a second embodiment of the present invention.
Figure 40:
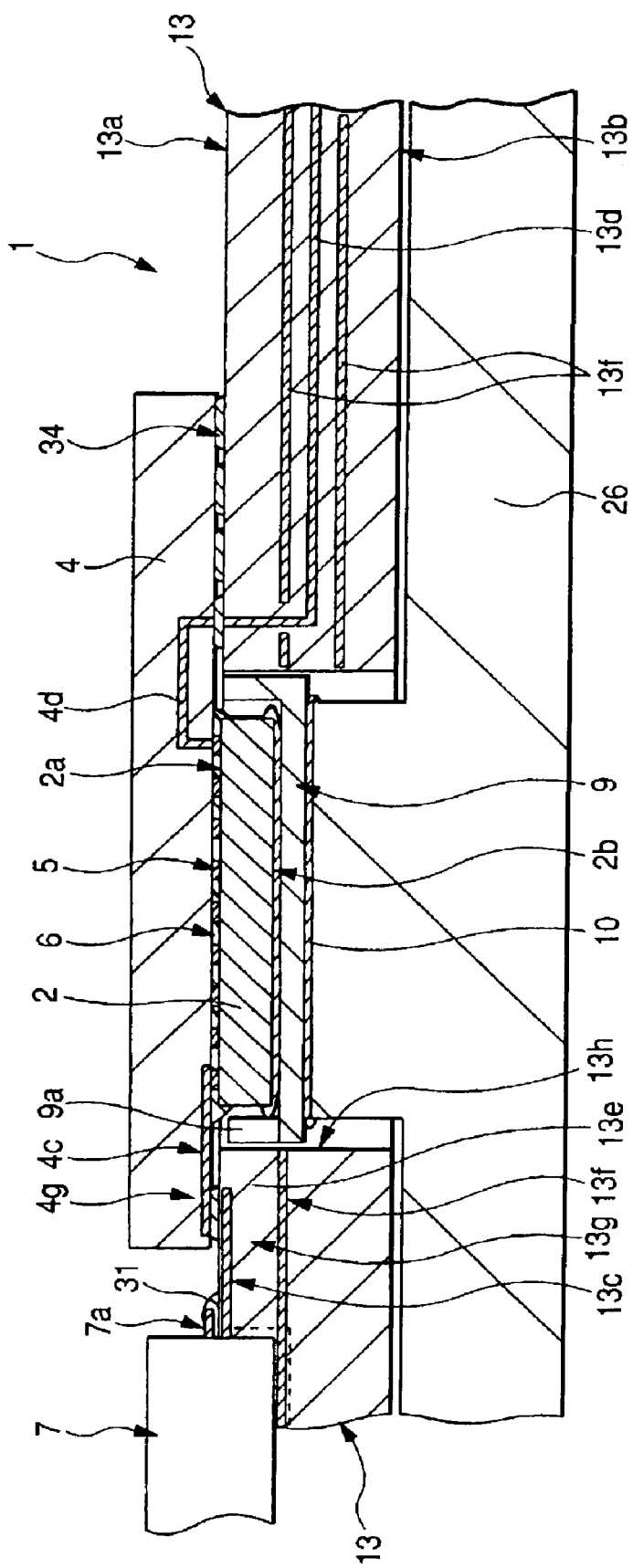
FIG. 40 is a cross-sectional view showing a structure of a semiconductor device (high-frequency package) illustrative of a modification of the second embodiment of the present invention.
Figure 41:
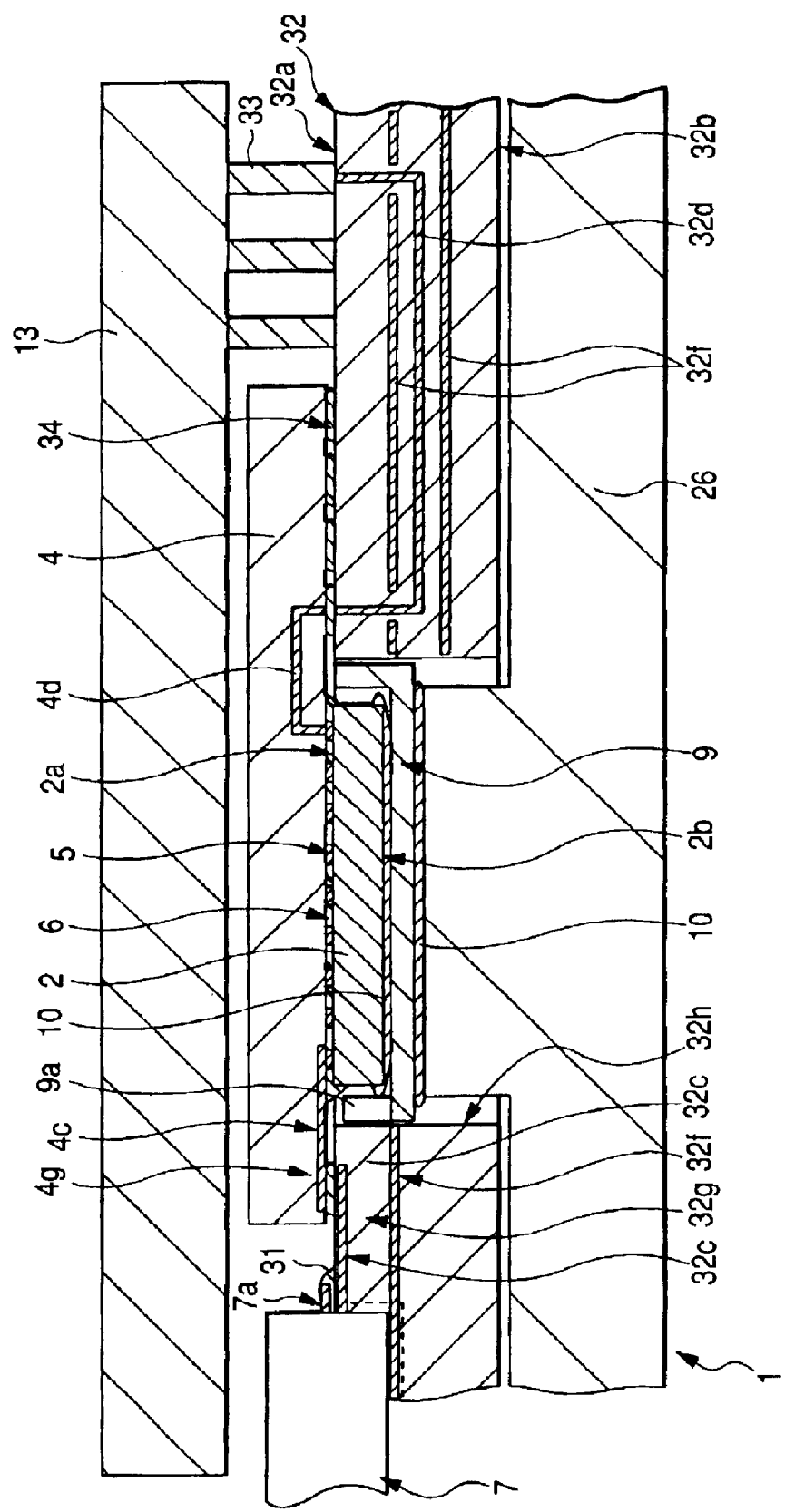
FIG. 41 is a cross-sectional view depicting a structure of a semiconductor device (high-frequency package) illustrative of another modification of the second embodiment of the present invention.
Figure 42:
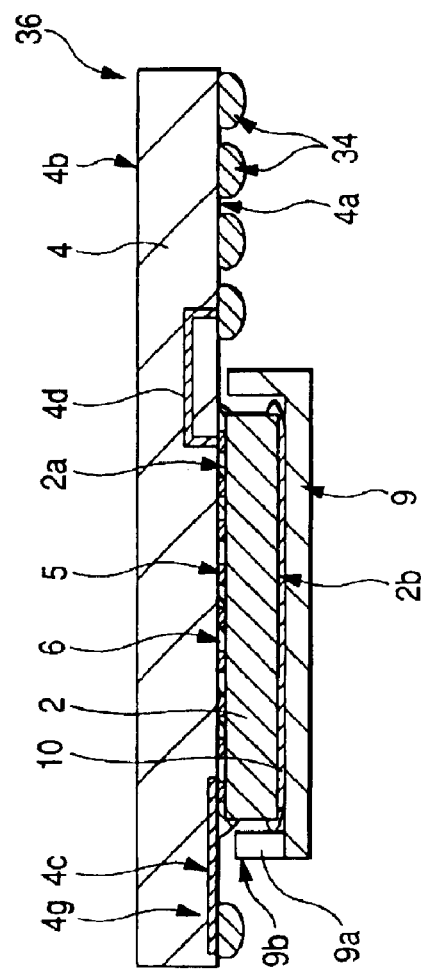
FIG. 42 is a cross-sectional view showing one example of a state in which a cap is mounted upon assembly of the high-frequency package shown in FIG. 41.
Figure 43:
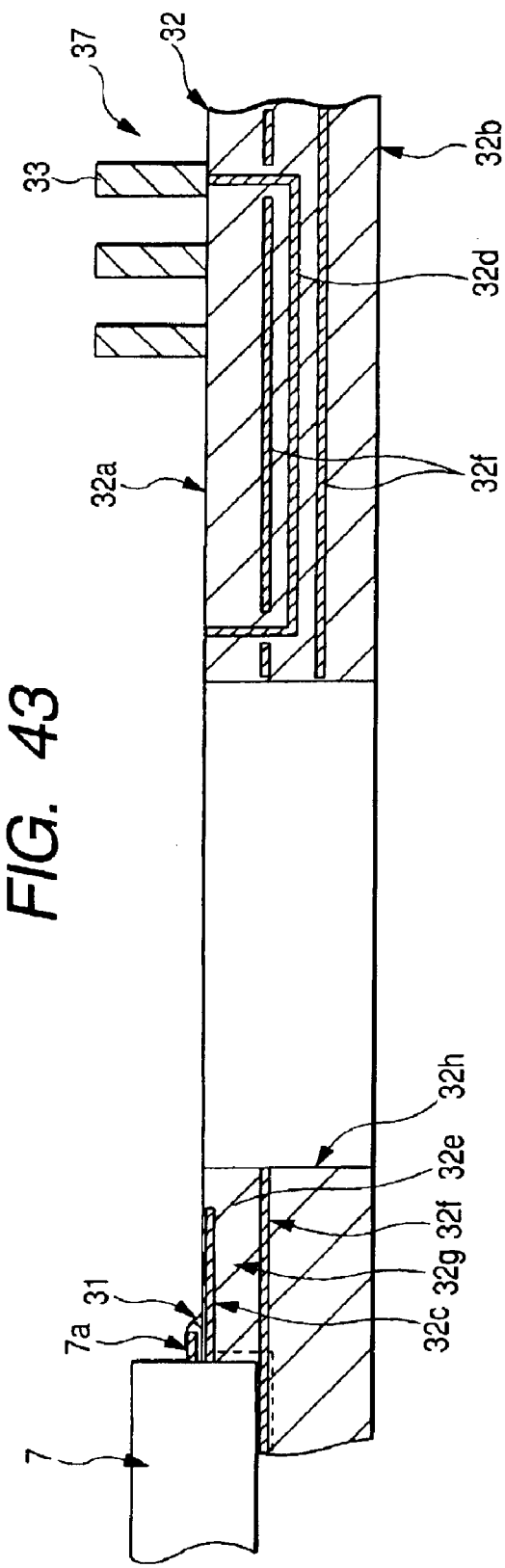
FIG. 43 is a partly cross-sectional view depicting one example of a state in which an auxiliary substrate and a coaxial cable are connected to each other upon assembly of the high-frequency package shown in FIG. 41.
Figure 44:
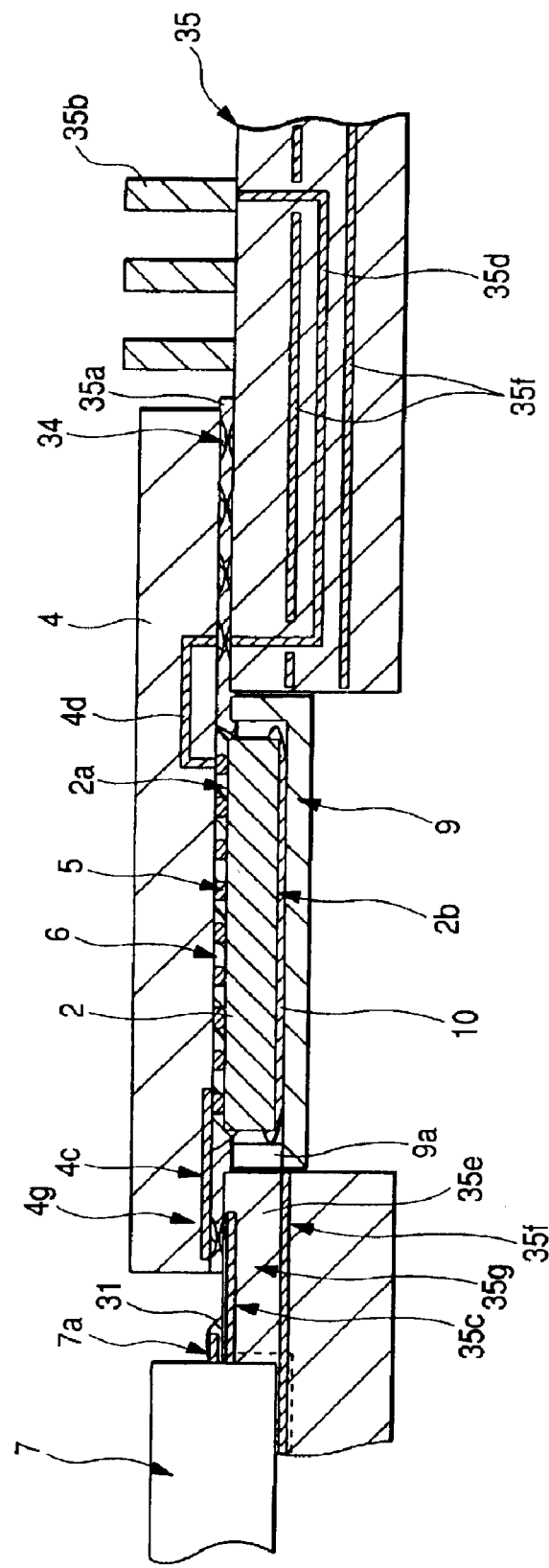
FIG. 44 is a partly cross-sectional view showing one example of a testing state at the assembly of the high-frequency package shown in FIG. 41.
Figure 45:
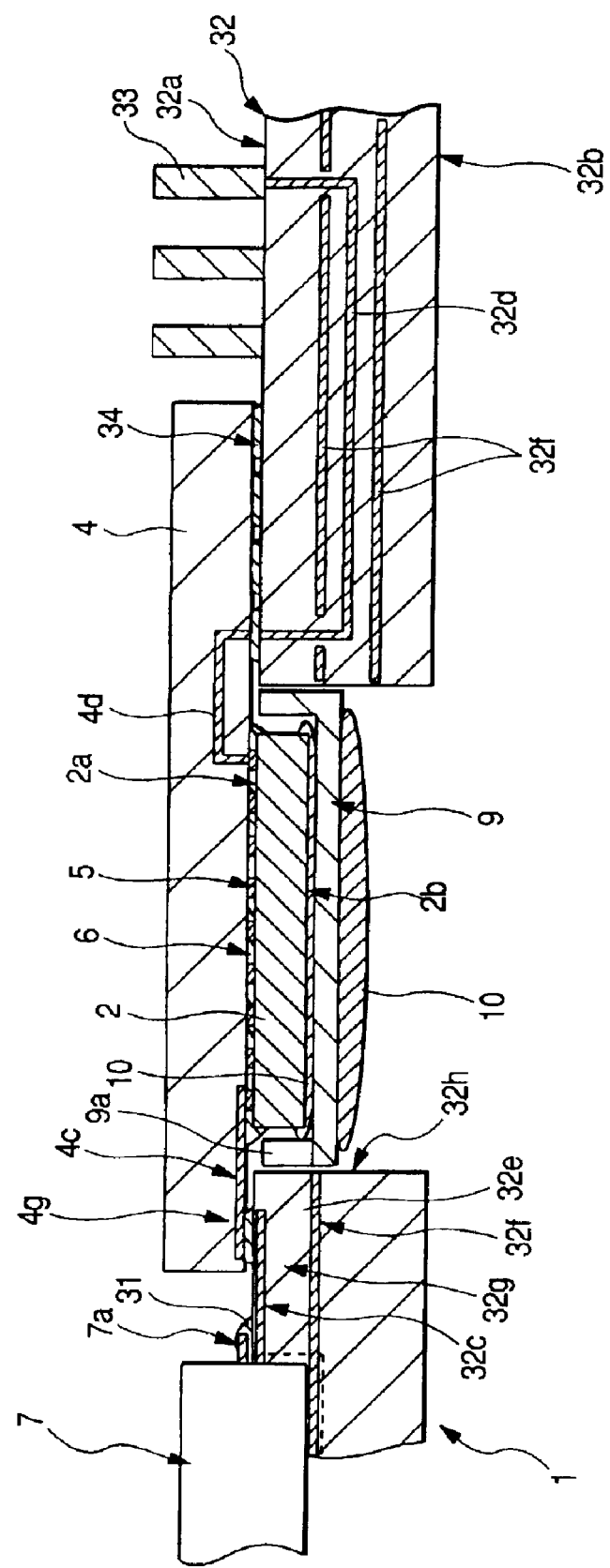
FIG. 45 is a partly cross-sectional view depicting one example of a structure subsequent to the completion of assembly of the high-frequency package shown in FIG. 41.

FIG. 39 is a cross-sectional view showing a structure of a semiconductor device (high-frequency package) according to a second embodiment of the present invention, FIGS. 40 and 41 are respectively cross-sectional views showing structures of high-frequency packages illustrative of modifications of the second embodiment of the present invention, FIG. 42 is a cross-sectional view showing one example of a state in which a cap is mounted upon assembly of the high-frequency package shown in FIG. 41, FIG. 43 is a partly cross-sectional view depicting one example of a state in which an auxiliary substrate and a coaxial cable are connected to each other upon assembly of the high-frequency package shown in FIG. 41, FIG. 44 is a partly cross-sectional view showing one example of a testing state at the assembly of the high-frequency package shown in FIG. 41, and FIG. 45 is a partly cross-sectional view depicting one example of a structure subsequent to the completion of assembly of the high-frequency package shown in FIG. 41, respectively.

While the semiconductor device shown in FIG. 39 according to the second embodiment is a high-frequency semiconductor package for optical communications, having a coaxial cable 7 in a manner similar to the high-frequency package 1 according to the first embodiment, such a coaxial cable 7 as described in the first embodiment is not mounted via the coaxial connector 11 or the coaxial cable 7 is not mounted to the package substrate 4 corresponding to the chip carrier by direct connection. The present semiconductor device is one having a structure wherein the coaxial cable 7 is connected to the module substrate 13 of the optical module 14 (semiconductor module device) shown in FIG. 2, and the module substrate 13 is connected to the package substrate 4 via protruded electrodes.

Thus, the module substrate 13 is used as a junction member at the transmission of a high-frequency signal from the coaxial cable 7 to the package substrate 4. The module substrate 13 is also formed, at a surface layer of its main surface 13a, with a microstrip line 13g made up of a signal surface layer wiring (surface layer wiring) 13c and a GND layer (ground conductor layer) 13f formed inside via the signal surface layer wiring 13c and an insulating layer 13e.

Now, a signal surface layer wiring 4c of a microstrip line 4g of a package substrate 4, and a core line 7a of the coaxial cable 7 are connected to each other through the signal surface layer wiring 13c of the microstrip line 13g of the module substrate 13.

Namely, since thin-type ball electrodes 34 used as external connecting terminals are formed on a main surface 4a on the flip-chip connection side, of the package substrate 4, the main surface 4a of the package substrate 4 and its corresponding main surface 13a of the module substrate 13 are disposed in an opposing relationship. Consequently, the signal surface layer wiring 4c of the package substrate 4, and the signal surface layer wiring 13c of the module substrate 13 can be connected to each other via the thin-type ball electrodes 34 made up of solder or the like. Thus, the microstrip line 4g of the package substrate 4 and the microstrip line 13g of the module substrate 13 are connected to each other via the thin-type ball electrodes 34.

Accordingly, the high-frequency package 1 according to the second embodiment is also capable of directly introducing a signal of a high frequency (e.g., 40 Gbps) sent from the coaxial cable 7 into the corresponding semiconductor chip 2 via the signal surface layer wiring 13c of the module substrate 13 and the thin-type ball electrodes 34. The high-frequency signal can be transmitted by only the microstrip line at the whole surface layer of the package substrate 4 via the module substrate 13.

Consequently, the high-frequency signal is transmitted by only the microstrip lines at the surface layers of the module substrate 13 and the package substrate 4 without through via-based wirings or the like in a manner similar to the high-frequency package 1 according to the first embodiment, thereby making it possible to transmit the high-frequency signal without causing a loss in frequency characteristic.

Incidentally, a signal on the low frequency side passes through an internal signal wiring 4d of the package substrate 4 and then passes through an internal signal wiring 13d of the module substrate 13 via the corresponding thin-type ball electrode 34, followed by transmission to the outside.

The semiconductor chip 2 is disposed in an opening 13h of the module substrate 13 in a state of being flip-chip connected to the package substrate 4. Further, a radiating block (radiating member) 26 is attached to a back surface 2b of the semiconductor chip 2 with a thermal conductive adhesive 10 interposed therebetween. Accordingly, the radiating block 26 is disposed on the back surface 13b side of the module substrate 13.

Since the high-frequency package 1 according to the second embodiment has a structure wherein the module substrate 13 is interposed between the coaxial cable 7 and the package substrate 4 without directly connecting the coaxial cable 7 to the package substrate 4, an IC maker is capable of handling as a product, a structural body wherein the semiconductor chip 2 is flip-chip connected to the package substrate 4.

In this case, the coaxial cable 7 is connected to the module substrate 13 on the user side. Further, the user connects the package substrate 4 and the module substrate 13 via the thin-type ball electrodes 34 to thereby assemble the high-frequency package 1.

In the high-frequency package 1 using the module substrate 13 as the junction member in this way, the package substrate 4 equipped with the semiconductor chip 2 and the module substrate 13 connected with the coaxial cable 7 are assembled in a discrete form and thereafter both are connected to each other. It is therefore possible to divide their yields.

Namely, an assembled body of the semiconductor chip 2 and an assembled body of the coaxial cable 7 can share yield risks respectively, and the yields of a structural body subsequent to the connection of both assembled bodies can be enhanced.

Since the high-frequency package 1 using the module substrate 13 does not use the expensive coaxial connector 11, it can be reduced in cost and thinned.

Further, since all the external connecting terminals are provided on the main surface 4a on the flip-chip connection side, of the package substrate 4, a screening test can be easily performed upon screening of semiconductor chips 2 each used for the high frequency of 40 Gbps.

Namely, since all the external connecting terminals for the high and low frequencies are provided on one-sided surface (main surface 4a) of the package substrate 4, a probe becomes easy to contact upon the screening test. The test can be performed without using a jig having a complex shape.

As a result, a test time interval can be shortened.

Incidentally, a high-frequency package 1 illustrative of a modification shown in FIG. 40 is one wherein a cap 9 is mounted onto a back surface 2b of a semiconductor chip 2 with a thermal conductive adhesive 10 interposed therebetween. Further, a radiating block 26 is mounted on the surface of the cap 9 with a thermal conductive adhesive 10 interposed therebetween.

In this case, the cap 9 is formed with an opening (wall escape portion) 9a for isolating the cap 9 and surface layer wirings such as a signal surface layer wiring 4c, etc. from one another.

Further, since the radiating block 26 is provided on the cap 9 as well as the cap 9, the high-frequency package 1 shown in FIG. 40 is capable of further enhancing dissipation or radiation thereof and preventing degradation of high-frequency characteristics.

Next, a high-frequency package 1 illustrative of a modification shown in FIG. 41 has a configuration wherein a junction member for connecting a coaxial cable 7 and a signal surface layer wiring 4c of a package substrate 4 is of a sub or auxiliary substrate 32 corresponding to a second package substrate. The auxiliary substrate 32 is formed, at a surface layer of its main surface 32a, with a microstrip line 32g made up of a signal surface layer wiring (surface layer wiring) 32c and a GND layer (ground conductor layer) 32f formed inside via the signal surface layer wiring 32c and an insulating layer 32e.

Now, the signal surface layer wiring 4c for a microstrip line 4g of the package substrate 4, and a core line 7a of the coaxial cable 7 are connected to each other through the signal surface layer wiring 32c of the microstrip line 32g of the auxiliary substrate 32.

Namely, since thin-type ball electrodes 34 used as external connecting terminals are formed on a main surface 4a on the flip-chip connection side, of the package substrate 4, the main surface 4a of the package substrate 4 and its corresponding main surface 32a of the auxiliary substrate 32 are disposed in an opposing relationship. Consequently, the signal surface layer wiring 4c of the package substrate 4, and the signal surface layer wiring 32c of the auxiliary substrate 32 can be connected to each other via the thin-type ball electrodes 34 made up of solder or the like. Thus, the microstrip line 4g of the package substrate 4 and the microstrip line 32g of the auxiliary substrate 32 are connected to each other via the thin-type ball electrodes 34.

Accordingly, the high-frequency package 1 according to the modification shown in FIG. 41 is also capable of directly introducing a signal of a high frequency (e.g., 40 Gbps) sent from the coaxial cable 7 into the corresponding semiconductor chip 2 via the signal surface layer wiring 32c of the auxiliary substrate 32 and the thin-type ball electrodes 34. The high-frequency signal can be transmitted by only the microstrip line at the whole surface layer of the package substrate 4 via the auxiliary substrate 32.

Consequently, the high-frequency signal is transmitted by only the microstrip lines at the surface layers of the auxiliary substrate 32 and the package substrate 4 without through via-based wirings or the like in a manner similar to the high-frequency package 1 according to the first embodiment, whereby the high-frequency signal can be transmitted without causing a loss in frequency characteristic.

Incidentally, a signal on the low frequency side passes through an internal signal wiring 4d of the package substrate 4 and then passes through an internal signal wiring 32d of the auxiliary substrate 32 via the corresponding thin-type ball electrode 34. Further, the signal is transmitted to a module substrate 13 or the like via a pin member (connecting terminal) 33.

The semiconductor chip 2 is disposed in an opening 32h of the auxiliary substrate 32 in a state of being flip-chip connected to the package substrate 4. Further, a cap 9 is attached to a back surface 2b of the semiconductor chip 2 with a thermal conductive adhesive 10 interposed therebetween. Furthermore, a radiating block (radiating member) 26 is mounted on the surface of the cap 9. Accordingly, the radiating block 26 is disposed on the back surface 32b side of the auxiliary substrate 32.

The high-frequency package 1 according to the second embodiment is divided into parts on the coaxial cable 7 side and parts on the semiconductor chip 2 side and respectively sorted, and the non-defective parts are connected to one another, whereby the yield of the high-frequency package 1 can be improved.

Namely, a chip-side structural body 36 shown in FIG. 42 wherein a semiconductor chip 2 with a cap 9 mounted thereon is flip-chip connected, and a cable-side structural body 37 shown in FIG. 43 wherein a coaxial cable 7 is connected to an auxiliary substrate 32 by solder connection 31, are respectively assembled. The respective structural bodies are selected and tested separately.

Thus, since both the structural bodies include microstrip lines, a high-frequency test can be effected on their parts, and the non-defective parts are connected to one another, so that their yields can be divided. As a result, the chip-side structural body 36 and the cable-side structural body 37 can share yield risks respectively, and the yield of the high-frequency package 1 shown in FIG. 41 to which both structural bodies are connected, can be improved.

Further, the chip-side structural body 36 and the cable-side structural body 37 can be respectively put in circulation as singular parts, and they are available as parts.

Since all the external connecting terminals are provided on the main surface 4a on the flip-chip connection side, of the package substrate 4, a screening test can be easily performed upon screening of semiconductor chips 2 each used for the high frequency of 40 Gbps.

Namely, since all the external connecting terminals for the high and low frequencies are provided on one-sided surface (main surface 4a) of the package substrate 4, a probe becomes easy to contact upon the screening test. The test can be performed without using a jig having a complex shape.

As a result, a test time interval can be shortened.

Incidentally, the auxiliary substrate 32 may be used as a testing substrate 35 as shown in FIG. 44. Alternatively, it may be used as a socket upon a screening test of each package substrate 4.

At this time, the package substrate 4 and the testing substrate 35 are electrically brought into contact with each other with an interposer 35a such as an ACF (Anisotropic Conductive Film) or the like. A signal is transmitted to the outside through a corresponding pin member 35b to thereby test the package substrate 4.

Incidentally, the testing substrate 35 is formed with a signal surface layer wiring 35c, an internal signal wiring 35d, GND layers 35f disposed through the signal surface layer wiring 35c and an insulating layer 35e, and a microstrip line 35g in a manner similar to the auxiliary substrate 32.

The chip-side structural body 36 shown in FIG. 42 and the cable-side structural body 37 shown in FIG. 43 are respectively selected and tested in several. Non-defective products are obtained for them. Thereafter, the chip-side structural body 36 and the cable-side structural body 37 are connected and assembled. The resultant one is a high-frequency package 1 illustrative of a modification of the second embodiment shown in FIG. 45.

Further, one wherein a thermal conductive adhesive 10 is applied onto the surface of a cap 9, a radiating block 26 is mounted thereon with the thermal conductive adhesive 10 interposed therebetween, and the high-frequency package 1 is mounted on its corresponding module substrate 13 of an optical module 14 through pin members 35b, is a mounting structure shown in FIG. 41.

Incidentally, the cap 9 is first mounted onto its corresponding back surface 2b of the semiconductor chip 2 with the thermal conductive adhesive 10 interposed therebetween, and the radiating block 26 is mounted on the surface of the cap 9 with the thermal conductive adhesive 10 interposed therebetween in the high-frequency package 1 shown in FIG. 41. In the optical module 14, however, a module case 15 shares the role of the radiating block 26. Further, the cap 9 is formed with an opening (wall escape portion) 9a for isolating the cap 9 and the surface wirings such as the signal surface layer wiring 4c or the like from one another.

Thus, since the radiating block 26 (module case 15) is provided on the cap 9 as well as the cap 9, the high-frequency package 1 shown in FIG. 41 is also capable of further enhancing dissipation or radiation thereof and preventing degradation of high-frequency characteristics.

(Third Embodiment)

Figure 46:
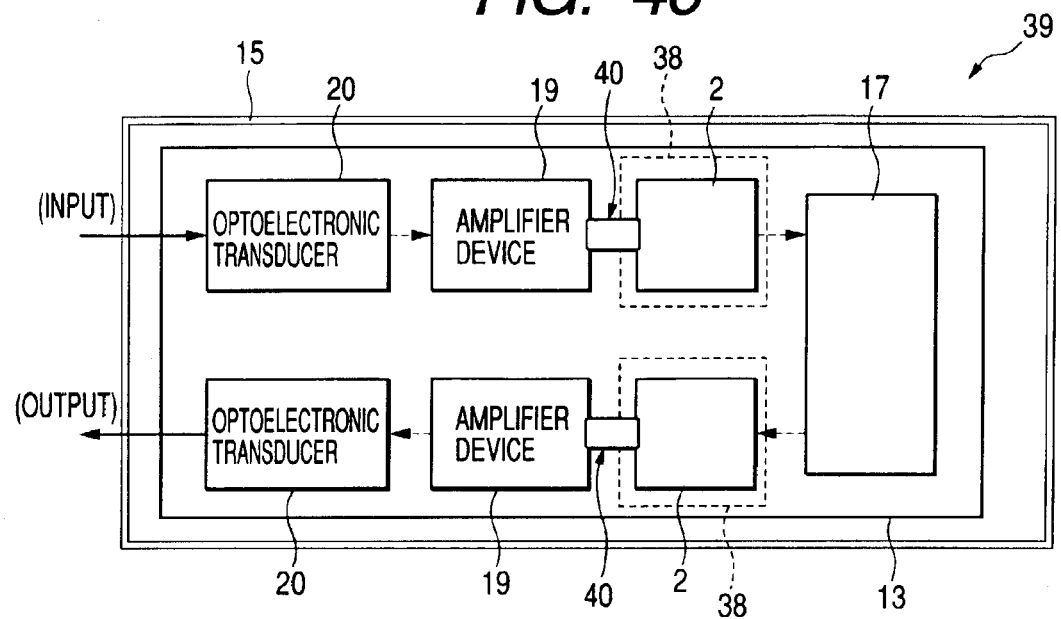
FIG. 46 is a plan view showing one example of a layout of parts built in an optical module according to a third embodiment of the present invention.
Figure 47:
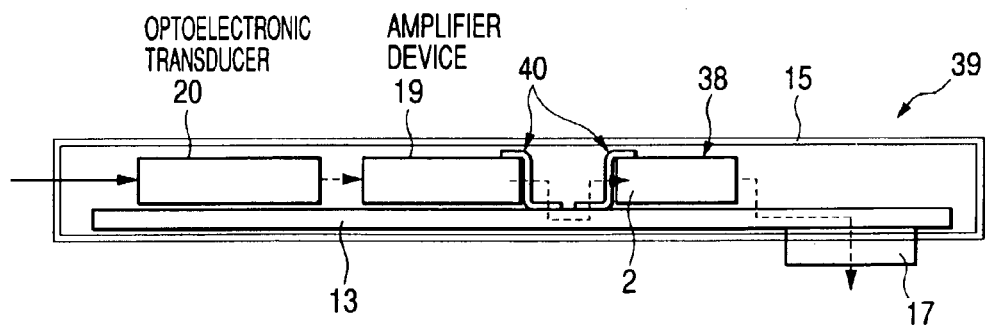
FIG. 47 is a cross-sectional view illustrating one example of the layout of the parts built in the optical module shown in FIG. 46.
Figure 48:
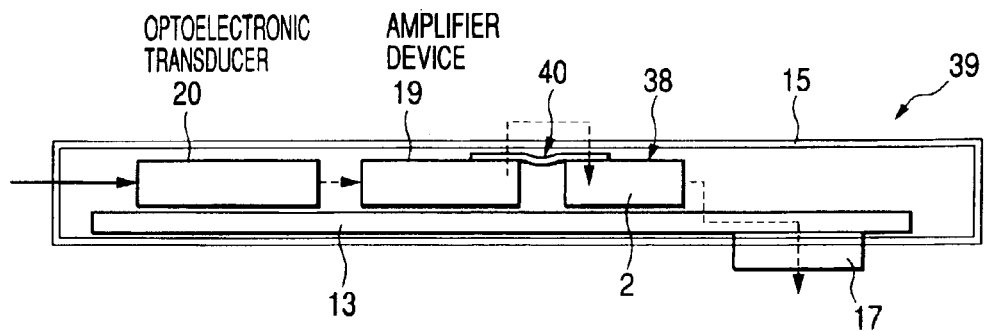
FIG. 48 is a cross-sectional view showing a modification of a connecting method of a transmission line section employed in the optical module shown in FIG. 46.
Figure 49:
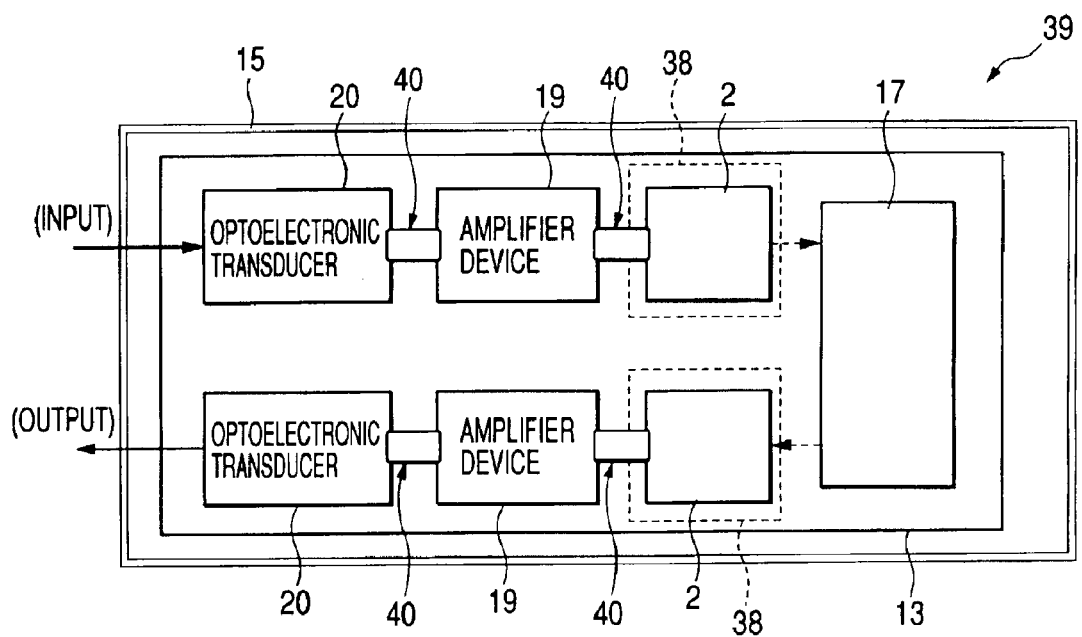
FIG. 49 is a plan view depicting a layout of parts built in an optical module illustrative of a modification of the third embodiment of the present invention.
Figure 50:
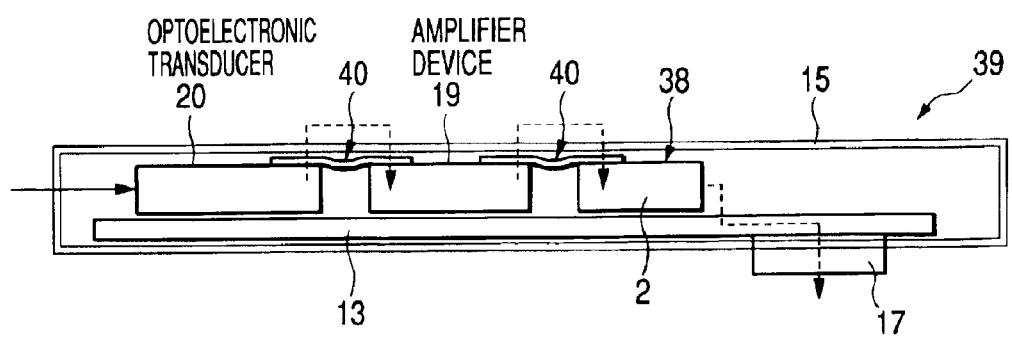
FIG. 50 is a cross-sectional view showing one example of the layout of the parts built in the optical module shown in FIG. 49.
Figure 51:
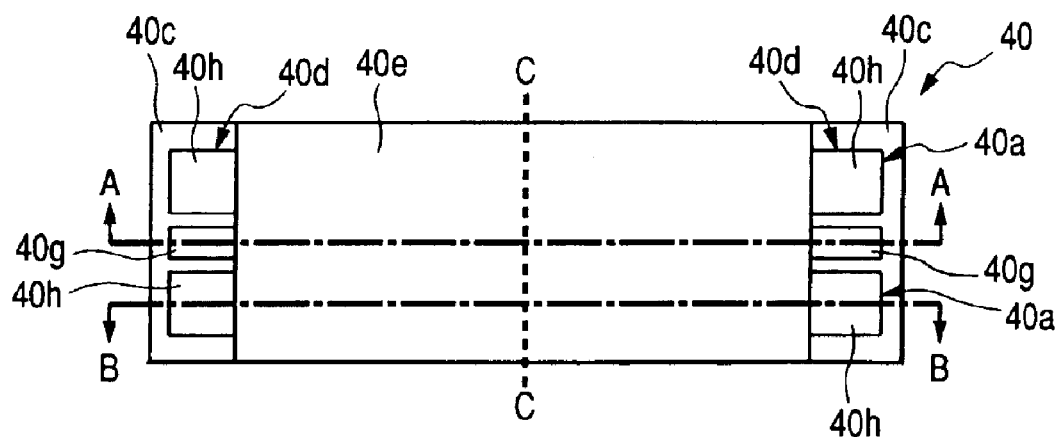
FIG. 51 is a plan view illustrating a structure of a tape-shaped transmission line section showing one example of the transmission line section employed in the third embodiment of the present invention.
Figure 52:
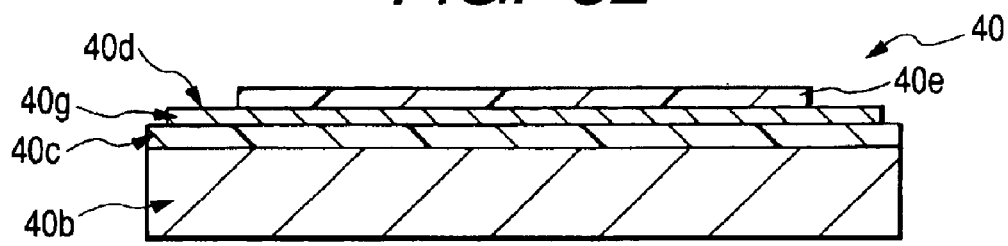
FIG. 52 is a cross-sectional view showing a structure of a cross-section cut along line A—A shown in FIG. 51.
Figure 53:
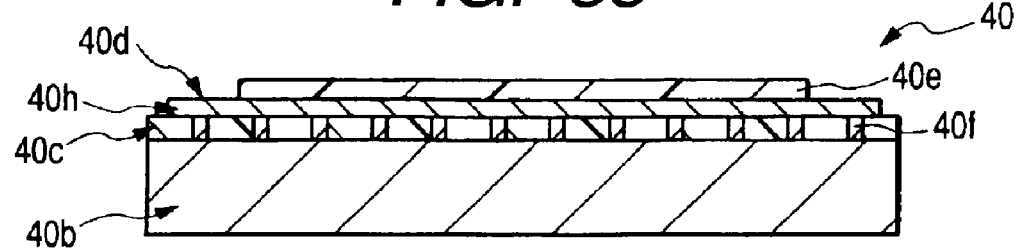
FIG. 53 is a cross-sectional view illustrating a structure of a cross-section cut along line B—B shown in FIG. 51.
Figure 54:
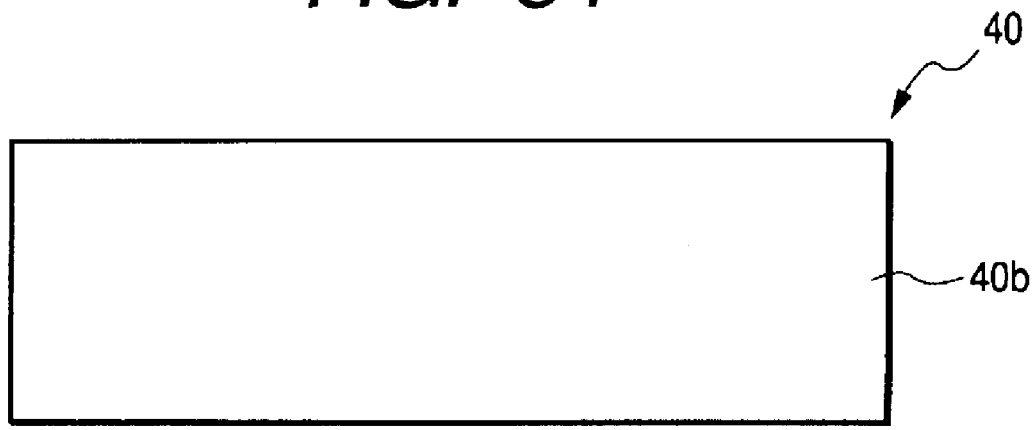
FIG. 54 is a back view showing a structure of a back surface of the tape-shaped transmission line section shown in FIG. 51.
Figure 55:
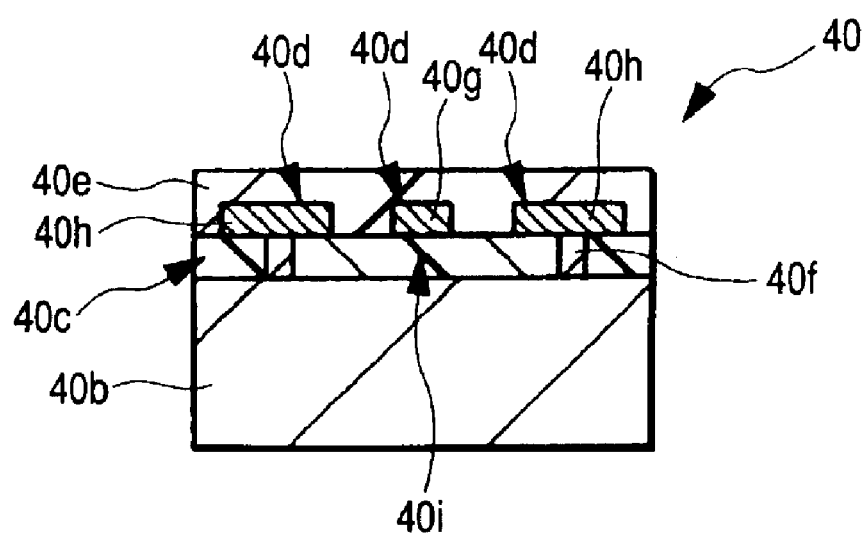
FIG. 55 is a cross-sectional view illustrating a structure of a cross-section cut along line C—C shown in FIG. 51.
Figure 56:
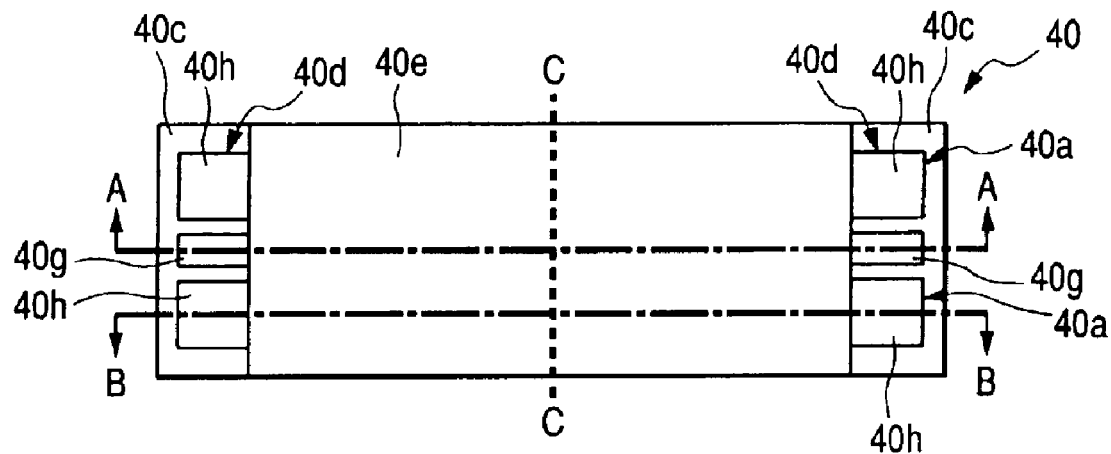
FIG. 56 is a plan view showing a structure of a tape-shaped transmission line section illustrative of a modification of the third embodiment of the present invention.
Figure 57:
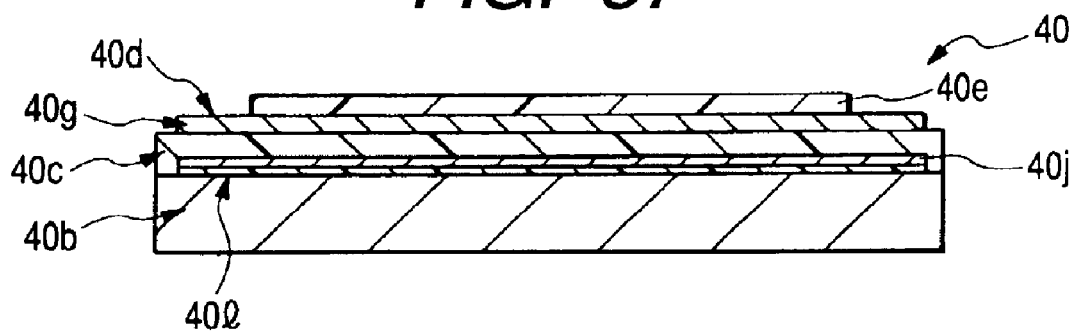
FIG. 57 is a cross-sectional view illustrating a structure of a cross-section cut along line A—A shown in FIG. 56.
Figure 58:
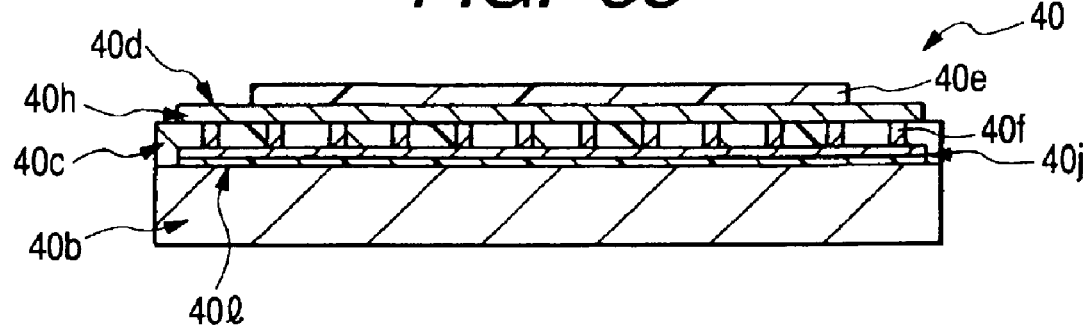
FIG. 58 is a cross-sectional view showing a structure of a cross-section cut along line B—B shown in FIG. 56.
Figure 59:
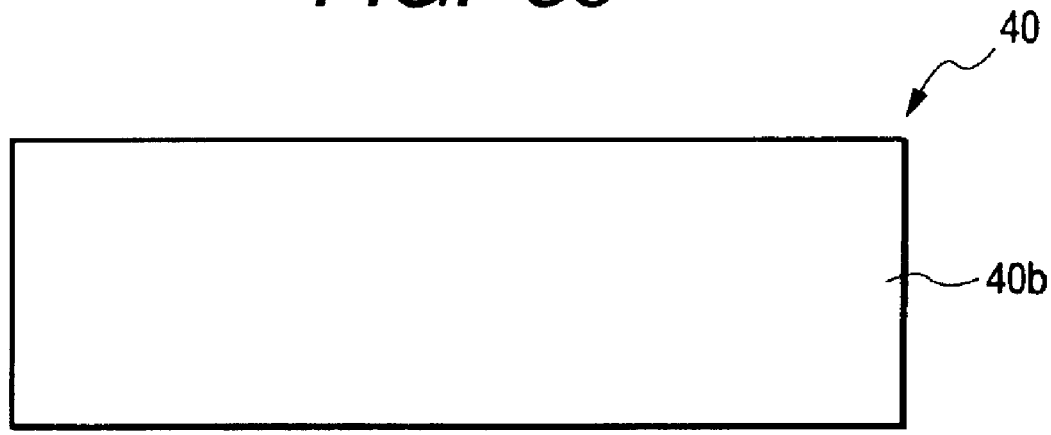
FIG. 59 is a back view depicting a structure of a back surface of the tape-shaped transmission line section shown in FIG. 56.
Figure 60:
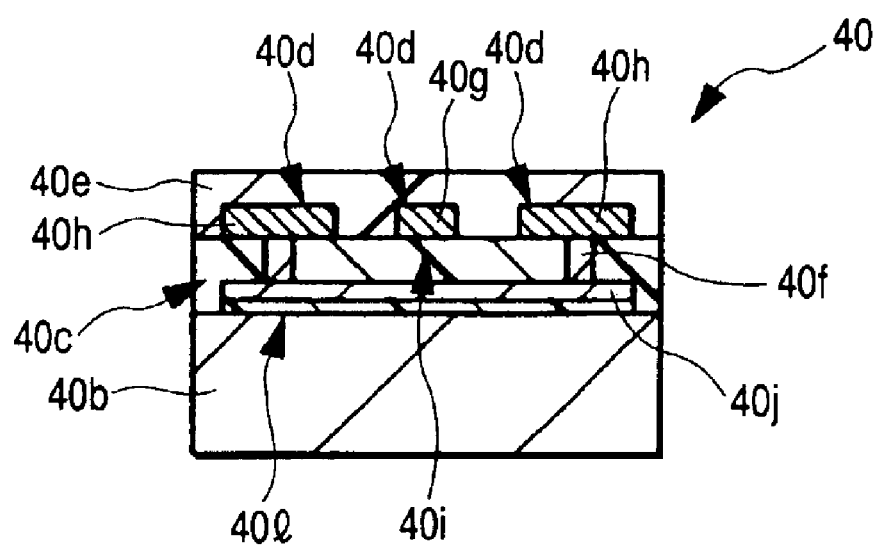
FIG. 60 is a cross-sectional view illustrating a structure of a cross-section cut along line C—C shown in FIG. 56.
Figure 61:
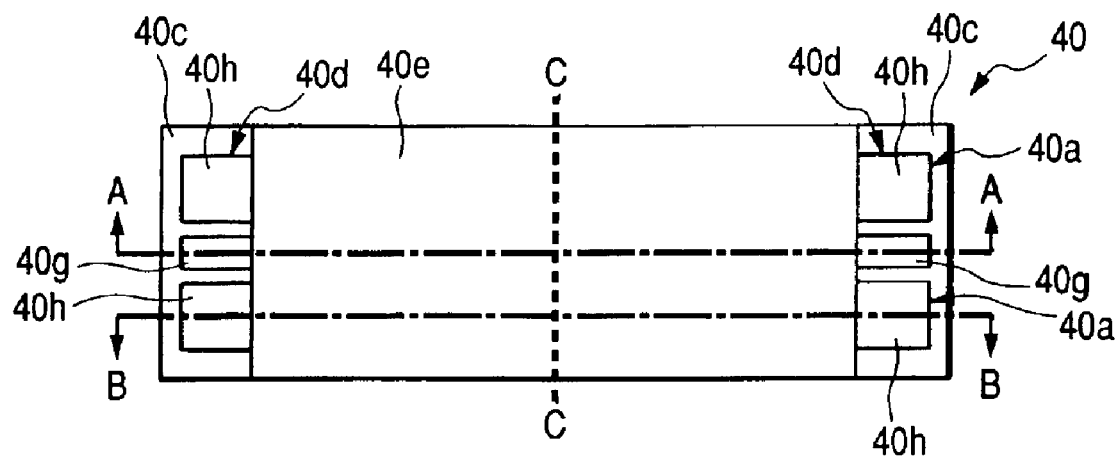
FIG. 61 is a plan view showing a structure of a tape-shaped transmission line section illustrative of another modification of the third embodiment of the present invention.
Figure 62:
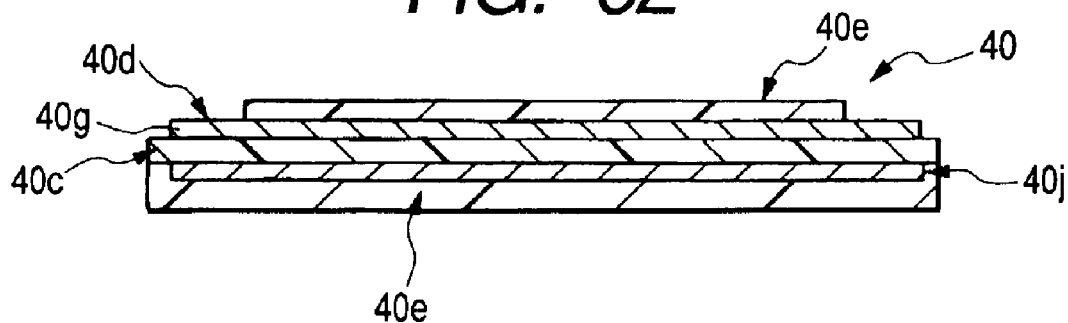
FIG. 62 is a cross-sectional view depicting a structure of a cross-section cut along line A—A shown in FIG. 61.
Figure 63:
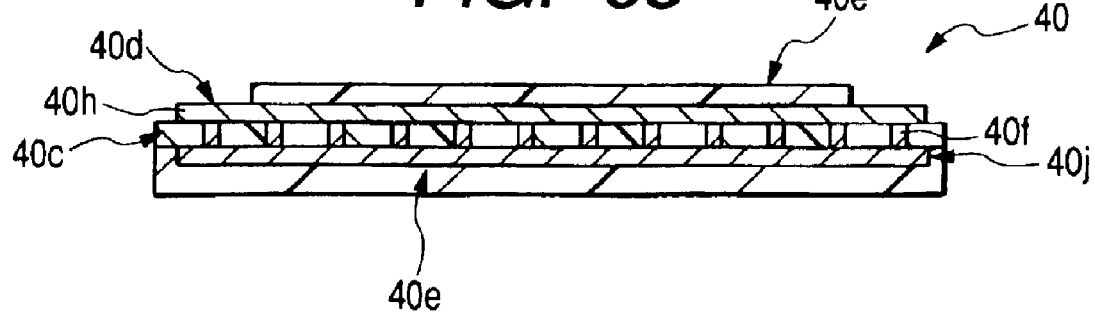
FIG. 63 is a cross-sectional view showing a structure of a cross-section cut along line B—B shown in FIG. 61.
Figure 64:
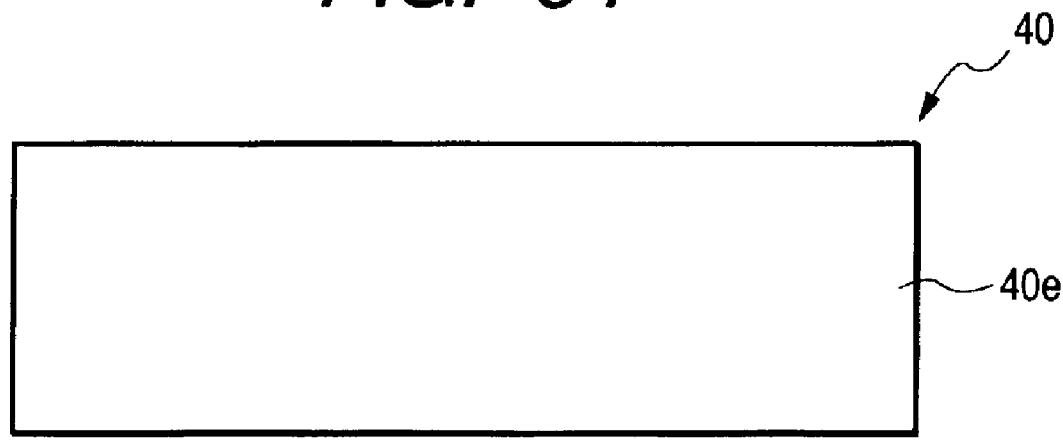
FIG. 64 is a back view showing a structure of a back surface of the tape-shaped transmission line section shown in FIG. 61.
Figure 65:
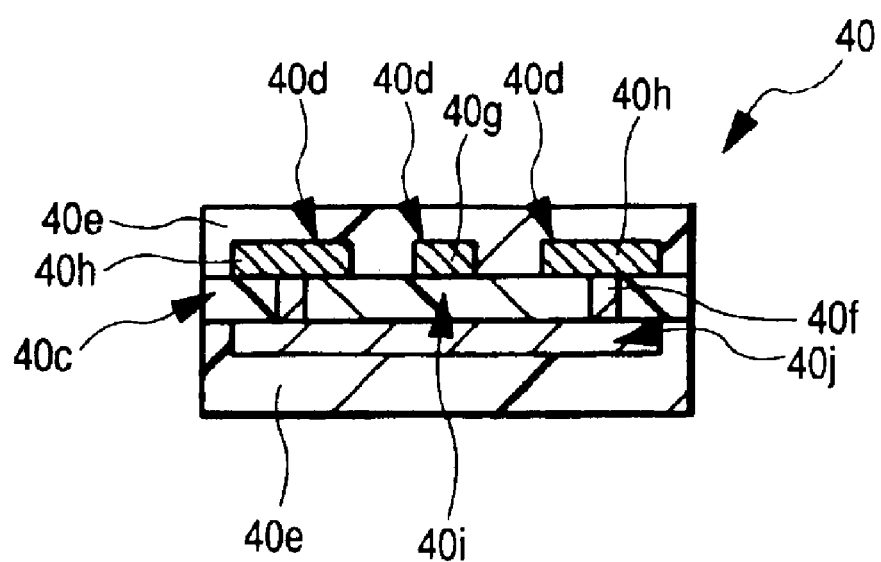
FIG. 65 is a cross-sectional view illustrating a structure of a cross-section cut along line C—C shown in FIG. 61.
Figure 66:
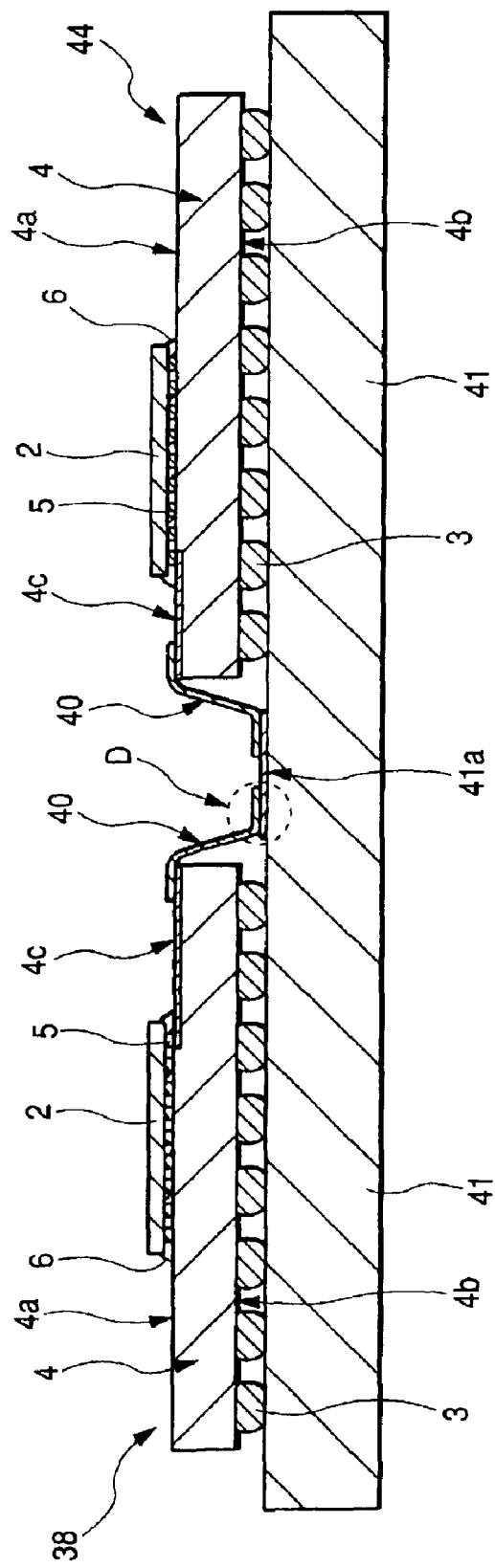
FIG. 66 is a cross-sectional view showing one example of a mounting structure of a high-frequency package provided with the tape-shaped transmission line section according to the third embodiment of the present invention.
Figure 67:
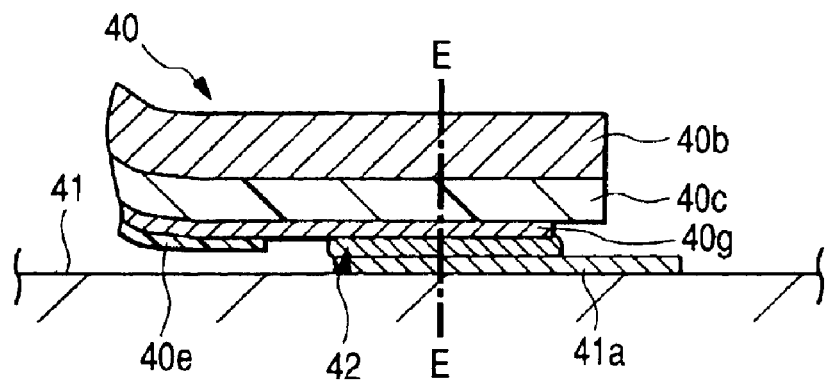
FIG. 67 is an enlarged partly cross-sectional view showing, in a developed form, a structure of a portion D shown in FIG. 66.
Figure 68:
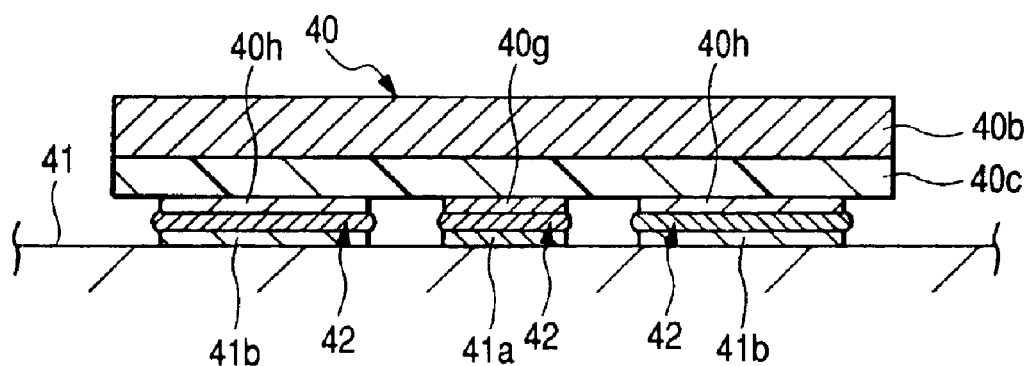
FIG. 68 is a cross-sectional view illustrating a structure of a cross-section cut along line E—E shown in FIG. 67.
Figure 69:
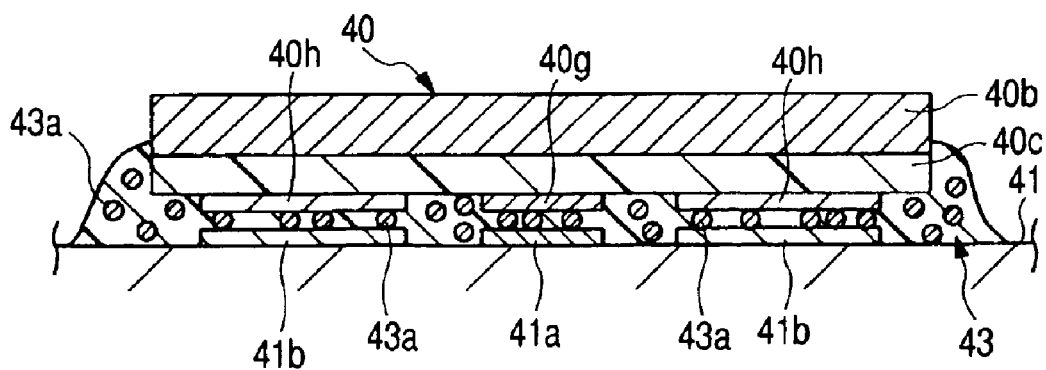
FIG. 69 is a cross-sectional view showing a modification of the structure shown in FIG. 68.
Figure 70:
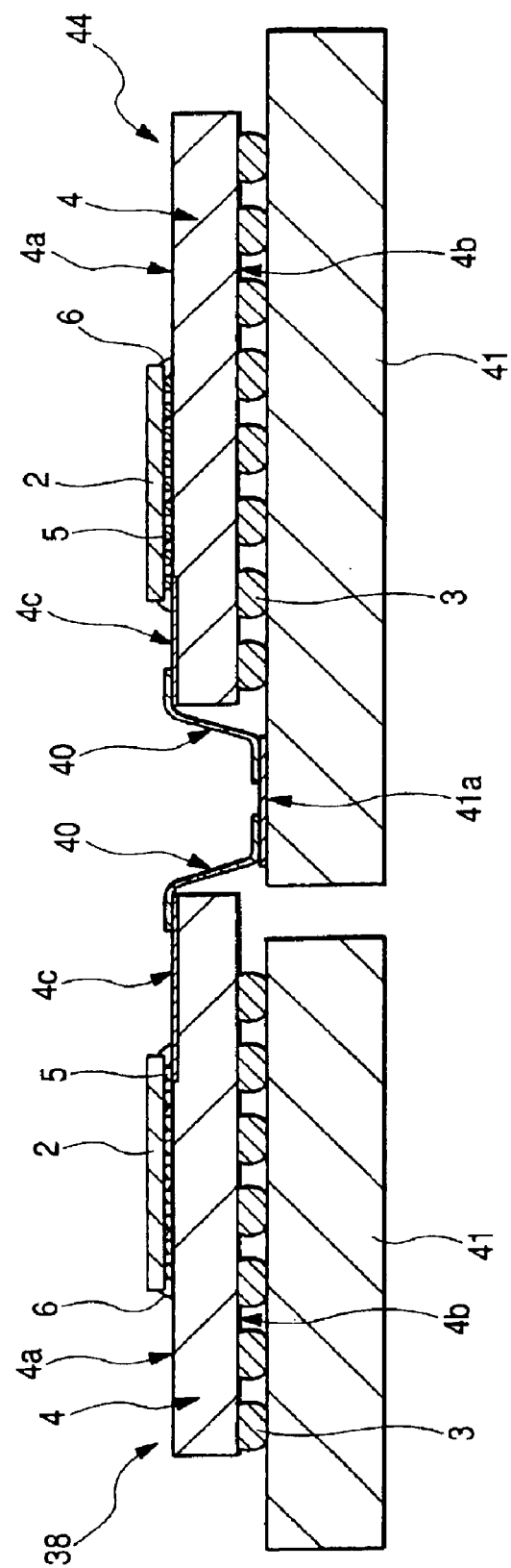
FIG. 70 is a cross-sectional view illustrating a modification of the structure shown in FIG. 66.
Figure 71:
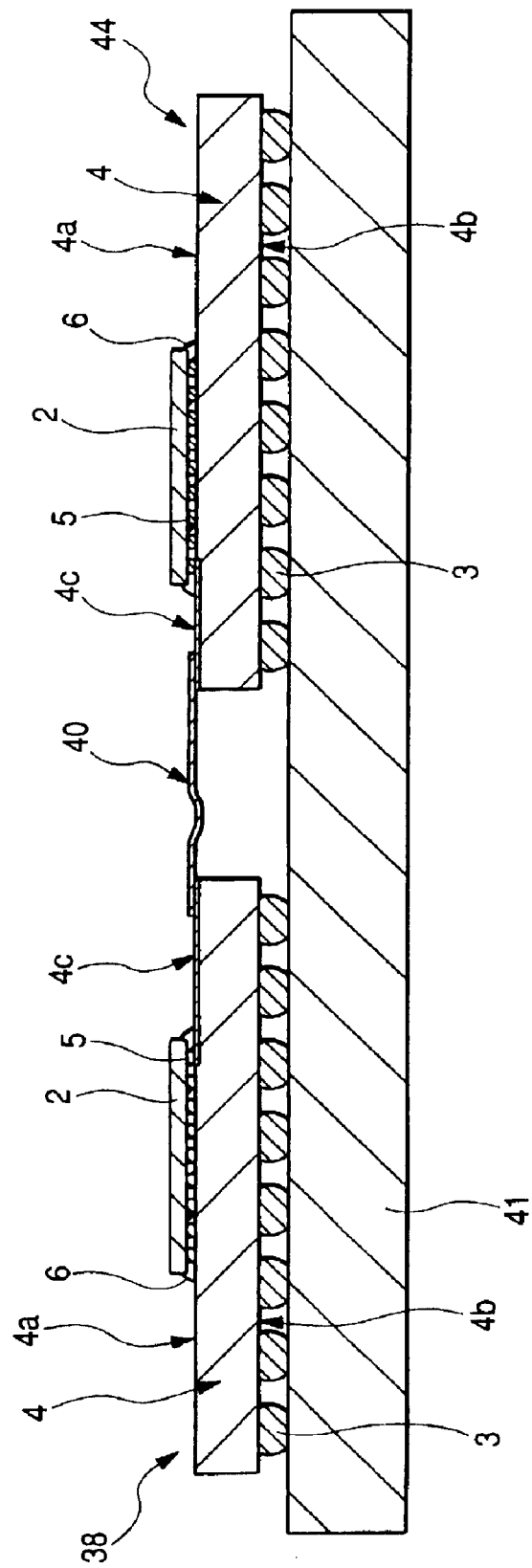
FIG. 71 is a cross-sectional view showing another modification of the structure shown in FIG. 66.
Figure 72:
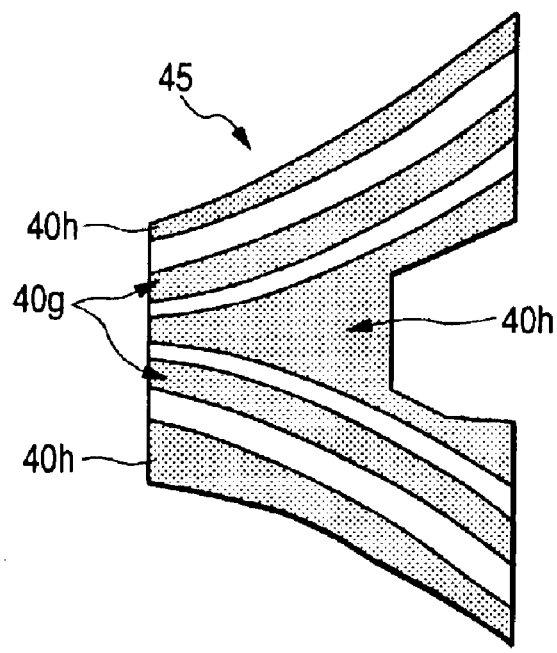
FIG. 72 is a plan view showing a structure of a tape-shaped transmission line section illustrative of a further modification of the third embodiment of the present invention.
Figure 73:
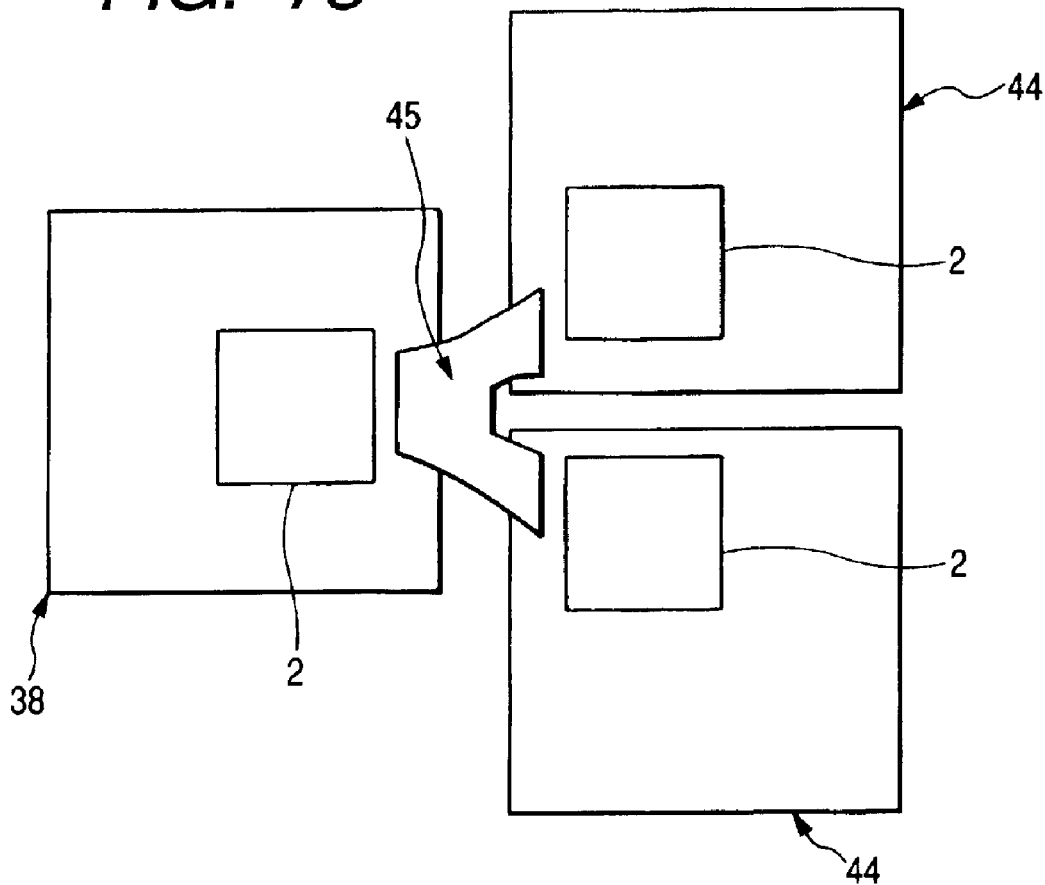
FIG. 73 is a plan view showing a connected state of the tape-shaped transmission line section illustrative of the modification shown in FIG. 72.
Figure 74:
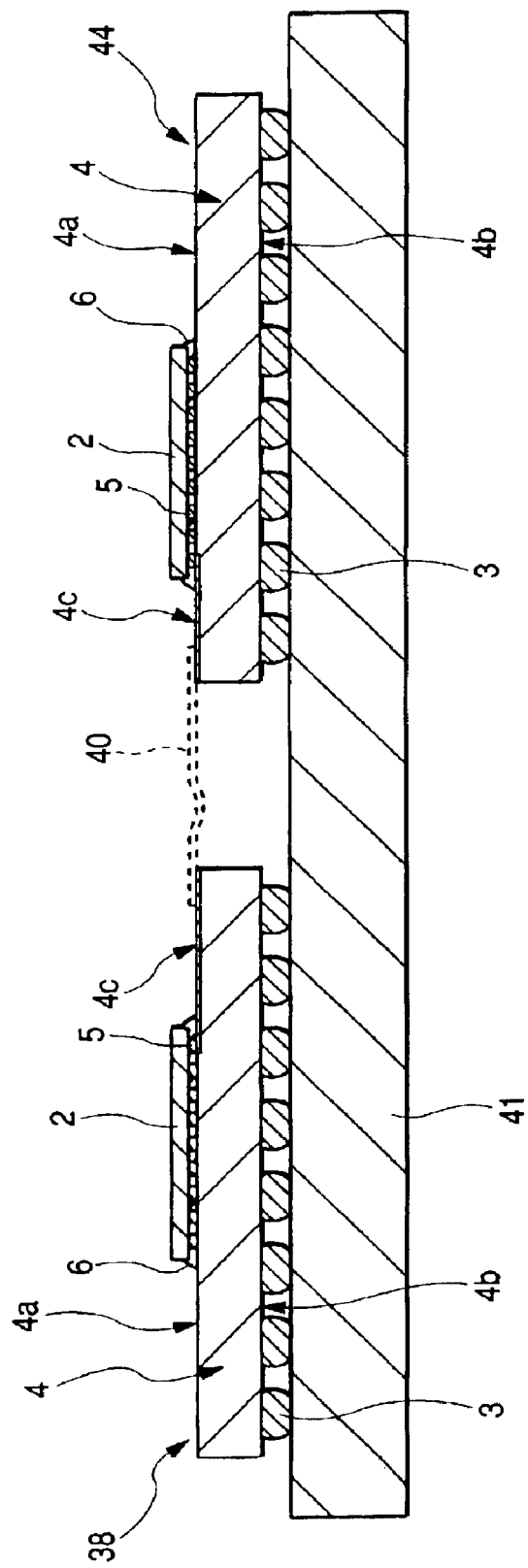
FIG. 74 is a cross-sectional view showing a mounting structure of a still further modification of the tape-shaped transmission line section according to the third embodiment of the present invention.
Figure 75:
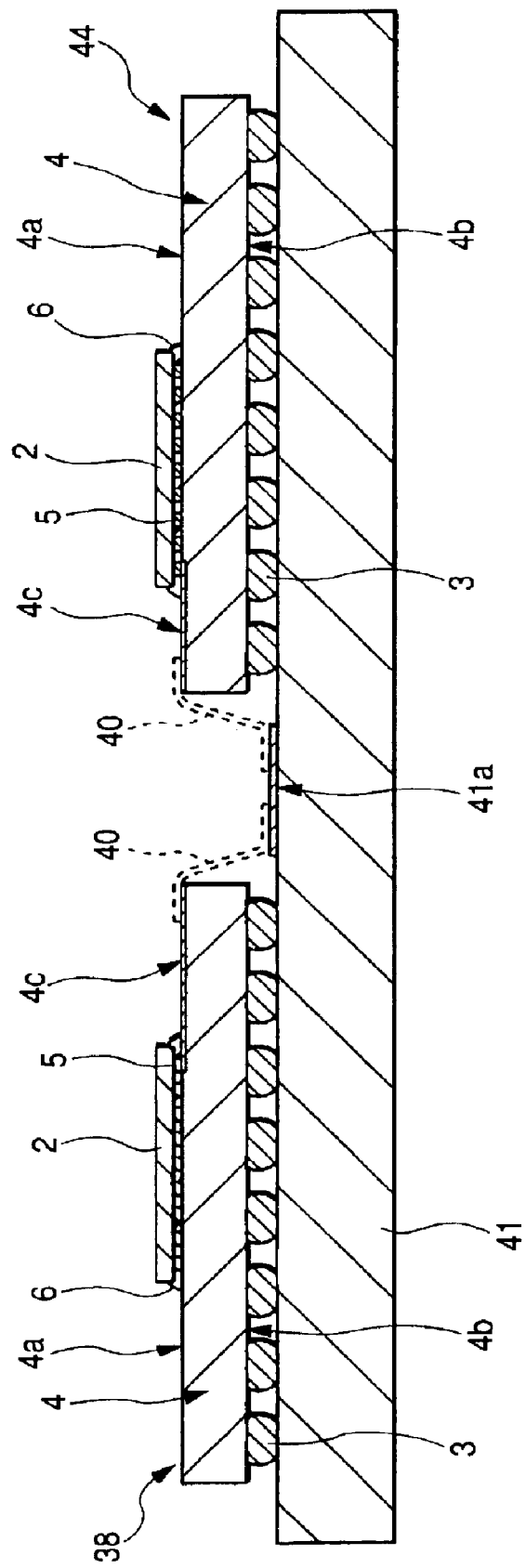
FIG. 75 is a cross-sectional view illustrating a mounting structure of a still further modification of the tape-shaped transmission line section according to the third embodiment of the present invention.

FIG. 46 is a plan view showing one example of a layout of parts built in an optical module according to a third embodiment of the present invention, FIG. 47 is a cross-sectional view illustrating one example of the layout of the parts built in the optical module shown in FIG. 46, FIG. 48 is a cross-sectional view showing a modification of a connecting method of a transmission line section employed in the optical module shown in FIG. 46, FIG. 49 is a plan view depicting a layout of parts built in an optical module illustrative of a modification of the third embodiment of the present invention, FIG. 50 is a cross-sectional view showing one example of the layout of the parts built in the optical module shown in FIG. 49, FIG. 51 is a plan view illustrating a structure of a tape-shaped transmission line section showing one example of the transmission line section employed in the third embodiment of the present invention, FIG. 52 is a cross-sectional view showing a structure of a cross-section cut along line A—A shown in FIG. 51, FIG. 53 is a cross-sectional view illustrating a structure of a cross-section cut along line B—B shown in FIG. 51, FIG. 54 is a back view showing a structure of a back surface of the tape-shaped transmission line section shown in FIG. 51, FIG. 55 is a cross-sectional view illustrating a structure of a cross-section cut along line C—C shown in FIG. 51, FIG. 56 is a plan view showing a structure of a tape-shaped transmission line section illustrative of a modification of the third embodiment of the present invention, FIG. 57 is a cross-sectional view illustrating a structure of a cross-section cut along line A—A shown in FIG. 56, FIG. 58 is a cross-sectional view showing a structure of a cross-section cut along line B—B shown in FIG. 56, FIG. 59 is a back view depicting a structure of a back surface of the tape-shaped transmission line section shown in FIG. 56, FIG. 60 is a cross-sectional view illustrating a structure of a cross-section cut along line C—C shown in FIG. 56, FIG. 61 is a plan view showing a structure of a tape-shaped transmission line section illustrative of another modification of the third embodiment of the present invention, FIG. 62 is a cross-sectional view depicting a structure of a cross-section cut along line A—A shown in FIG. 61, FIG. 63 is a cross-sectional view showing a structure of a cross-section cut along line B—B shown in FIG. 61, FIG. 64 is a back view showing a structure of a back surface of the tape-shaped transmission line section shown in FIG. 61, FIG. 65 is a cross-sectional view illustrating a structure of a cross-section cut along line C—C shown in FIG. 61, FIG. 66 is a cross-sectional view showing one example of a mounting structure of a high-frequency package provided with the tape-shaped transmission line section according to the third embodiment of the present invention, FIG. 67 is an enlarged partly cross-sectional view showing, in a developed form, a structure of a portion D shown in FIG. 66, FIG. 68 is a cross-sectional view illustrating a structure of a cross-section cut along line E—E shown in FIG. 67, FIG. 69 is a cross-sectional view showing a modification of the structure shown in FIG. 68, FIG. 70 is a cross-sectional view illustrating a modification of the structure shown in FIG. 66, FIG. 71 is a cross-sectional view showing another modification of the structure shown in FIG. 66, FIG. 72 is a plan view showing a structure of a tape-shaped transmission line section illustrative of a further modification of the third embodiment of the present invention, FIG. 73 is a plan view showing a connected state of the tape-shaped transmission line section illustrative of the modification shown in FIG. 72, FIG. 74 is a cross-sectional view showing a mounting structure of a still further modification of the tape-shaped transmission line section according to the third embodiment of the present invention, and FIG. 75 is a cross-sectional view illustrating a mounting structure of a still further modification of the tape-shaped transmission line section according to the third embodiment of the present invention, respectively.

The third embodiment describes high-frequency packages (semiconductor devices) 38 each mounted to a piece of an electronic device such as an optical module 39 or the like shown in FIG. 46 having a structure similar to the optical module 14 described in the first embodiment.

Namely, the high-frequency package 38 is also of a semiconductor package equipped with an optical communication IC. This is a semiconductor device capable of performing high-speed transmission at 1 GHz or more, e.g., 40 Gbps. Incidentally, the high-frequency package 38 has a tape-shaped line section 40 corresponding to such a tape-like transmission line section as shown in FIGS. 51 through 55 as a transmission line section for a high-frequency signal.

The input or output of the high-frequency signal to and from a semiconductor chip 2 is performed via the tape-shaped line section 40. Accordingly, the tape-shaped line section 40 is a member which performs the transfer of a high-speed, signal.

The high-frequency package 38 comprises a package substrate (wiring board) 4 formed with such a signal surface layer wiring (surface layer wiring) 4c as shown in FIG. 66, a high-frequency semiconductor chip 2 electrically connected to and mounted onto a main surface 4a of the package substrate 4 by flip-chip connection with a plurality of solder bump electrodes 5 interposed therebetween, a tape-shaped line section 40 electrically connected to the signal surface layer wiring 4c of the package substrate 4, an underfill resin 6 poured between a main surface 2a (see FIG. 1) of the semiconductor chip 2 and the main surface 4a of the package substrate 4 to protect the flip-chip connected portion, and ball electrodes 3 used as a plurality of external connecting terminals disposed within a back surface 4b located on the side opposite to the main surface 4a of the package substrate 4.

Further, the tape-shaped line section 40 according to the third embodiment has plate-shaped leads 40a which are transmission lines and high-frequency wirings as shown in FIG. 51. The plate-shaped lead 40a is electrically connected to the signal surface layer wiring 4c of the package substrate 4.

Incidentally, the package substrate 4 is formed with a microstrip line 4g made up of a signal surface layer wiring 4c and GND layers (ground conductor layers) 4f formed inside via the signal surface layer wiring 4c and an insulating layer 4e as shown in FIG. 1.

Accordingly, the high-frequency package 38 according to the third embodiment directly inputs a signal of a high frequency (e.g., 40 Gbps) sent from the tape-shaped line section 40 to the semiconductor chip 2 through the corresponding solder bump electrode 5 by way of the signal surface layer wiring 4c of the package substrate 4 or outputs a high-frequency signal sent from the semiconductor chip 2 to the outside via the tape-shaped line section 40 in reverse in a manner similar to the high-frequency package 1 according to the first embodiment. The high-frequency package 38 has a structure wherein the high-frequency signal can be transmitted by only the microstrip line at the whole surface layer of the package substrate 4.

As a result, the high-frequency signal can be transmitted without a loss in frequency characteristic owing to the transmission of the high-frequency signal by only the microstrip line at the surface layer of the package substrate 4 without through via-based wirings or the like.

Described specifically, reflective characteristics at high-frequency transmission can be reduced and penetrative or transmissive characteristics can be enhanced owing to the transmission of the high-frequency signal by only the microstrip line at the surface layer. Thus, a loss at the high-frequency transmission can be reduced and a high-quality high-frequency signal can be transmitted.

It is further possible to reduce disturbance in the waveform of the signal of the high frequency at the high-frequency transmission. Accordingly, the transmission of a high-quality high-frequency signal is enabled.

Namely, since a characteristic impedance mismatch occurs when vias are provided upon high-frequency transmission as described in the first embodiment, it can result in a transmission loss. However, if the microstrip line is used, then a desired characteristic impedance can be obtained with the design of parameters such as a wiring width, the thickness of an insulating layer, a space between adjacent patterns, etc. Accordingly, the uniform characteristic impedance can be designed between the input side and the output side and hence a transmission loss can be reduced.

Incidentally, the surface layer wirings of the package substrate 4, such as the signal surface layer wiring 4c, the GND surface layer wiring 4h, etc. are formed of, for example, copper or the like. The surface layer wirings correspond to wirings disposed in the top layer on the main surface 4a side of the package substrate 4, which may be exposed onto the surface of the main surface 4a. Alternatively, they may be coated with a non-conductive thin film or the like.

In the high-frequency package 38 as well, a plurality of ball electrodes (bump electrodes) 3 provided as external connecting terminals are disposed on a back surface 4b of the package substrate 4 in an array form in a manner similar to the high-frequency package 1. Accordingly, the high-frequency package 38 is also of a semiconductor package of a ball grid array type.

Thus, the package can be brought into less size as compared with an outer-lead protrusion type high-frequency package wherein outer leads protrude outwards from a package main body.

The optical module 39 shown in FIG. 46, which is equipped with the high-frequency packages 38, will next be explained.

The optical module 39 according to the third embodiment is similar in structure to the optical module 14 according to the first embodiment. The optical module 39 converts an input light signal to an electric signal by means of an optoelectronic transducer (other semiconductor device) 20, amplifies the same by means of an amplifier device (other semiconductor device) 19, and thereafter performs arithmetic processing inside the semiconductor chip according to the electric signal, and further converts the result of its processing to a light signal again, followed by output to the following module product.

In the optical module 39 shown in FIG. 46, a signal of a high frequency on the order of a giga (G) Hz is inputted/outputted to the following stages of the amplifier devices 19. Accordingly, the high-frequency packages 38 and the amplifier devices 19 corresponding to other semiconductor devices are respectively connected via the tape-shaped line sections 40.

A description will now be made to the connections made via the tape-shaped line sections 40. Upon the connection between the high-frequency packages 38 and the amplifier devices 19 mounted on the same module substrate 13, the respective tape-shaped line sections 40 are connected to the module substrate 13 once, and the high-frequency packages 38 and the amplifier devices 19 are respectively electrically connected to one another through surface layer wirings on the module substrate 13 and the tape-shaped line sections 40.

As shown in FIG. 48, the high-frequency packages 38 and the amplifier devices 19 can be directly connected to one another by their corresponding tape-shaped line sections 40.

Namely, since the tape-shaped line sections 40 have flexibility, they are shaped in a bent form in advance. It is thus possible to easily package the high-frequency packages 38 or the amplifier devices 19.

On the other hand, since the tape-shaped line section 40 has flexibility, both parts different in height can be directly connected by the tape-shaped line section 40 even if the parts are used. Accordingly, the distance between both parts can be shortened as shown in FIG. 48, and a packaging area can be reduced. Since the surface layer wirings of the module substrate 13 are not interposed between the parts upon transmission of a high-frequency signal between the parts, a loss at the transmission of the high-frequency signal can be further reduced, and the quality of transmission of the high-frequency signal can be enhanced.

The optical module 39 shown in FIGS. 49 and 50 has a structure wherein tape-shaped line sections 40 are respectively interposed between amplifier devices 19 and optoelectronic transducers (other semiconductor devices) 20 as well as between high-frequency packages 38 and the amplifier devices 19. Further, a packaging area of each part can be reduced and the quality of transmission of a high-frequency signal can be enhanced.

Incidentally, a circuit for dividing, for example, an input signal having a first frequency into a plurality of signals each having a second frequency smaller than the first frequency and outputting the same is built in the semiconductor chip 2 provided with the tape-shaped line section 40 on the signal input side in the optical module 39 shown in FIG. 46. On the other hand, a circuit for integrating or combining, for example, a plurality of input signals each having a third frequency into a signal having a fourth frequency larger than the third frequency and outputting the same is incorporated into the semiconductor chip 2 provided with the tape-shaped line section 40 on the signal output side. The first and fourth frequencies are 1 GHz or more.

Since other structures other than the tape-shaped line sections 40, of the structures of the optical modules 39 shown in FIGS. 46 through 50 related to the third embodiment are similar to the optical module 14 shown in FIG. 4, the description of common ones will be omitted.

A configuration of the tape-shaped line section 40 mounted to the high-frequency package 38 according to the third embodiment will next be described.

The tape-shaped line section 40 shown in FIGS. 51 through 55 is such a four-layer structured tape-shaped member as shown in FIG. 52, which comprises a single base metal layer (ground conductor layer) 40b set to a ground potential shown in FIG. 54, an insulating layer 40c disposed thereon, a surface layer metal layer 40d formed thereon, and a cover coat layer 40e corresponding to a solder resist for covering the surface layer metal layer 40d.

As shown in FIG. 51, the surface layer metal layer 40d has a surface layer signal lead 40g corresponding to a plate-shaped lead 40a disposed along its longitudinal direction in the vicinity of the center thereof as viewed in its transverse direction, and surface GND leads 40h disposed along the longitudinal direction thereof on both sides thereof. Further, the base metal layer 40b and the two surface layer GND leads 40h are respectively connected to one another by a plurality of vias 40f as shown in FIGS. 53 and 55 and brought to the ground potential corresponding to the same potential.

Namely, the surface layer GND leads 40h are respectively disposed on both sides of the surface layer signal lead 40g of the surface layer metal layer 40d through the insulative cover coat layer 40e. Further, the base metal layer 40b is disposed on the back side of the surface layer signal lead 40g with the insulating layer 40c interposed therebetween. Thus, the tape-shaped line section 40 is formed with a microstrip line 40i as shown in FIG. 55.

As a result, a high-frequency signal is transmitted to other semiconductor device such as the amplifier device 19, and the module substrate 13 or the like via the signal surface layer wiring 4c of the package substrate 4 and the surface layer signal lead 40g of the microstrip line 40i of the corresponding tape-shaped line section 40, whereby the loss at high-frequency transmission is reduced and high-quality transmission of a high-frequency signal can be performed.

Incidentally, the base metal layer 40b is formed of stainless steel (SUS) or the like. The thickness thereof ranges from about 0.1 mm to about 0.2 mm, for example. The surface layer metal layer 40d is a thin film of copper, for example, and the thickness thereof ranges from about several tens of μm to about 35 μm, for example. The insulating film 40c is formed of a polyimide resin or the like, for example.

However, the quality and thickness or the like of each of the constituent members of each tape-shaped line section 40 are not limited to the above ones.

Incidentally, while the surface layer metal layer 40d is formed on the surface of the insulating layer 40c in the tape-shaped line section 40 shown in FIGS. 51 through 55, the surface layer metal layer 40d is formed of a wiring pattern of copper or the like. Further, the base metal layer 40b on the back side of the insulating layer 40c is one obtained by lining a metal thin plate having elasticity, for example.

Owing to the placement of the base metal layer 40b on the back side of the insulating layer 40c, the tape-shaped line section 40 is easy to bend and mold, and its bent shape can be keep uniform. It is thus easy to shape a gull-wing form. As a result, the tape-shaped line sections 40 can be disposed with respect to the high-frequency package 38 to the module substrate 13 or the like or the high-frequency package 38 to other semiconductor device with high accuracy. An improvement in workability at packaging can be achieved and the packaging property of the high-frequency package 38 can be enhanced.

The tape-shaped line section 40 according to the modification shown in FIGS. 56 through 60 includes a metal layer 40j set to a ground potential, which is provided over a base metal layer 40b with an adhesive 40l interposed therebetween as shown in FIG. 60. The metal layer 40j is electrically connected to surface layer GND leads 40h via a plurality of vias 40f. Since one layer is increased as the layer formed of copper foil set to the ground potential as compared with the tape-shaped line section 40 shown in FIGS. 51 through 55, a resistance value can be reduced as compared with the provision of the base metal layer 40b alone, and electric characteristics can be enhanced.

However, since the tape-shaped line section 40 shown in FIGS. 51 through 55 is simple in structure as compared with the tape-shaped line section 40 illustrative of the modification shown in FIGS. 56 through 60, a cost reduction can be achieved.

The tape-shaped line section 40 shown in FIGS. 61 through 65 includes a surface layer metal layer 40d and a metal layer 40j provided as wiring patterns. Both are electrically connected to each other by a plurality of vias 40f. The surface layer metal layer 40d and the metal layer 40j are respectively covered with a cover coat layer 40e corresponding to an insulative solder resist.

In the tape-shaped line section 40 illustrative of the modification shown in FIGS. 61 through 65, the metal layer 40j can be also patterned because of copper foil. The tape-shaped line section 40 is capable of further improving electric characteristics as compared with the tape-shaped line section 40 shown in FIGS. 51 through 55. Since the tape-shaped line section 40 is simple in structure as compared with the tape-shaped line section 40 illustrative of the modification shown in FIGS. 56 through 60, the cost thereof can be reduced. Since the tape-shaped line section 40 also has flexibility, parts different in height can be easily connected to each other.

With the use of such tape-shaped line sections 40 as shown in FIGS. 51 through 65 as high-frequency signal transmission line sections, the high-frequency package 38 according to the third embodiment can be reduced in size and thinned as compared with the high-frequency package 1 using the coaxial cable 7, according to the first embodiment. Since the tape-shaped line section 40 is considerably low in cost as compared with the coaxial cable 7, the cost of the high-frequency package 38 can be lowered.

Since the transmission lines such as the surface layer signal lead 40g and the surface layer GND leads 40h or the metal layer 40j formed in the tape-shaped line section 40 can be formed as the wiring patterns by a photolitho technology, the dimensions of each transmission line can be formed with high accuracy, and the design thereof can be facilitated.

Next, FIGS. 66 through 71 respectively show mounting structures (electronic devices) of high-frequency packages 38, which are ones wherein the high-frequency packages 38 equipped with tape-shaped line sections 40 each formed with being bent in a gull-wing fashion are respectively packaged over mounting boards 41.

Since the tape-shaped line sections 40 are formed with being bent in the gull-wing fashion, packaging work is easy and packageability can be improved. When the tape-shaped line sections 40 are formed with being bent in the gull-wing form in this way, the tape-shaped line sections 40 provided with the lined base metal layers 40b may preferably be used as in the tape-shaped line section 40 shown in FIGS. 51 through 55 and the tape-shaped line section 40 illustrative of the modification shown in FIGS. 56 through 60.

Incidentally, FIGS. 67 and 68 respectively show the details of a connected state of the tape-shaped line section 40 and the mounting board 41. A surface layer signal lead (transmission line) 40g of the tape-shaped line section 40 and a signal surface layer wiring (electrode) 41a of the mounting board 41, and surface layer GND leads (transmission lines) 40h of the tape-shaped line section 40 and their corresponding GND surface layer wirings (electrodes) 41b of the mounting board 41 are respectively connected to one another with solder 42 interposed therebetween.

FIG. 69 shows a case in which an anisotropic conductive resin 43 is used as an alternative to the solder 42. A surface layer signal lead 40g of a tape-shaped line section 40 and a signal surface layer wiring 41a of a mounting board 41, and surface layer GND leads 40h of the tape-shaped line section 40 and GND surface layer wirings 41b of a mounting board 41 are respectively electrically connected to one another by conductive particles 43a.

Using the solder 42 and the anisotropic conductive resin 43 in this way makes it possible to detach the respective tape-shaped line sections 40. Consequently, each high-frequency package 38 can be easily repaired.

When the high-frequency package 38 is packaged as shown in FIG. 70, ball electrodes 3 used as its external connecting terminals and tape-shaped line sections 40 may be connected to different discrete mounting boards 41 without being connected to the same mounting board 41. Namely, since the shape of the tape-shaped line section 40 has a degree of freedom, such mounting structures can be realized.

FIG. 71 shows a structure wherein a high-frequency package 38 and other semiconductor package (other semiconductor device) 44 are electrically connected to each other by a tape-shaped line section 40. Since the high-frequency package 38 and other semiconductor package 44 are often different in height in this case, such a tape-shaped line section 40 as indicated by the modification shown in FIGS. 61 through 65, having relatively flexibility may preferably be used. Thus, even if the difference in height occurs between the two, they can be easily connected.

Incidentally, the high-frequency package 38 provided with the tape-shaped line section 40 in advance is mounted on its corresponding mounting substrate 41. Thereafter, the tape-shaped line section 40 and other semiconductor package 44 may be connected to each other. Alternatively, the high-frequency package 38 having no tape-shaped line section 40, and other semiconductor package 44 are packaged on the corresponding mounting board 41, and thereafter the tape-shaped line section 40 may be connected to the two. In either case, the tape-shaped line section 40 having relatively ductility (flexibility) may preferably be used.

Further, since the tape-shaped line section 40 is directly connected to the high-frequency package 38 and other semiconductor package 44 without being connected to the mounting board 41 in the mounting structure shown in FIG. 71, the distance between the packages can be shortened, and a packaging area can be reduced.

Next, FIG. 72 shows a modification of the transmission line section, which is a bifurcated tape-shaped line section (differential line) used upon input/output of a high-frequency signal among a plurality of packages. Two surface layer signal leads 40g are disposed and surface layer GND leads 40h are respectively disposed on both sides thereof and between the two.

In this case, a structure is taken wherein as shown in FIG. 73, one end of the bifurcated tape-shaped line section 45 is connected to one high-frequency package 38, whereas other divided ends are respectively connected to discrete other semiconductor packages 44 or the like.

FIGS. 74 and 75 respectively show structures wherein high-frequency packages 38 with no tape-shaped line sections 40 attached thereto, and other semiconductor packages 44 or the like are first packaged to mounting boards 41 respectively and thereafter a user or the like connects the tape-shaped line sections 40 thereto.

In this case, the user is capable of easily turning ON/OFF electrical connections between the packages by mounting and demounting the tape-shaped line section 40 and changing applications.

(Fourth Embodiment)

Figure 76:
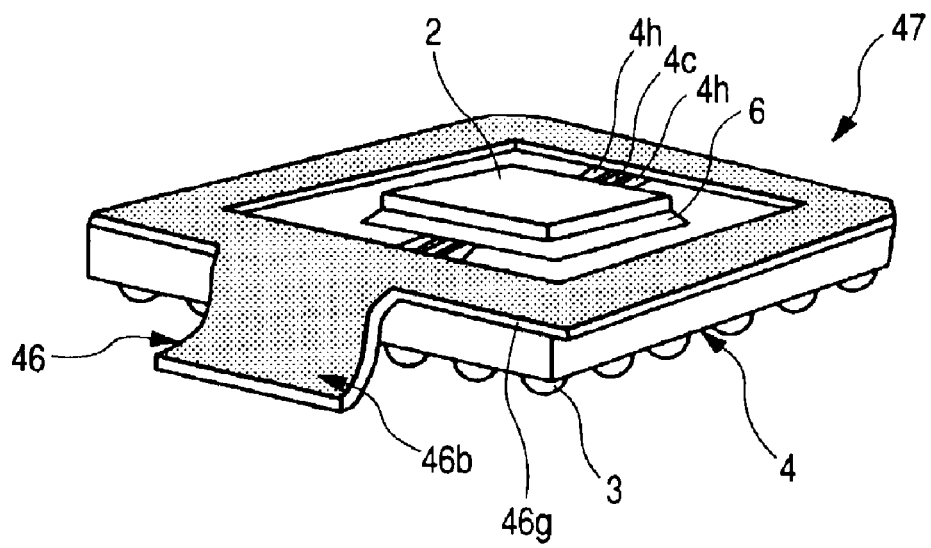
FIG. 76 is a perspective view showing one example of a structure of a high-frequency package according to a fourth embodiment of the present invention.
Figure 77:
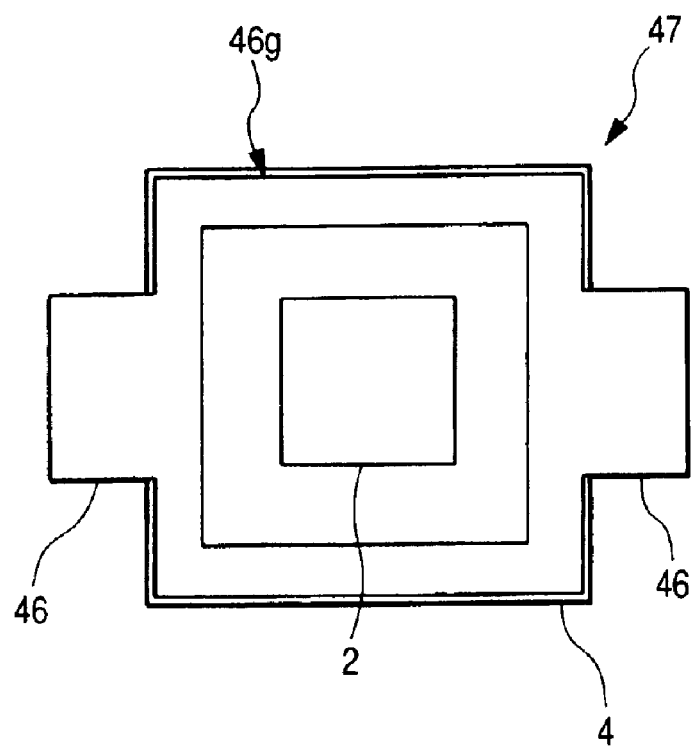
FIG. 77 is a plan view illustrating the structure of the high-frequency package shown in FIG. 76.
Figure 78:
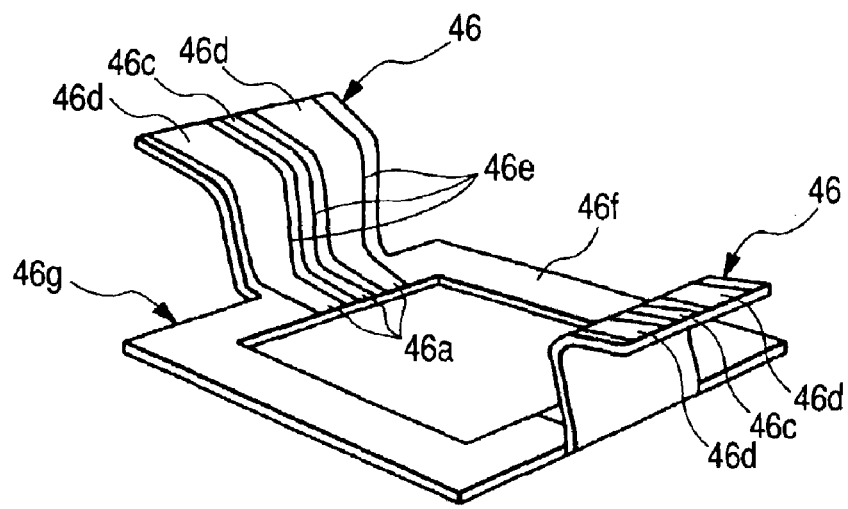
FIG. 78 is a perspective view showing a structure of a back side of a frame-shaped transmission line section mounted to the high-frequency package shown in FIG. 76.
Figure 79:
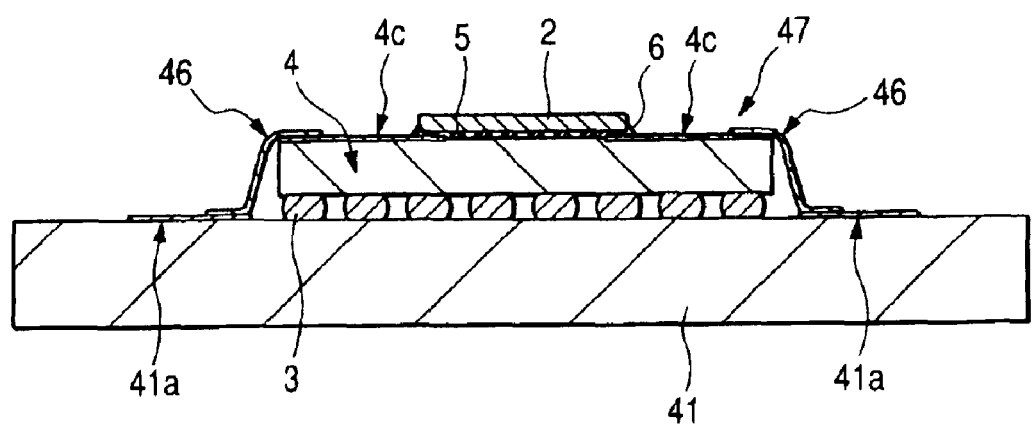
FIG. 79 is a cross-sectional view depicting one example of a mounting structure of the high-frequency package shown in FIG. 76.
Figure 80:
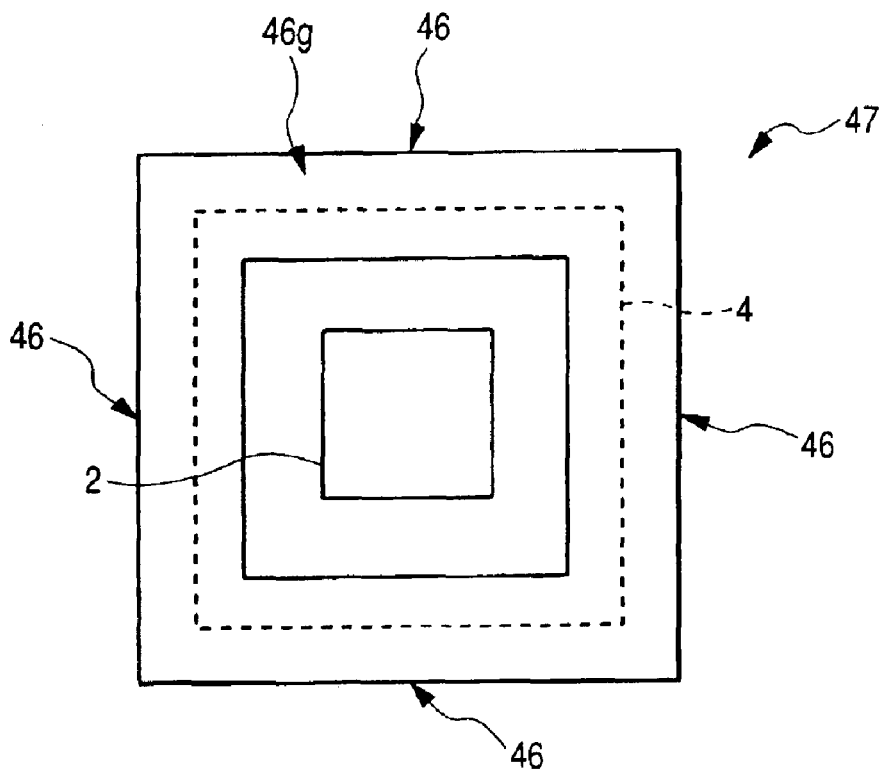
FIG. 80 is a plan view showing a structure of a high-frequency package illustrative of a modification of the fourth embodiment of the present invention.
Figure 81:
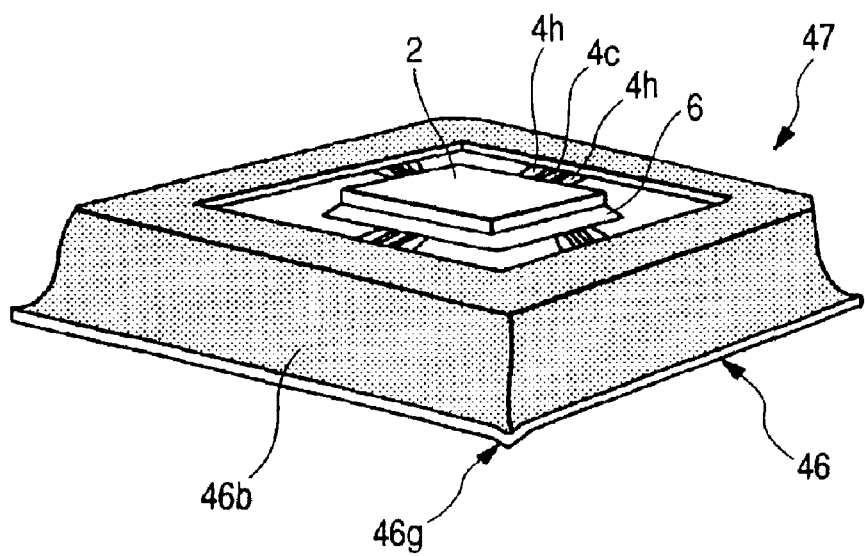
FIG. 81 is a perspective view illustrating the structure of the high-frequency package shown in FIG. 80.
Figure 82:
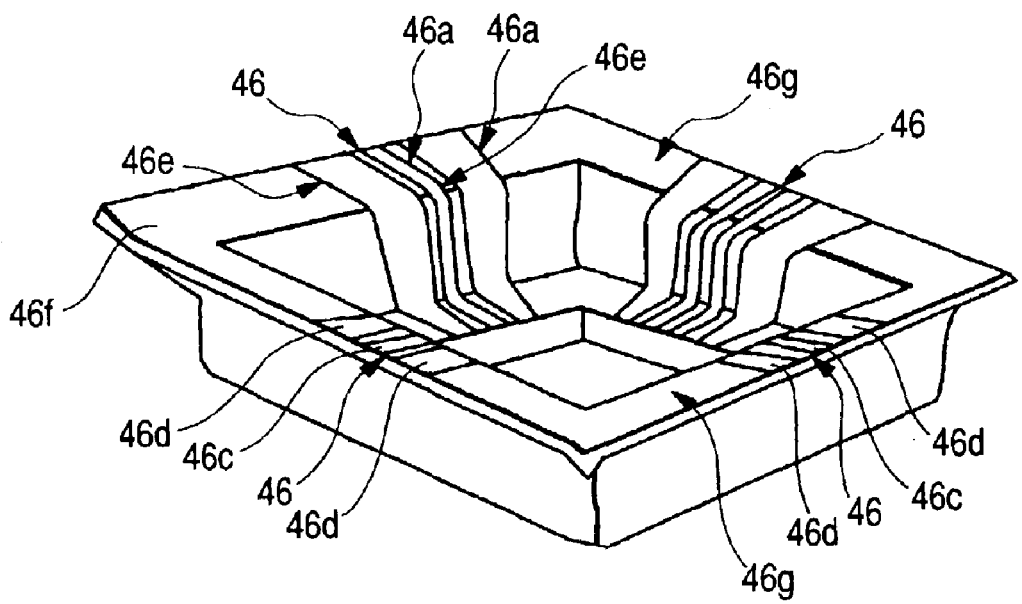
FIG. 82 is a perspective view showing a structure of a back side of a transmission line section mounted to the high-frequency package shown in FIG. 81.
Figure 83:
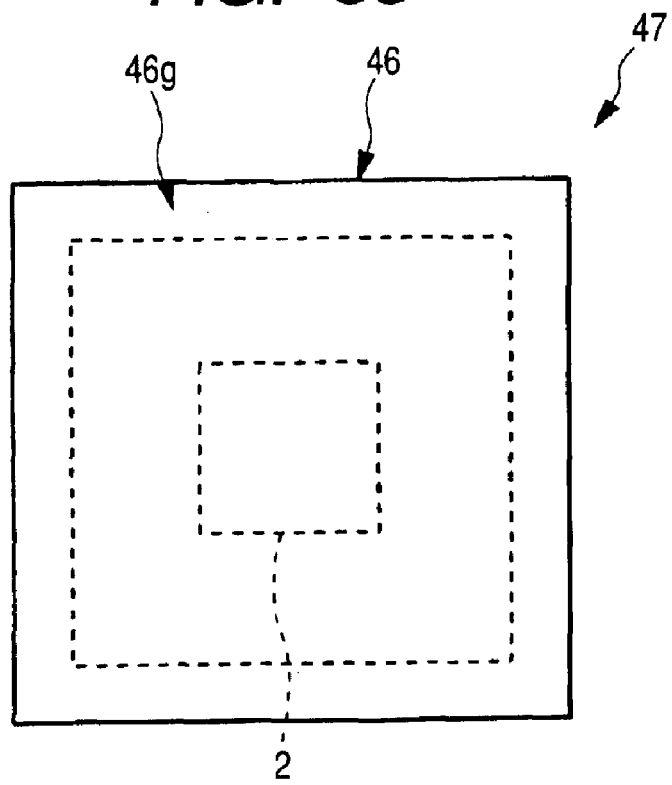
FIG. 83 is a plan view depicting a structure of a high-frequency package illustrative of another modification of the fourth embodiment of the present invention.
Figure 84:
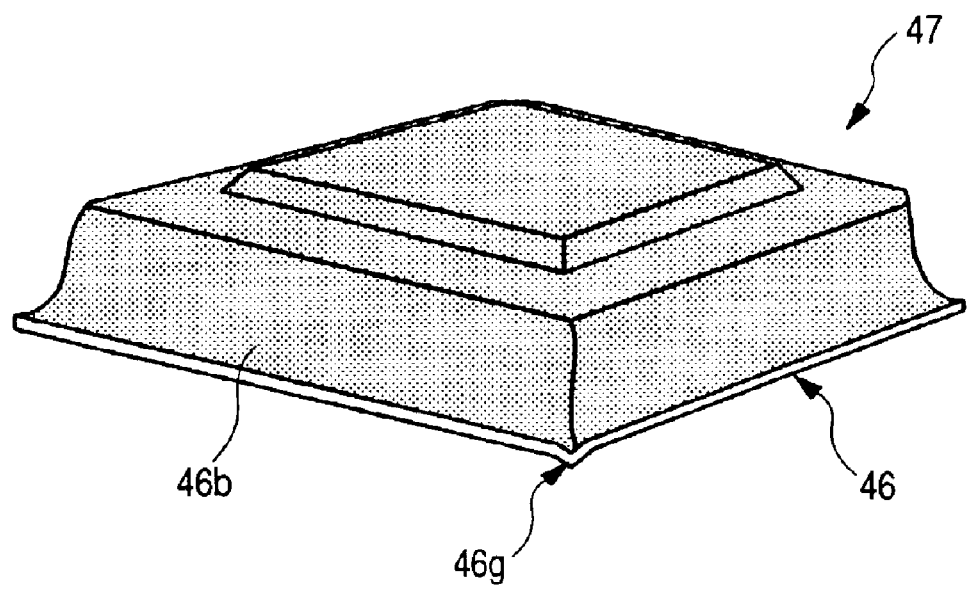
FIG. 84 is a perspective view showing the structure of the high-frequency package shown in FIG. 83.
Figure 85:
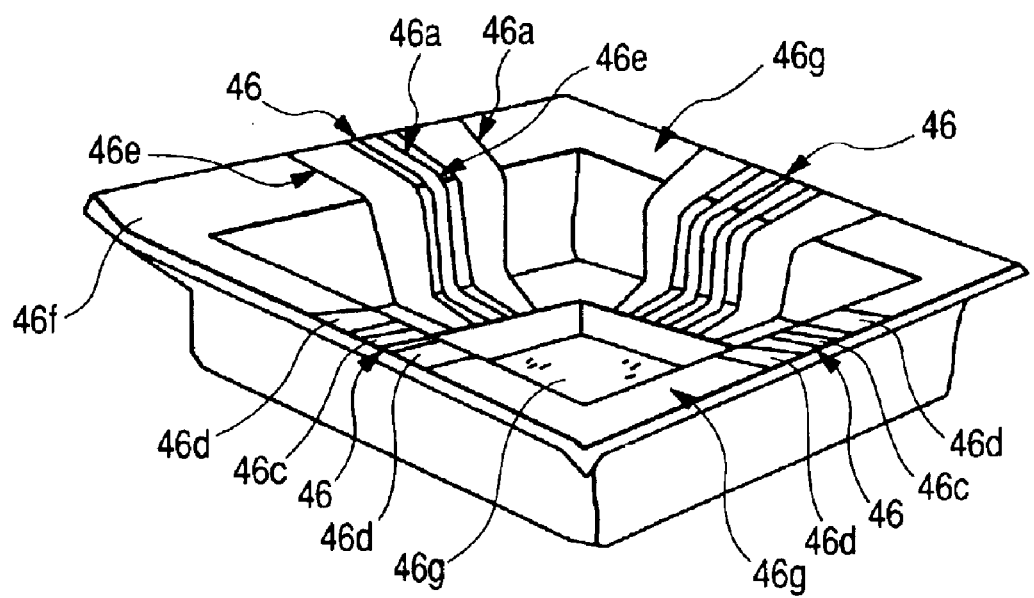
FIG. 85 is a perspective view illustrating a structure of a back side of a transmission line section mounted to the high-frequency package shown in FIG. 84.
Figure 86:
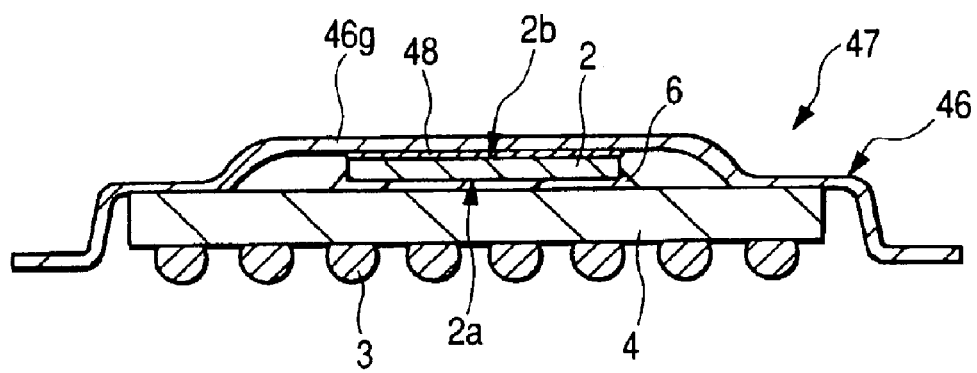
FIG. 86 is a cross-sectional view showing the structure of the high-frequency package shown in FIG. 83.

FIG. 76 is a perspective view showing one example of a structure of a high-frequency package according to a fourth embodiment of the present invention, FIG. 77 is a plan view illustrating the structure of the high-frequency package shown in FIG. 76, FIG. 78 is a perspective view showing a structure of a back side of a frame-shaped transmission line section mounted to the high-frequency package shown in FIG. 76, FIG. 79 is a cross-sectional view depicting one example of a mounting structure of the high-frequency package shown in FIG. 76, FIG. 80 is a plan view showing a structure of a high-frequency package illustrative of a modification of the fourth embodiment of the present invention, FIG. 81 is s perspective view illustrating the structure of the high-frequency package shown in FIG. 80, FIG. 82 is a perspective view showing a structure of a back side of a transmission line section mounted to the high-frequency package shown in FIG. 81, FIG. 83 is a plan view depicting a structure of a high-frequency package illustrative of another modification of the fourth embodiment of the present invention, FIG. 84 is a perspective view showing the structure of the high-frequency package shown in FIG. 83, FIG. 85 is a perspective view illustrating a structure of a back side of a transmission line section mounted to the high-frequency package shown in FIG. 84, and FIG. 86 is a cross-sectional view showing the structure of the high-frequency package shown in FIG. 83, respectively.

In the fourth embodiment, a transmission line section of a high-frequency package (semiconductor device) 47 is disposed so as to protrude in two opposite directions of a package substrate 4 as shown in FIG. 76. At this time, the transmission line section is provided with a connecting portion 46g which protrudes from the transmission line section in a direction to cross its transmission lines and is formed integrally with the transmission line section.

Incidentally, the connecting portion 46g is shaped in a frame form according to an outer peripheral shape of the package substrate 4 as shown in FIG. 78. Plate-shaped line portions 46 each corresponding to the transmission line section protrude in two opposite directions of the frame-shaped connecting portion 46g and are formed integrally with the connecting portion 46g.

Even in the case of the plate-shaped line sections 46, base metal layers (ground conductor layers) 46b and surface layer metal layers 46e (see FIG. 78) are disposed with an insulating layer 46f formed of a polyimide resin or the like interposed therebetween. Further, each of the surface layer metal layers 46e is a plate-shaped lead (wiring) 46a made up of a surface layer signal lead (transmission line) 46c and a surface layer GND lead (transmission line) 46d.

Incidentally, since the connecting portion 46g is frame-shaped, a semiconductor chip 2 takes a structure exposed within the frame as shown in FIGS. 76 and 77 when the connecting portion 46g is mounted on the package substrate 4.

FIG. 79 shows the mounting structure wherein the high-frequency package 47 is packaged to a mounting board 41. Signal surface layer wirings 4c of a package substrate 4 in the high-frequency package 47 and their corresponding surface layer signal leads 46c of plate-shaped line sections 46, and the surface layer signal leads 46c of the plate-shaped line sections 46 and their corresponding signal surface layer wirings 41a on the mounting board 41 are respectively electrically connected to one another.

In the high-frequency package 47 shown in FIG. 76, according to the fourth embodiment, the connecting portion 46g protruded from each plate-shaped line section 46 assumes the role of reinforcement upon connection of the plate-shaped line sections 46 and the package substrate 4. Therefore, the connecting portion 46g is capable of enhancing the strength of connection between the plate-shaped line sections 46 and the package substrate 4. The larger the area for connecting the connecting portion 46g and the package substrate 4 at this time, the greater the strength of connection between the two.

Further, since the connecting portion 46 formed integrally with the plate-shaped line sections 46 is directly connected to the package substrate 4 in a frame-based large area, heat generated from the semiconductor chip 2 can be dissipated into the connecting portion 46g through the package substrate 4, so that the radiation of the high-frequency package 47 can be enhanced.

Owing to the connection of the plate-shaped line sections 46 each having the base metal layer 46b at a ground potential to the package substrate 4, the ground of the high-frequency package 47 can be upgraded and a noise margin can be enhanced.

When the plate-shaped line sections 46 and the connecting portion 46g are integrally formed, the surface layer signal leads 46c each corresponding to the transmission line, and the surface layer GND leads 46d are formed by etching processing. Further, the central portion of the connecting portion 46g is punched out and thereafter the connecting portion 46g is formed by press molding. At this time, the bending accuracy of each plate-shaped line section 46 can be set to about ±0.05 mm owing to the accuracy of a press die.

Incidentally, the connecting portion 46g may not be necessarily formed in such a frame shape so as to couple the two plate-shaped line sections 46 disposed as opposed to each other. The connecting portion 46g may be one having areas which protrude in a direction to cross transmission lines of the plate-shaped line sections 46 from the plate-shaped line sections 46 and are connectable to the package substrate 4. Namely, the two plate-shaped line sections 46 disposed in an opposing relationship may not be necessarily connected to each other.

Next, FIGS. 80 through 82 show a high-frequency package 47 equipped with plate-shaped line sections 46, according to a modification. Transmission lines are formed in association with four directions of a package substrate 4, and the plate-shaped line sections 46 respectively formed in association with the four sides thereof are brought to an integrally connected structure.

Owing to the provision of the structure wherein the plate-shaped line sections 46 corresponding to the four sides of the package substrate 4 are respectively connected at the corners in this way, the degree of flatness of each lead can be enhanced.

When the bending accuracy of a press die is about ±0.05 mm, for example, a flatness of 0.05 mm or less can be ensured. Since the integrally-constructed plate-shaped line sections 46 corresponding to the four sides are joined to the package substrate 4, the degree of flatness of a ball-electrode mounting surface of the package substrate 4 can be set to 0.1 mm or less.

Since the lead flatness can be enhanced, the height-control ball electrodes 3 (see FIG. 76) become unnecessary. Therefore, the high-frequency package 47 can be low priced and its connection reliability can be enhanced.

FIGS. 83 through 86 show a high-frequency package 47 equipped with plate-shaped line sections 46, according to another modification. A connecting portion 46g is disposed even on a semiconductor chip 2. As shown in FIG. 86, a back surface 2b of the semiconductor chip 2 and the connecting portion 46g are bonded to each other by an adhesive 48.

Thus, the high-frequency package 47 can be further improved in dissipation.

(Fifth Embodiment)

Figure 87:
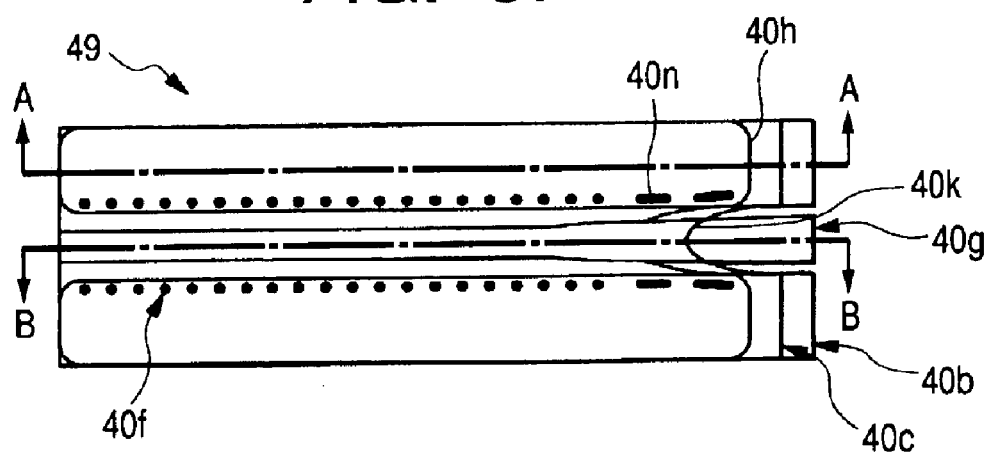
FIG. 87 is a plan view illustrating a structure of a tape-shaped transmission line section according to a fifth embodiment of the present invention.
Figure 88:
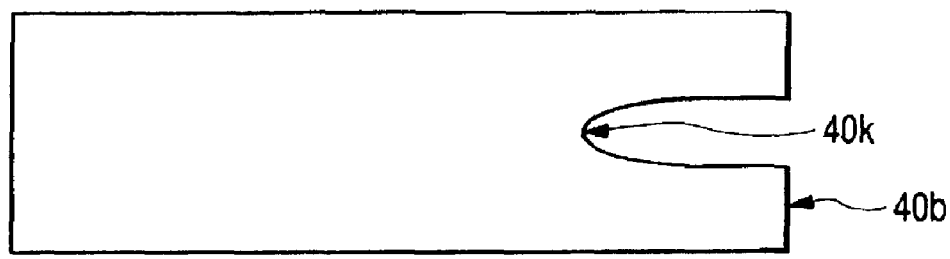
FIG. 88 is a plan view showing a structure of a base metal layer of the tape-shaped transmission line section shown in FIG. 87.
Figure 89:
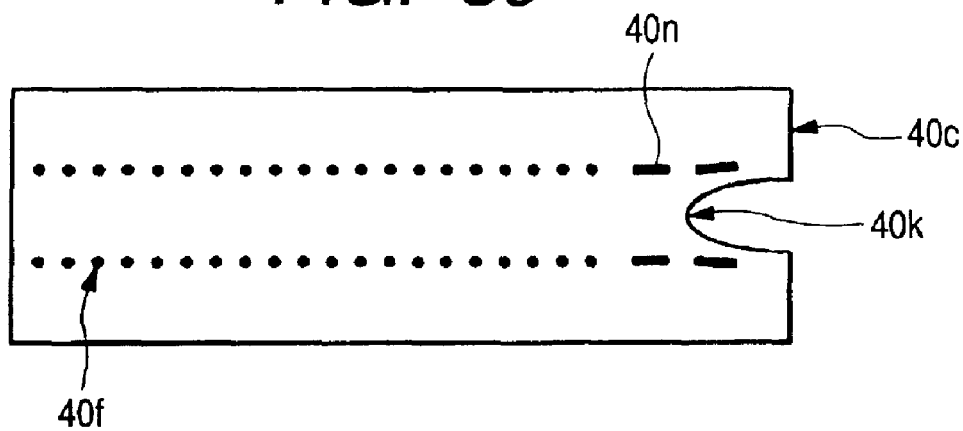
FIG. 89 is a plan view depicting a structure of an insulating layer of the tape-shaped transmission line section shown in FIG. 87.
Figure 90:
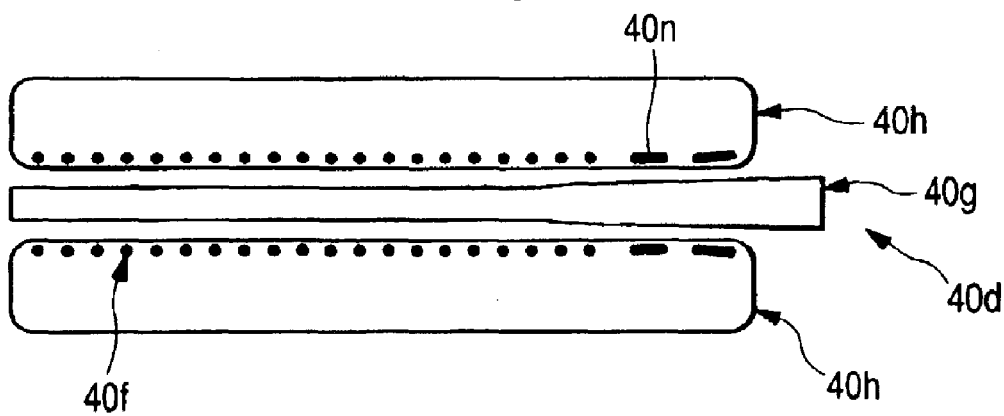
FIG. 90 is a plan view illustrating a structure of a surface-layer metal layer of the tape-shaped transmission line section shown in FIG. 87.
Figure 91:
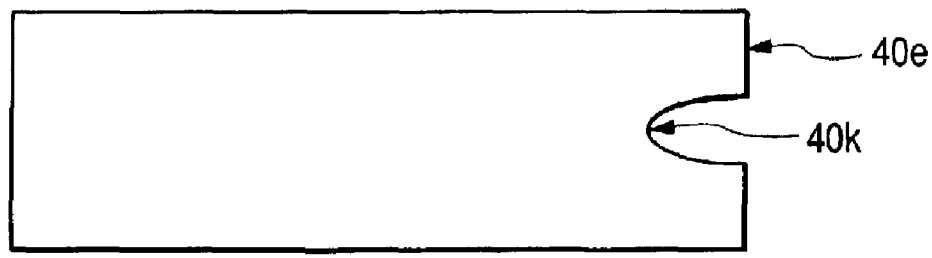
FIG. 91 is a plan view showing a structure of a cover coat layer of the tape-shaped transmission line section shown in FIG. 87.
Figure 92:
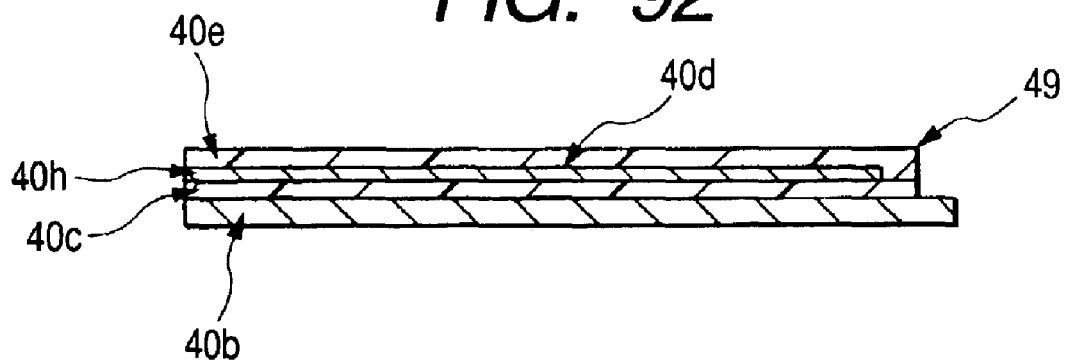
FIG. 92 is a cross-sectional view illustrating a structure of a cross-section cut along line A—A shown in FIG. 87.
Figure 93:
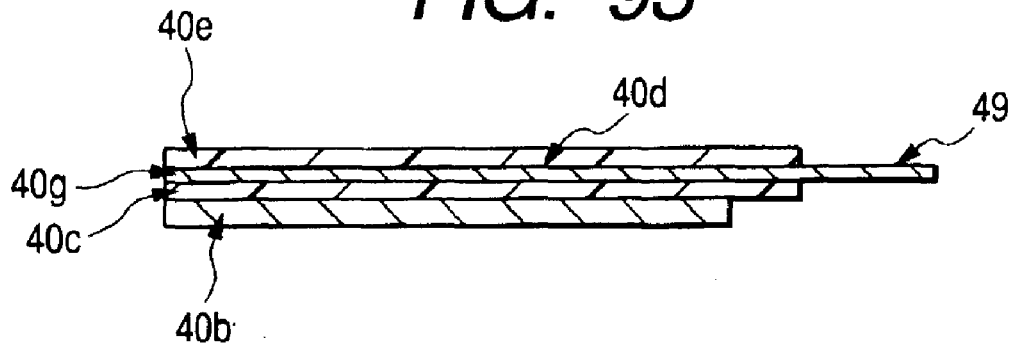
FIG. 93 is a cross-sectional view depicting a structure of a cross-section cut along line B—B shown in FIG. 87.
Figure 94:
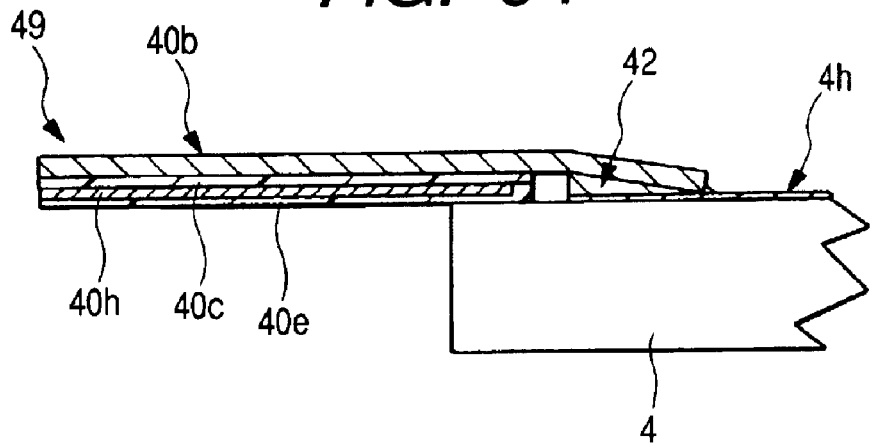
FIG. 94 is a partly cross-sectional view showing a connecting structure of the base metal layer of the tape-shaped transmission line section shown in FIG. 87.
Figure 95:
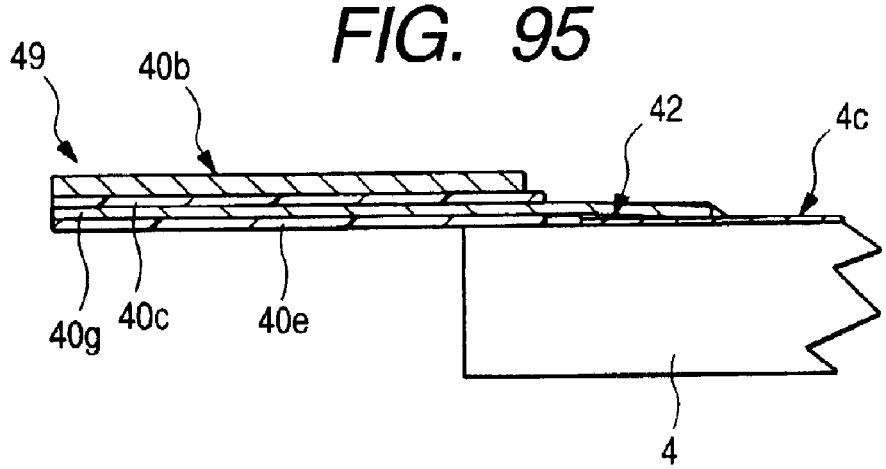
FIG. 95 is a partly cross-sectional view illustrating a connecting structure of the surface-layer metal layer of the tape-shaped transmission line section shown in FIG. 87.
Figure 96:
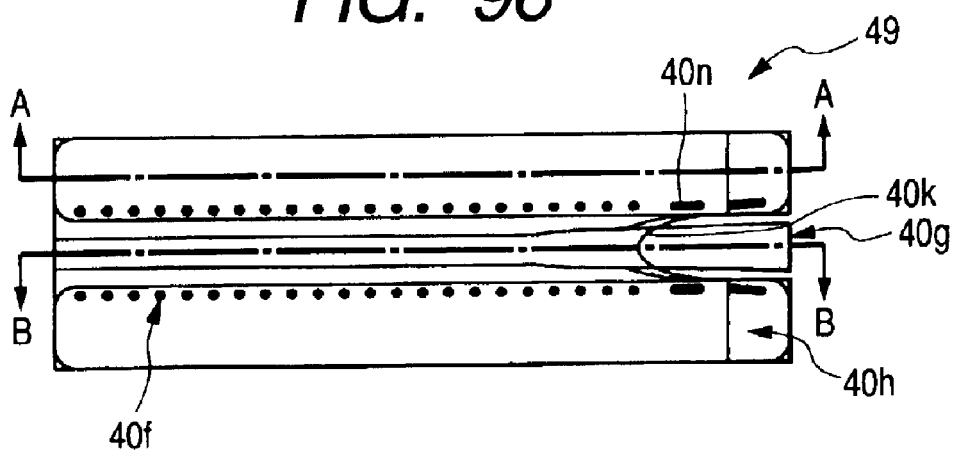
FIG. 96 is a plan view depicting a structure of a tape-shaped transmission line section illustrative of a modification of the fifth embodiment of the present invention.
Figure 97:
FIG. 97 is a plan view showing a structure of a base metal layer of the tape-shaped transmission line section shown in FIG. 96.
Figure 98:
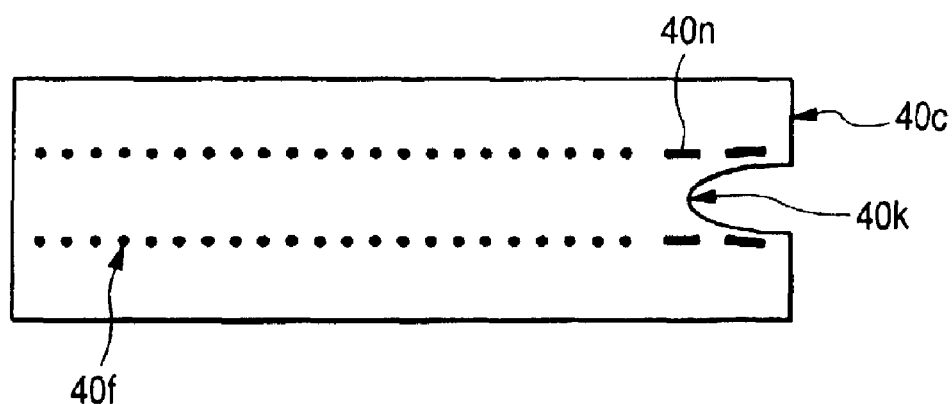
FIG. 98 is a plan view illustrating a structure of an insulating layer of the tape-shaped transmission line section shown in FIG. 96.
Figure 99:
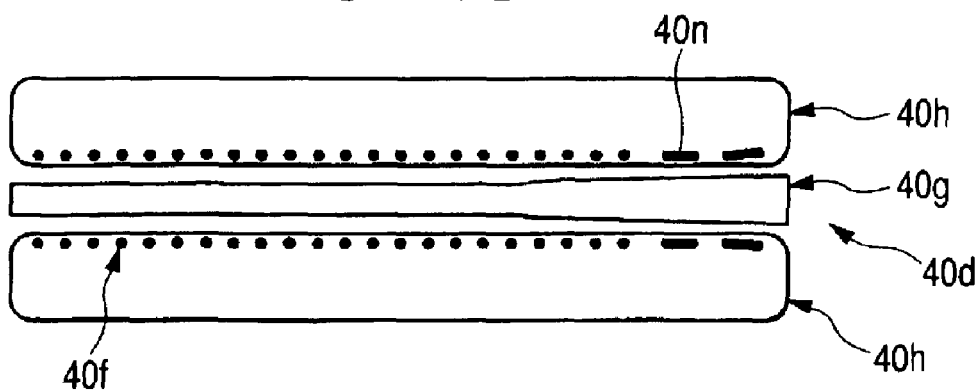
FIG. 99 is a plan view depicting a structure of a surface-layer metal layer of the tape-shaped transmission line section shown in FIG. 96.
Figure 100:
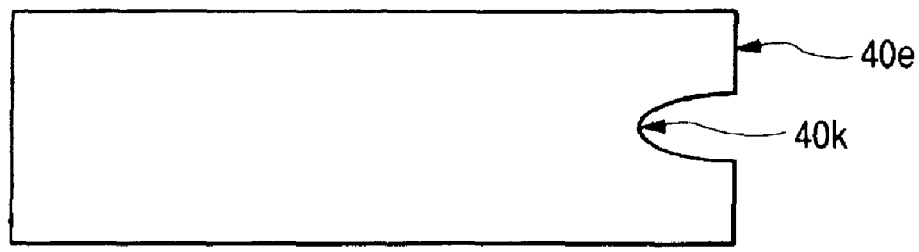
FIG. 100 is a plan view showing a structure of a cover coat layer of the tape-shaped transmission line section shown in FIG. 96.
Figure 101:
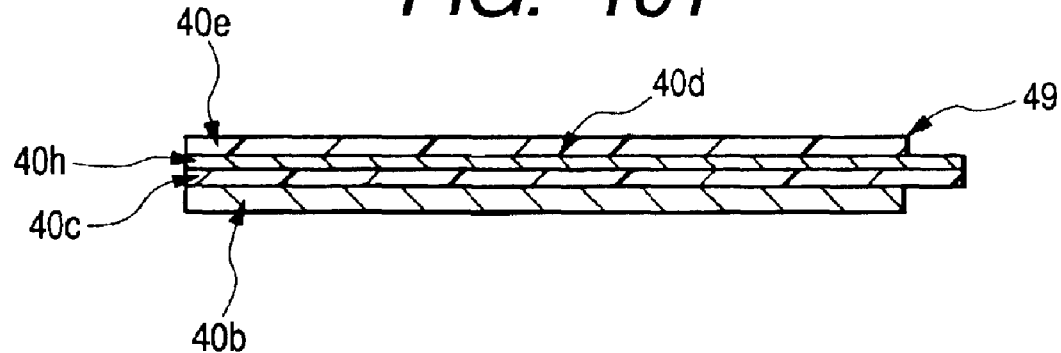
FIG. 101 is a cross-sectional view illustrating a structure of a cross-section cut along line A—A shown in FIG. 96.
Figure 102:
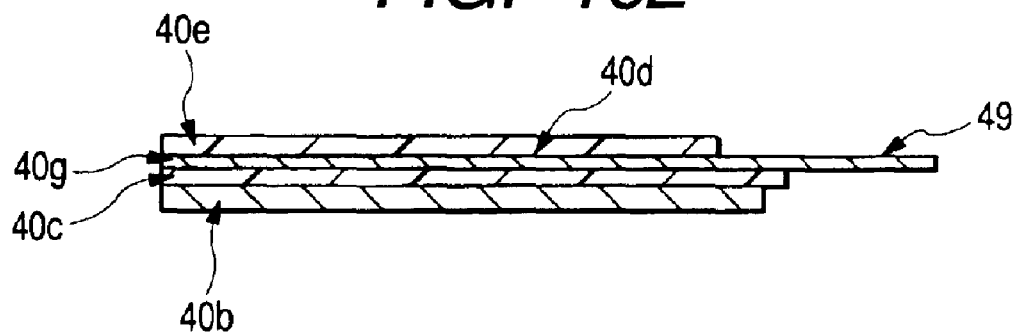
FIG. 102 is a cross-sectional view depicting a structure of a cross-section cut along line B—B shown in FIG. 96.
Figure 103:
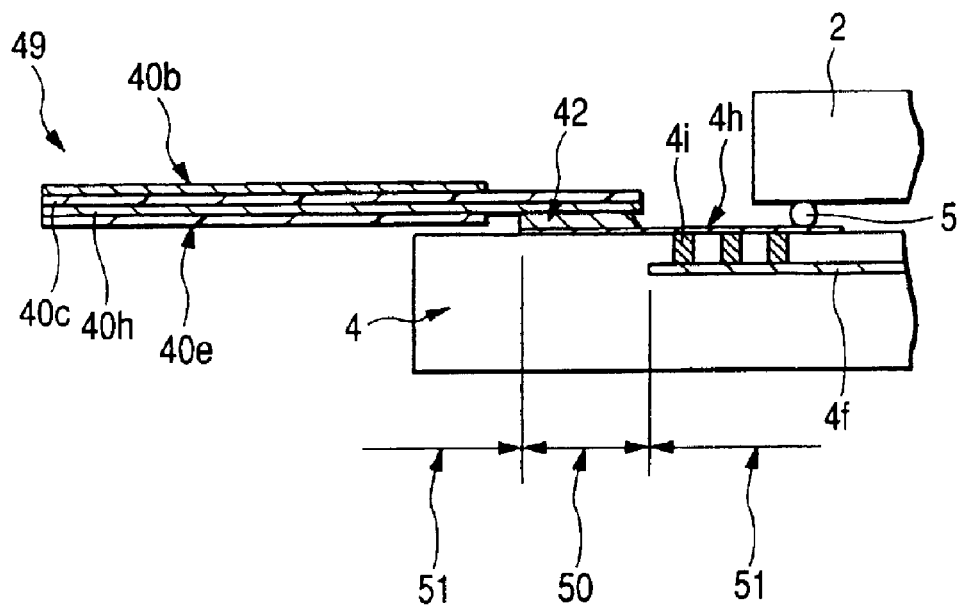
FIG. 103 is a partly cross-sectional view showing a connecting structure of a surface-layer metal layer (GND) of the tape-shaped transmission line section shown in FIG. 96.
Figure 104:
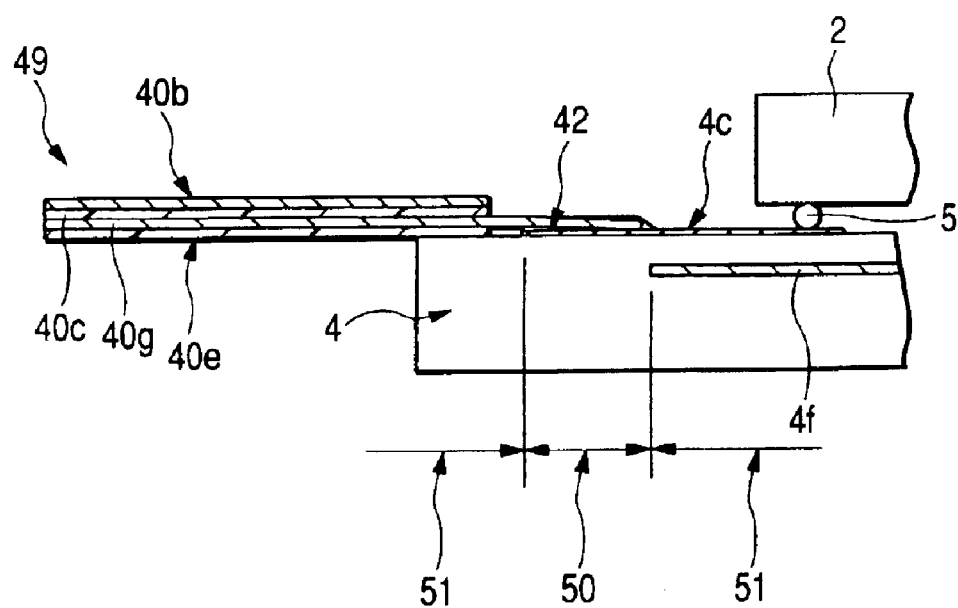
FIG. 104 is a partly cross-sectional view illustrating a connecting structure of a surface-layer metal layer (signal) of the tape-shaped transmission line section shown in FIG. 96.
Figure 105:
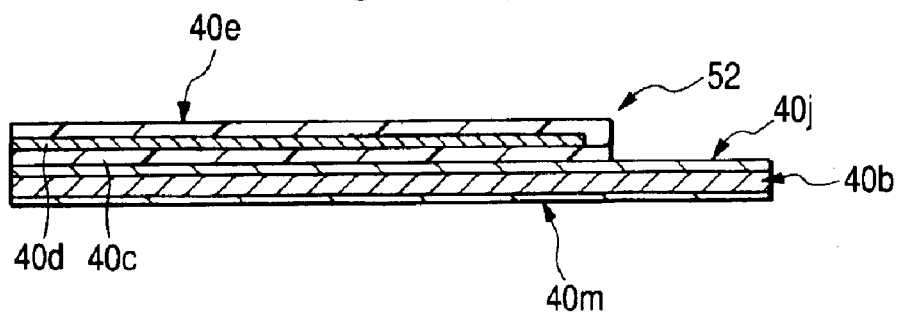
FIG. 105 is a cross-sectional view showing a structure of a tape-shaped transmission line section illustrative of another modification of the fifth embodiment of the present invention.
Figure 106:
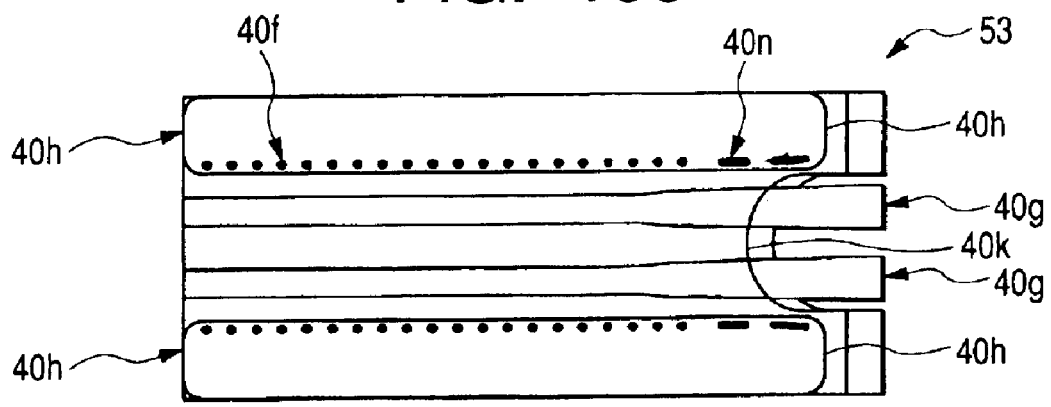
FIG. 106 is a plan view depicting a structure of a tape-shaped transmission line section illustrative of a further modification of the fifth embodiment of the present invention.
Figure 107:
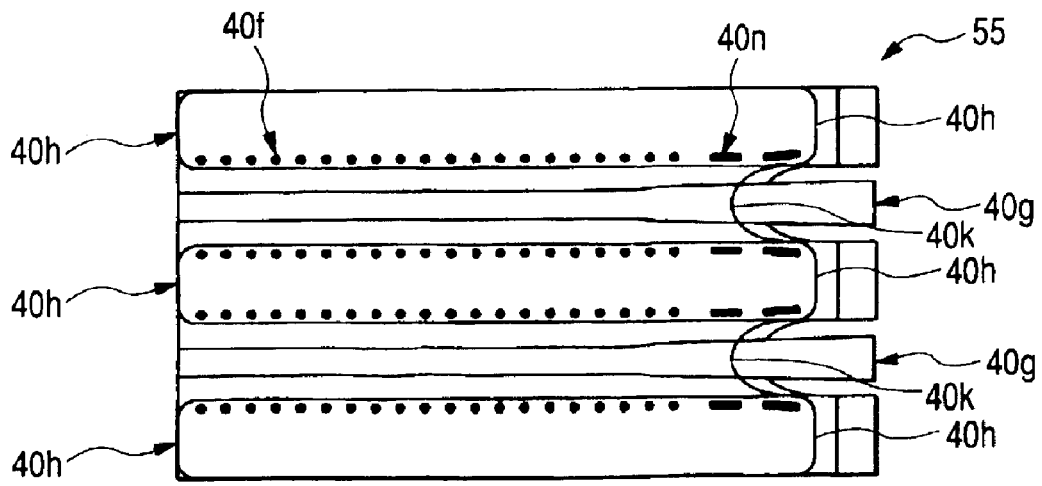
FIG. 107 is a plan view showing a structure of a tape-shaped transmission line section illustrative of a still further modification of the fifth embodiment of the present invention.
Figure 108:
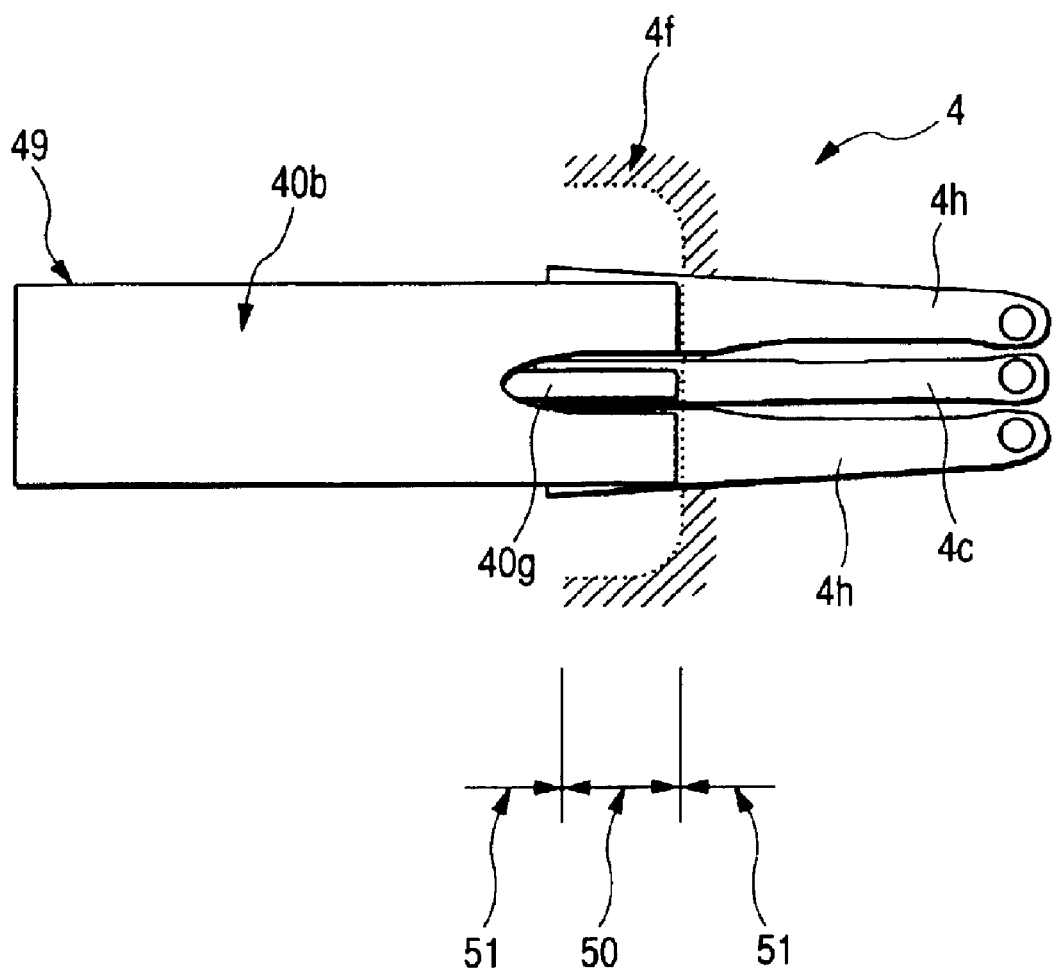
FIG. 108 is a plan view showing one example of a connecting structure of the tape-shaped transmission line section according to the fifth embodiment of the present invention.
Figure 109:
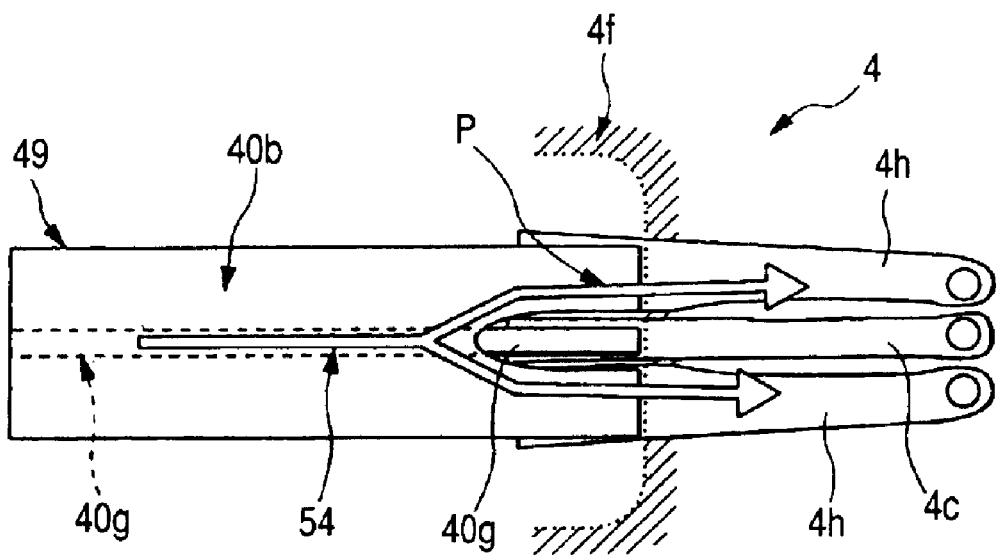
FIG. 109 is a plan view showing one example illustrative of how a return current flows in the connecting structure shown in FIG. 108.
Figure 110:
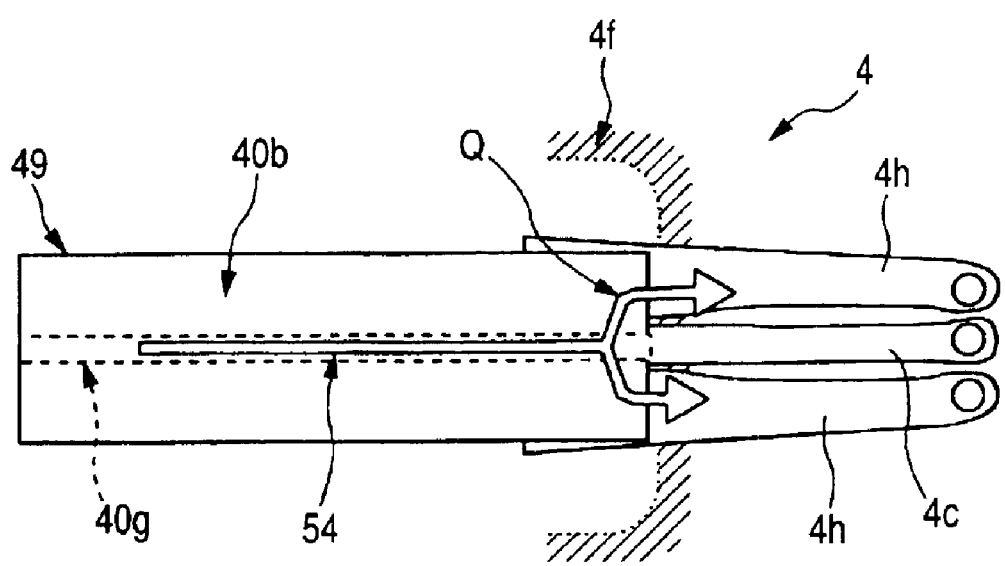
FIG. 110 is a plan view showing how a return current flows in a connecting structure of a comparative example with respect to the connecting structure shown in FIG. 108.

FIG. 87 is a plan view illustrating a structure of a tape-shaped transmission line section according to a fifth embodiment of the present invention, FIG. 88 is a plan view showing a structure of a base metal layer of the tape-shaped transmission line section shown in FIG. 87, FIG. 89 is a plan view depicting a structure of an insulating layer of the tape-shaped transmission line section shown in FIG. 87, FIG. 90 is a plan view illustrating a structure of a surface-layer metal layer of the tape-shaped transmission line section shown in FIG. 87, FIG. 91 is a plan view showing a structure of a cover coat layer of the tape-shaped transmission line section shown in FIG. 87, FIG. 92 is a cross-sectional view illustrating a structure of a cross-section cut along line A—A shown in FIG. 87, FIG. 93 is a cross-sectional view depicting a structure of a cross-section cut along line B—B shown in FIG. 87, FIG. 94 is a partly cross-sectional view showing a connecting structure of the base metal layer of the tape-shaped transmission line section shown in FIG. 87, FIG. 95 is a partly cross-sectional view illustrating a connecting structure of the surface-layer metal layer of the tape-shaped transmission line section shown in FIG. 87, FIG. 96 is a plan view depicting a structure of a tape-shaped transmission line section illustrative of a modification of the fifth embodiment of the present invention, FIG. 97 is a plan view showing a structure of a base metal layer of the tape-shaped transmission line section shown in FIG. 96, FIG. 98 is a plan view illustrating a structure of an insulating layer of the tape-shaped transmission line section shown in FIG. 96, FIG. 99 is a plan view depicting a structure of a surface-layer metal layer of the tape-shaped transmission line section shown in FIG. 96, FIG. 100 is a plan view showing a structure of a cover coat layer of the tape-shaped transmission line section shown in FIG. 96, FIG. 101 is a cross-sectional view illustrating a structure of a cross-section cut along line A—A shown in FIG. 96, FIG. 102 is a cross-sectional view depicting a structure of a cross-section cut along line B—B shown in FIG. 96, FIG. 103 is a partly cross-sectional view showing a connecting structure of a surface-layer metal layer (GND) of the tape-shaped transmission line section shown in FIG. 96, FIG. 104 is a partly cross-sectional view illustrating a connecting structure of a surface-layer metal layer (signal) of the tape-shaped transmission line section shown in FIG. 96, FIG. 105 is a cross-sectional view showing a structure of a tape-shaped transmission line section illustrative of another modification of the fifth embodiment of the present invention, FIG. 106 is a plan view depicting a structure of a tape-shaped transmission line section illustrative of a further modification of the fifth embodiment of the present invention, FIG. 107 is a plan view showing a structure of a tape-shaped transmission line section illustrative of a still further modification of the fifth embodiment of the present invention, FIG. 108 is a plan view showing one example of a connecting structure of the tape-shaped transmission line section according to the fifth embodiment of the present invention, FIG. 109 is a plan view showing one example illustrative of how a return current flows in the connecting structure shown in FIG. 108, and FIG. 110 is a plan view showing how a return current flows in a connecting structure of a comparative example with respect to the connecting structure shown in FIG. 108, respectively.

The fifth embodiment describes another embodiment of the tape-shaped transmission line section.

A tape-shaped line section (transmission line section) 49 shown in FIG. 87 is substantially similar in structure to the tape-shaped line section 40 described in the third embodiment. However, the tape-shaped line section 49 is different therefrom in that cut-away portions 40k are respectively defined in a base metal layer 40b, an insulating layer 40c and a cover coat layer 40e.

A detailed structure of the tape-shaped line section 49 shown in FIG. 87 will be described. The tape-shaped line section 49 comprises four layers of a base metal layer 40b shown in FIG. 88, an insulating layer 40c shown in FIG. 89, a surface metal layer 40d shown in FIG. 90 and a cover coat layer 40e shown in FIG. 91. FIG. 92 shows a sectional structure at a GND line, and FIG. 93 shows a sectional structure at a signal line.

Incidentally, the base metal layer 40b shown in FIG. 88, the insulating layer 40c shown in FIG. 89 and the cover coat layer 40e shown in FIG. 91 respectively have cut-away portions 40k defined in parts of their ends at portions thereof each of which overlaps with a surface layer signal lead 40g of the surface layer metal layer 40d.

A longitudinally-extending length of the insulating layer 40c is shorter than that of the base metal layer 40b. An end of the base metal layer 40b is exposed so as to be connectable to a surface layer wiring of a wiring board such as a package substrate 4 or the like.

Further, the surface layer metal layer 40d comprises a surface layer signal lead 40g and surface layer GND leads

40*h*. The surface layer GND leads 40*h* are shorter than the surface layer signal lead 40*g*, and ends of the surface layer GND leads 40*h* are covered with the insulating layer 40*c*.

The cover coat layer 40*e* shown in FIG. 91 is disposed on the surface layer metal layer 40*d*. Further, the base metal layer 40*b* and the surface layer GND leads 40*h* of the surface layer metal layer 40*d* are electrically connected by a plurality of vias 40*f*. At this time, the placement pitch between the adjacent vias 40*f* is set narrower than at spots other than those in the neighborhood of the cut-away portions 40*k* of the respective layers, or successive vias 40*n* are provided.

FIGS. 94 and 95 respectively show a state of connection of the tape-shaped line section 49 shown in FIG. 87 to a package substrate 4. FIG. 94 illustrates a state of connection of the base metal layer 40*b* and GND surface layer wirings 4*h* of the package substrate 4 by solder 42 (which may be conductive paste or the like). FIG. 95 shows a state of connection of the surface layer signal lead 40*g* and its corresponding signal surface layer wiring 4*c* on the package substrate 4 by solder 42 (which may be conductive paste or the like).

Incidentally, since the longitudinally-extending length of the insulating layer 40*c* is shorter than the length of the base metal layer 40*b* as shown in FIGS. 88 and 89, the ends of the base metal layer 40*b* can be exposed. Accordingly, the base metal layer 40*b* of the tape-shaped line section 49 can be connected to the GND surface layer wirings 4*h* of the package substrate 4 as shown in FIG. 94. Thus, a GND potential is stabilized so that electric characteristics can be enhanced.

In the fifth embodiment, the base metal layer 40*b*, the insulating layer 40*c* and the cover coat layer 40*e* respectively have cut-away portions 40*k* defined in parts of their ends at portions thereof each of which overlaps with the surface layer signal lead 40*g* of the surface layer metal layer 40*d*.

In addition, the placement pitch between the adjacent vias 40*f* is set narrower than at spots other than those in the neighborhood of the cut-away portions 40*k* of the respective layers, or successive vias 40*n* are provided. Thus, as shown in FIG. 109, the flow of a return current 54 can be made smoother and hence source impedance can be reduced.

A difference in the way of flowing of the return current 54 where the cut-away portions 40*k* are defined in the tape-shaped line section 49 and no cut-away portions 40*k* are not defined therein, will now be explained.

As shown in FIG. 108, a connecting portion of a surface layer signal lead 40*g* assumes a coplanar structure 50 where a cut-away portion 40*k* is defined in a tape-shaped line section 49 as in the fifth embodiment. However, a GND layer 4*f* corresponding to an inner layer is provided on the substrate side as viewed from the connecting portion. On the other hand, since a base metal layer 40*b* is provided on the lead side as viewed from the connecting portion, both sides of the connecting portion both result in GND coplanar structures 51.

A tape-shaped line section 49 illustrated in a comparative example of FIG. 110 is not formed with such a cut-away portion 40*k* as shown in FIG. 108. Namely, a connecting portion of a surface layer signal lead 40*g* results in a GND coplanar structure 51. Thus, when the surface layer signal lead 40*g* of the GND coplanar structure 51 is connected to a substrate, an end portion of a base metal layer 40*b* is placed on the back surface side of the surface layer signal lead 40*g*, and a signal surface layer wiring 4*c* is formed at a portion which overlaps with the surface layer signal lead 40*g*. Therefore, the connections between the base metal layer 40*b* and GND surface layer wirings 4*h* are made only in the edge neighborhood of an end of the base metal layer 40*b*.

Therefore, for example, a return current 54 which has flowed immediately below the corresponding wiring from the lead side to the substrate, abruptly changes its direction in the edge neighborhood (vicinity of Q) of the base metal layer 40*b* (GND) and enters into the substrate side.

Thus, since there is a possibility that the moving distance of the return current 54 becomes long, thus leading to an increase in source impedance, this is not desirable.

On the other hand, when the cut-away portion 40*k* is provided as shown in FIG. 109, the return current 54 that has flowed immediately below the wiring from the lead side to the substrate, gently changes its direction. Therefore, an increase in source impedance at an end (in the vicinity of P) of a base metal layer 40*b* (GND) is reduced as compared with FIG. 110.

Thus, the formation of the GND coplanar structure 51+coplanar structure 50+GND coplanar structure 51 by the provision of the cut-away portion 40*k* for the tape-shaped line section 49 enables a further reduction in transmission loss of a signal of a high frequency. Further, the mounting pitch between the adjacent vias 40*f* is set narrower than at spots other than those in the neighborhood of the cut-away portion 40*k*, or successive vias 40*n* are provided. Thus, the flow of the return current 54 can be made smoother so that source impedance can be further reduced, thus making it possible to further improve electric characteristics.

Next, FIG. 96 shows a tape-shaped line section 49 illustrative of the modification of the fifth embodiment. Configurations of the tape-shaped line section 49 and its sectional structures are respectively illustrated in FIGS. 97 through 102.

Incidentally, the tape-shaped line section 49 of the modification shown in FIG. 96 is substantially similar in structure to the tape-shaped line section 49 shown in FIG. 87 and formed with a cut-away portion 40*k*. However, the length of each surface layer GND lead 40*h* in a surface layer metal layer 40*d* is longer than that of a base metal layer 40*b*.

In this case, as shown in FIG. 103, the surface layer GND leads 40*h* of the surface metal layer 40*d*, and their corresponding GND surface layer wirings 4*h* of a package substrate 4 are connected to one another by means of solder 42 or conductive paste or the like. On the other hand, as shown in FIG. 104, a surface layer signal lead 40*g* of the surface layer metal layer 40*d* and its corresponding signal surface layer wiring 4*c* of the package substrate 4 are connected to each other by solder 42 or conductive paste or the like.

Now, as shown in FIGS. 103 and 104, a semiconductor chip 2 is mounted on the package substrate 4 with solder ball electrodes 5 interposed therebetween. Each of the GND surface layer wirings 4*h* and a predetermined solder bump electrode 5, and the signal surface layer wiring 4*c* and a predetermined bump electrode 5 are respectively connected to one another.

Incidentally, assuming that in each of the package substrates 4 shown in FIGS. 103 and 104, an area (corresponding to an area in which no GND layer 4*f* is formed) up to a substrate end on the left side toward from the GND layer 4*f* in each drawing is defined as a first area, and an area in which the GND layer 4*f* is formed, is defined as a second area, no other wiring layer is formed between GND surface layer wirings 4*h* and the GND layer 4*f* in the second area. Further, no GND layer 4*f* is formed below the GND surface layer wirings 4*h* and the signal surface layer wiring 4*c* formed in the first area.

Thus, since the cut-away portion 40k is formed even in the case of the tape-shaped line section 49 shown in FIG. 96, a GND coplanar structure 51+coplanar structure 50+GND coplanar structure 51 can be brought about. In a manner similar to the tape-shaped line section 49 shown in FIG. 87, a reduction in transmission loss of a signal of a high frequency can be achieved. As a result, an improvement in electric characteristic can be achieved.

Incidentally, when it is possible to form the base metal layer 40b thick fully, the tape-shaped line section 49 shown in FIG. 87 is capable of enhancing the strength of GND connection.

Next, a tape-shaped line section 52 illustrative of another modification shown in FIG. 105 is one wherein other metal layer 40j made up of a wiring pattern or the like is provided between a base metal layer 40b and an insulating layer 40c, and a surface protective layer 40m is formed on the surface of the base metal layer 40b.

Since the metal layer 40j made up of the wiring pattern and high in metal purity can be formed in this case, source impedance can be further reduced, and electric characteristics can be enhanced.

Incidentally, while the fifth embodiment has described the case in which one signal line is disposed in each of the tape-shaped line sections 49 and 52 and GND lines are formed on both sides one by one as three wirings in total, the numbers of signal lines and GND lines are respectively not limited to the above. Therefore, two surface layer signal leads 40g may be provided as shown in FIGS. 106 and 107. A tape-shaped line section 53 shown in FIG. 106 is one wherein two surface layer signal leads 40g are disposed between the surface layer GND leads 40h at both ends. A tape-shaped line section 55 shown in FIG. 107 is one wherein surface layer GND leads 40h are disposed on both sides of two surface layer signal leads 40g respectively, and a surface layer GND lead 40h is disposed even between the two surface layer signal leads 40g. The two surface layer signal leads 40g and the three surface layer GND leads 40h are provided.

Since the tape-shaped line section 53 and the tape-shaped line section 55 are also provided with cut-away portions 40k, an advantage similar to the tape-shaped line section 49 shown in FIG. 87 can be obtained.

While the invention made above by the present inventors has been described specifically based on the illustrated embodiments, the present invention is not limited to the embodiments. It is needless to say that many changes can be made thereto within the scope not departing from the substance thereof.

While each of the first through fifth embodiments has described the case in which the semiconductor device is of the ball grid array type semiconductor package, for example, the semiconductor device may be an LGA (Land Grid Array) or the like, for example, if one having a structure wherein a plurality of external connecting terminals are disposed within a plane of a package substrate, is adopted.

Further, while each of the first through fifth embodiments has described the case in which the semiconductor chip 2 is flip-chip connected to the package substrate 4, the method of connecting the semiconductor chip 2 and the package substrate 4 is not limited to such a flip-chip connection. It may be ribbon bonding using flat plate-shaped metal wires, etc.

Advantageous effects obtained by a typical one of the inventions disclosed in the present application will be described in brief as follows:

A high-frequency signal is transmitted via a transmission line section connected to each surface layer wiring on a wiring board. Therefore, a transmission loss in high frequency is reduced and thereby its signal can be transmitted. As a result, a high-quality high-frequency signal can be transmitted.

What is claimed is:

1. A semiconductor device, comprising:
a wiring board formed with a surface layer wiring;
a semiconductor chip mounted on the wiring board and directly connected to the surface layer wiring only through a solder bump electrode sandwiched between the semiconductor chip and the wiring board;
a plurality of external connecting terminals provided within either a main surface of the wiring board or a back surface thereof opposite to the main surface; and
a transmission line section connected to the surface layer wiring of the wiring board,
wherein at least either input or output of a signal to the semiconductor chip is performed through the transmission line section.

2. The semiconductor device according to claim 1, wherein the transmission line section is a coaxial cable, and a core line of the coaxial cable is connected to the surface layer wiring.

3. The semiconductor device according to claim 1, wherein the transmission line section has plate-shaped leads and each of the plate-shaped leads is connected to the surface layer wiring.

4. The semiconductor device according to claim 3, wherein the transmission line section is a tape-shaped member.

5. The semiconductor device according to claim 4, wherein a connecting portion protrudes from the transmission line section in a direction to cross transmission lines of the transmission line section and is provided integrally with the transmission line section.

6. The semiconductor device according to claim 5, wherein the connecting portion is arranged over the semiconductor chip.

7. The semiconductor device according to claim 4, wherein the connecting portion has wirings and a ground conductor layer disposed through the wirings and an insulating layer.

8. The semiconductor device according to claim 1, which is a ball grid array having a plurality of bump electrodes as the external connecting terminals.

9. The semiconductor device according to claim 1, which is a land grid array having a plurality of land electrodes as the external connecting terminals.

10. The semiconductor device according to claim 1, wherein the semiconductor chip has a circuit which divides an input signal of a first frequency into a plurality of signals each having a second frequency smaller than the first frequency and outputs the same, or a circuit which combines a plurality of input signals each having a third frequency into a signal of a fourth frequency larger than the third frequency and outputs the same.

11. The semiconductor device according to claim 10, wherein the first and fourth frequencies are respectively 1 GHz or more.

12. The semiconductor device according to claim 1, wherein the semiconductor chip is mounted on the wiring board with a plurality of solder bump electrodes interposed therebetween.

13. A semiconductor device, comprising:
a wiring board formed with a surface layer wiring;
a semiconductor chip mounted on the wiring board and directly connected to the surface layer wiring only through a solder bump electrode sandwiched between the semiconductor chip and the wiring board;

a plurality of external connecting terminals provided within either a main surface of the wiring board or a back surface thereof opposite to the main surface; and a transmission line section having plate-shaped leads connected to wirings of the wiring board, wherein at least either input or output of a signal to the semiconductor chip is performed through the plate-shaped leads.

14. A semiconductor device, comprising:

a wiring board having first and second areas;

surface layer wirings formed in the first and second areas over the wiring board;

a semiconductor chip mounted on the wiring board and directly connected to the surface layer wirings only through a solder bump electrode sandwiched between the semiconductor chip and the wiring board; and transmission lines connected to the wirings in the first area, wherein at least either input or output of a signal to the semiconductor chip is performed through the transmission lines, and wherein GND layers are formed below the wirings disposed in the second area of the wiring board, and the GND layers are not formed below the wirings disposed in the first area.

15. The semiconductor device according to claim 14, wherein other wiring layers are not formed between the wirings in the second area and the GND layers.

16. The semiconductor device according to claim 15, wherein the transmission lines in the first area constitute a coplanar structure and the wirings in the second area constitute a ground coplanar structure.

* * * * *